(12) United States Patent
Chang et al.

(10) Patent No.: US 12,426,493 B2
(45) Date of Patent: Sep. 23, 2025

(54) STRUCTURE OF THE PHOTODIODE

(71) Applicant: RAYNERGY TEK INCORPORATION, Hsinchu (TW)

(72) Inventors: Yi-Ming Chang, Hsinchu (TW); Kuen-Wei Tsai, Hsinchu (TW)

(73) Assignee: RAYNERGY TEK INCORPORATION, Hsinchu (TW)

( * ) Notice: Subject to any disclaimer, the term of this patent is extended or adjusted under 35 U.S.C. 154(b) by 549 days.

(21) Appl. No.: 17/931,744

(22) Filed: Sep. 13, 2022

(65) Prior Publication Data
US 2023/0129045 A1    Apr. 27, 2023

Related U.S. Application Data

(60) Provisional application No. 63/244,373, filed on Sep. 15, 2021.

(51) Int. Cl.
| | | |
|---|---|---|
| *H10K 85/10* | (2023.01) | |
| *H10K 30/20* | (2023.01) | |
| *H10K 30/30* | (2023.01) | |
| *H10K 30/82* | (2023.01) | |
| *H10K 85/60* | (2023.01) | |
| *H10K 39/32* | (2023.01) | |

(52) U.S. Cl.
CPC ......... *H10K 85/113* (2023.02); *H10K 85/151* (2023.02); *H10K 85/657* (2023.02); *H10K 30/20* (2023.02); *H10K 30/30* (2023.02); *H10K 30/82* (2023.02); *H10K 39/32* (2023.02)

(58) Field of Classification Search
CPC ......... H10K 30/20; H10K 30/30; H10K 39/32
See application file for complete search history.

(56) References Cited

U.S. PATENT DOCUMENTS

2015/0105560 A1    4/2015 Berny et al.
2018/0374650 A1   12/2018 Huang
(Continued)

FOREIGN PATENT DOCUMENTS

| CN | 106025070 | 10/2016 |
|---|---|---|
| CN | 109935699 | 6/2019 |
| CN | 112514098 A | 3/2021 |

(Continued)

OTHER PUBLICATIONS

Armin A, et al., "Narrowband light detection via internal quantum efficiency manipulation of organic photodiodes", Nature Communications, Feb. 27, 2015; 6:6343. doi: 10.1038/ncomms7343. PMID: 25721323.

(Continued)

*Primary Examiner* — Daniel P Shook
(74) *Attorney, Agent, or Firm* — WPAT, PC

(57) ABSTRACT

The present invention is a structure of a photodiode, which comprises a substrate; a first electrode is arranged on the substrate; a first transport layer is arranged on the first electrode; a photoactive layer is arranged on the first transport layer, the photoactive layer includes a P-type semiconductor layer and an N-type semiconductor layer. The P-type semiconductor layer and the N-type semiconductor layer have a composition ratio between 1:0.5 and 1:1.5. The photoactive layer has a thickness ranging from 1 μm to 15 m, the photoactive layer has a first energy gap value, and a second electrode is disposed on the photoactive layer.

11 Claims, 13 Drawing Sheets

(56) References Cited

U.S. PATENT DOCUMENTS

2021/0043842 A1   2/2021   Shih
2021/0175289 A1*  6/2021   Miyata .................... G02B 5/20

FOREIGN PATENT DOCUMENTS

| | | |
|---|---|---|
| CN | 113270553 | 8/2021 |
| JP | 2011014815 | 1/2011 |
| JP | 2012165023 | 8/2012 |
| JP | 2013073965 | 4/2013 |
| JP | 2019-531380 A | 10/2019 |
| JP | 2020021848 | 2/2020 |
| TW | M615737 | 8/2021 |
| WO | WO2006077476 | 7/2006 |
| WO | WO2020050265 | 3/2020 |

OTHER PUBLICATIONS

Xie, B., et al., "Self-filtering narrowband high performance organic photodetectors enabled by manipulating localized Frenkel exciton dissociation", Nature Communications, 11, 2871 (2020). https://doi.org/10.1038/s41467-020-16675-x.

Taiwan Patent Office "Office Action" issued on Jul. 12, 2023, Taiwan.

Liu et al. "Ultra-Narrow-Band NIR Photomultiplication Organic Photodetectors Based on Charge Injection Narrowing", 2021, pp. 2937-2943, The Journal of Physical Chemistry Letters.

Zhu et al. "Chemistry An Asian Journal", 2019, www.chemasianj.org.

Qin et al. "Organic photodiodes for near-infrared light detection", 2020, IOP Publishing Ltd.

Forti et al. "Recent Advances in Non-Fullerene Acceptors of the IDIC/ITIC Families for Bulk-Heterojunction Organic Solar Cells", 2020, MDPI.

Japan Patent Office "Notification of reasons for refusal" issued on Jul. 4, 2023, JPO.

Yongqiang Wang et al., "1. Realizing high detectivity organic photodetectors in visible wavelength by doping highly ordered polymer PCPDTBT", 2020 Elsevier B.V. All rights reserved.

Japan Patent Office, Official action corresponding Japan patent application on Nov. 14, 2023.

* cited by examiner

STRUCTURE OF THE PHOTODIODE

FIELD OF THE INVENTION

The invention relates to a structure, especially a structure of photodiode that can self-filter light of a specific wavelength.

BACKGROUND OF THE INVENTION

The general photodetector is mainly formed by a photodiode. In the past, silicon is the mainstream material. Nonetheless, in recent years, under the requirements of higher sensitivity, wider sensing range of wavelength, and higher performance to cost ratio, many photodiodes developed using next-generation material systems start to become attractive, such as organic photodetectors (OPD), quantum dot photodetectors (QDPD), and perovskite photodetectors (PPD).

A photodetector is a component of an image sensing product capable of converting the generated current signals into digital signals. Normally, a readout integrated circuit (ROIC) is accompanied.

The ROIC can be classified into two applications, including complementary metal-oxide-semiconductor (CMOS) chips and thin-film transistor (TFT) panels belonging to semiconductor factories and panel factories, respectively, in manufacturing and supply chain. The shipment units of image sensors are increased as product types are diversified. Thanks to the prevalence of mobile phones and novel embedded applications in the past ten years, image sensors have become the fastest growing semiconductor product type.

In the future, the new growth will be driven by embedded digital imaging systems, including more cameras for driving safety, driver assistive functions, built-in automated and intelligent machine vision, medical applications, human and face recognition, wearable cameras, 3D video conferencing, and virtual/augmented reality and other applications. The most important thing is that more image sensors with rapid and high resolution will be included in smartphones.

Nonetheless, general photodetectors will perform light splitting according to different requirements in applications. According to the prior art, a filter should be adopted to split white light into red, green, blue, and near infrared (R/G/B/NIR) light sources. Thereby, a back-end process for filters must be incorporated into device structures.

Technically, if a narrow full-width at half maximum (FWHM) and a single optical frequency response can be given by device design and optical modulation without filter, the size of sensors can be shrunk and many advantages in process and costs will be given. If a photodiode can have a single frequency response by self-filtering without using filter, the size of sensors can be shrunk and the process complexity and costs can be reduced.

Meanwhile, an additional filtration layer serving as the hole transport layer is added to the system to strengthen the efficiency of self-filtration. Such additional filtration layer is embodied by cross-linking induced by P3HT molecules and will serve as the hole transport layer in the structure of the photodiode. P3HT, as a visible light absorbing material, can effectively reduce the quantum efficiency (QE) in the visible light region and achieve pure FWHM response in the target NIR region due to the effect of cross-linking.

In order to increase the thickness of the film or improve the self-filtering efficiency of the material in the photodiode, the aforesaid cross-linking often involves an appropriate cross-linking agent.

However, the introduction of cross-linking agent not only increases the complexity of the structure of the photodiode, but also inevitably restricts the selection of the semiconductor molecules involved in the cross-linking reaction. The method is thus only applicable to some material systems.

Accordingly, how to establish a self-filtration photodiode structure that can achieve FWHM response has become the biggest challenge that the technicians in the relevant field are now facing.

SUMMARY

An objective of the present invention is to provide a structure of photodiode, which their thicknesses, the P-type semiconductor layer and N-type semiconductor layer in the photoactive layer works with transparent electrodes to form a structure that can attain self-filtration and FWHM response and in turn reduce the size of photodetectors.

The present invention provides a structure of photodiode, which comprises a substrate, a first electrode, a first transport layer, a photoactive layer, a filter layer, and a second electrode. The first electrode is disposed on the substrate. The first transport layer is disposed on the first electrode. The photoactive layer is disposed on the first transport layer. The photoactive layer comprises a P-type semiconductor layer and aft N-type semiconductor layer. The P-type semiconductor layer and the N-type semiconductor layer have a composition ratio between 1:0.5 and 1:1.5. The active layer has a thickness ranging from 1 μm to 15 μm, and the second electrode is arranged on the photoactive layer.

According to an embodiment of the present invention, wherein said substrate with readout circuit or electrode is selected from silicon substrate, polyimide substrate, glass substrate, polyethylene naphthalate substrate, polyethylene terephthalate substrate, sapphire substrate, quartz substrate, or ceramic substrate.

According to an embodiment of the present invention, wherein said first electrode is a transparent electrode or a metal electrode, wherein said transparent electrode is selected from the group consisting of metal oxide, conductive polymer, graphene, carbon nanotube, metal nanowire, metal mesh and the mixture thereof; and said metal electrode is selected from the group consisting of aluminum, silver, gold, copper, tungsten, molybdenum, titanium and the mixture thereof.

According to an embodiment of the present invention, wherein the first electrode further comprises a first active metal layer arranged in the first electrode, and the material of the first active metal layer is selected from a group composed of magnesium, calcium, lithium, caesium, and their constituents.

According to an embodiment of the present invention, wherein said first transport layer is selected from the group consisting of one or more of the following materials: organic polymer, organic small molecule, and metal oxide, wherein the organic polymer is selected from PFN-DOF、PFN-Br, or PDMAEMA; the organic small molecule is selected from PDIN、PDINO、PDINN, or NDI-N; the metal oxide is selected from $SnO_2$、ZnO、$TiO_2$、$Cs_2CO_3$, or $Nb_2O_5$.

According to an embodiment of the present invention, further comprising a disposed between said photoactive layer and said second electrode.

According to an embodiment of the present invention, wherein the second transport layer is selected from a group composed of one or more of the following materials: organic polymer, organic small molecule, metal oxide, and metal compound; the organic polymer is selected from PEDOT: PSS or PTAA; the organic small molecule is selected from spiro-MeOTAD or m-MTDATA; the metal oxide or the metal compound is selected from $MoO_3$、NiO、$V_2O_5$、$WO_3$, or CuSCN.

According to an embodiment of the present invention, wherein the second electrode is a transparent electrode or a metal electrode, wherein said transparent electrode is selected from the group consisting of metal oxide, conductive polymer, graphene, carbon nanotube, metal nanowire and metal mesh and the mixture thereof; and said metal electrode is selected from the group consisting of aluminum, silver, gold, copper, tungsten, molybdenum, titanium and the mixture thereof.

According to an embodiment of the present invention, wherein the second electrode further comprises a second active metal layer arranged in the second electrode, and the material of the second active metal layer is selected from a group composed of magnesium, calcium, lithium, caesium, and their constituents.

According to an embodiment of the present invention, wherein the structure of the P-type semiconductor layer of the photoactive layer is selected from a group composed of D1-D29.

According to an embodiment of the present invention, wherein the structure of the N-type semiconductor layer of the photoactive layer is selected from a group composed of A1-A39.

BRIEF DESCRIPTION OF THE FIG.S

DETAILED DESCRIPTION

In the prior art, in a self-filtration photodiode structure that can achieve FWHM response, a cross-linking agent is usually introduced to thicken the film or to enhance the efficiency of self-filtration of the material in the photodiode; however, not only does the introduction of cross-linking agents increase the complexity of the device production but it inevitably restricts the selection of the semiconductor molecules involved in the cross-linking reaction. The method is thus only applicable to some material systems.

For the invention, through their thicknesses, the P-type semiconductor layer and N-type semiconductor layer in the photoactive layer works with transparent electrodes to form a structure that can attain self-filtration and FWHM response and in turn reduce the size of photodetectors.

Figure 1:
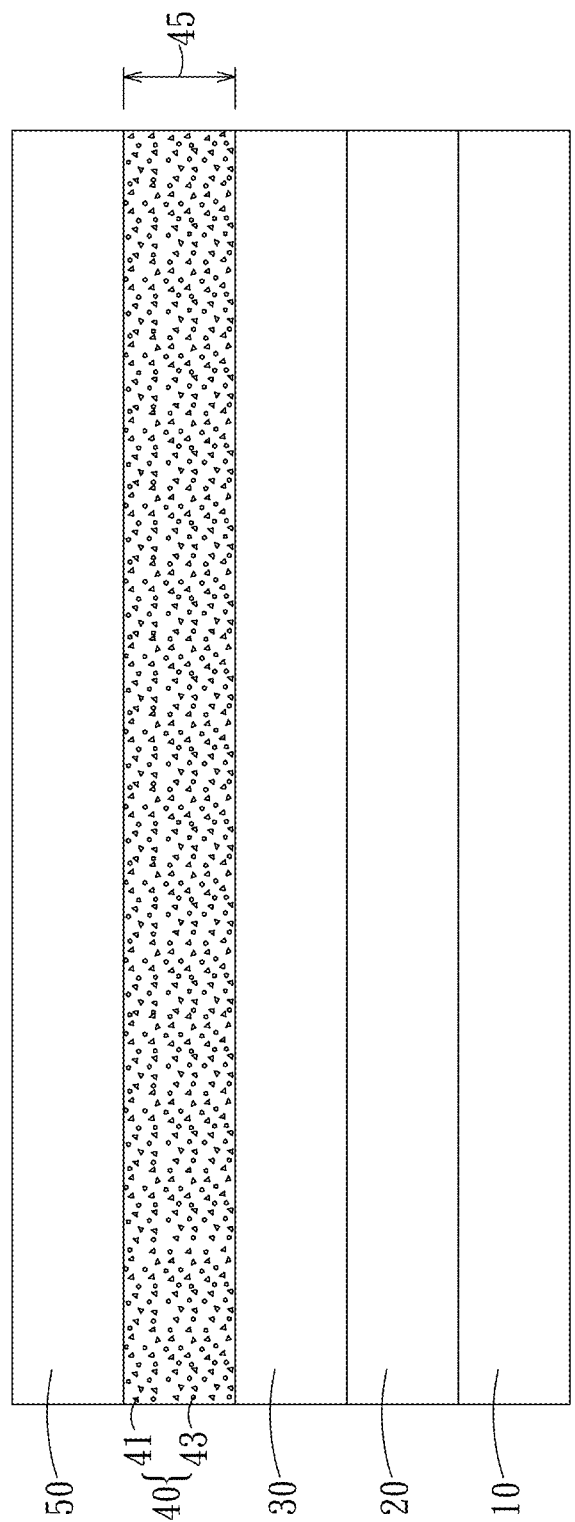
FIG. 1 shows the schematic diagram of the photodiode in an example of the invention.

First, please refer to FIG. 1, which shows a schematic diagram of the structure of photodiode according to an embodiment of the present invention. As shown in the FIG. 1, the structure of photodiode according to the present embodiment comprises a substrate 10, a first electrode 20, a first transport layer 30, a photoactive layer 40, and a second electrode 50.

In the structure of photodiode according to the present embodiment, the first electrode 20 is disposed on the substrate 10 and the first transport layer 30 is disposed on the first electrode 20. The substrate 10 includes silicon substrate, polyimide substrate, glass substrate, polyethylene naphthalate substrate, polyethylene terephthalate substrate, sapphire substrate, quartz substrate, or ceramic substrate.

The first electrode 20 is a transparent electrode or a metal electrode. Preferably, the first electrode 20 is, but not limited to, a transparent electrode. When the first electrode 20 as described above adopts the transparent electrode, the transparent electrode is selected from the group consisting of metal oxide, conductive polymer, graphene, carbon nanotube, metal nanowire, and metal mesh.

When the first electrode 20 adopts the metal electrode, the metal electrode is selected from the group consisting of aluminum, silver, gold, copper, tungsten, molybdenum, and titanium or a composite metal electrode using the above metals with different elements such as TiN or similar concept.

According to present embodiment, the material of the first transport layer 30 is selected from a group composed of one or more of the following materials: organic polymer, organic small molecule, and metal oxide, in which:

The organic polymer is selected from:
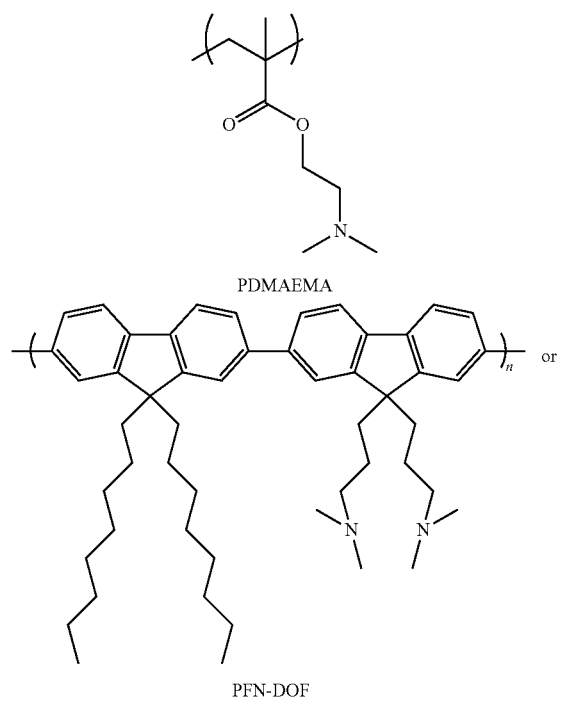
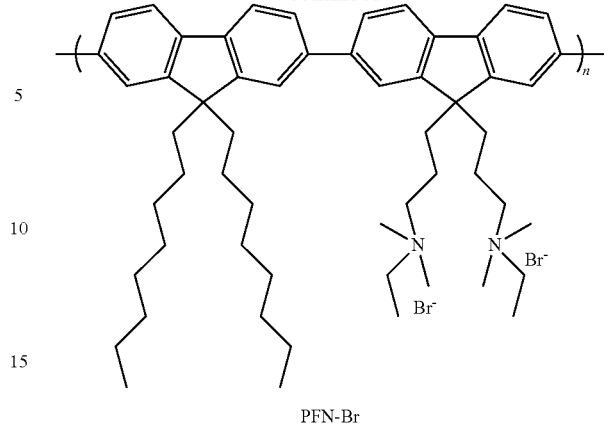
The organic small molecule is selected from:
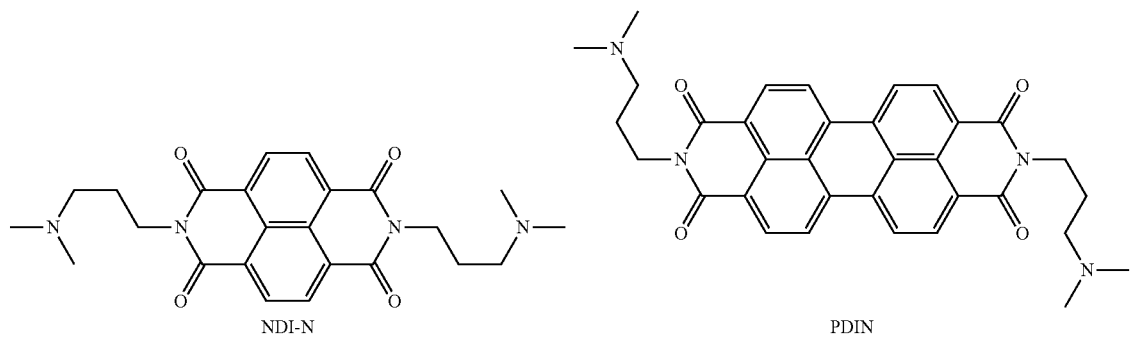
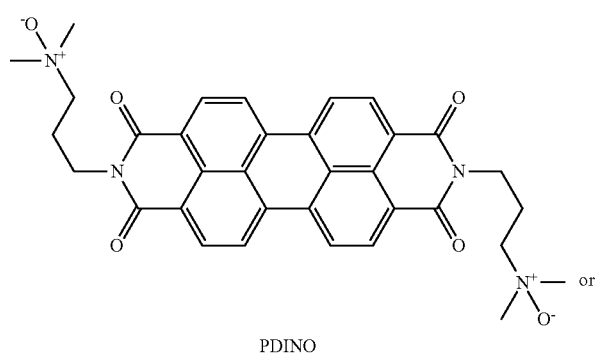

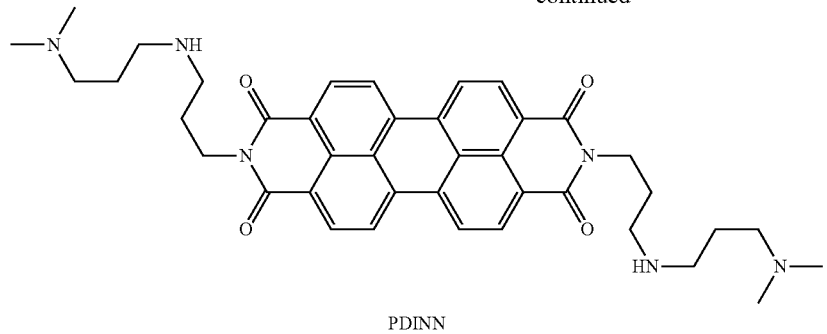

PDINN

The metal oxide is selected from SnO$_2$, ZnO, TiO$_2$, Cs$_2$CO$_3$, or Nb$_2$O$_5$.

According to the present embodiment, the photoactive layer 40 is disposed on the first transport layer 30, the photoactive layer 40 comprises a P-type semiconductor layer 41 and a N-type semiconductor layer 43, the composition ratio of the P-type semiconductor layer 41 and the N-type semiconductor layer 43 is between 1:0.5 and 1:1.5, the thickness 45 of the photoactive layer 40 is between 1 μm and 15 μm, and the second electrode 50 is arranged on the photoactive layer 40.

Wherein, the material of the photoactive layer 40 is selected from a group composed of organic polymer, organic oligomer, organic small molecule, inorganic compound semiconductor, organic-inorganic compound semiconductor, inorganic semiconductor nanoparticle, and quantum dot.

According to the present embodiment, the P-type semiconductor layer 41 and the N-type semiconductor layer 43 of the photoactive layer 40 is composed of more than two of the aforesaid materials.

Wherein, the structure of the P-type semiconductor layer 41 of the photoactive layer is selected from a group composed of D1-D29. The structures of D1 to D29 are shown in Table 1.

TABLE 1

The structures of D1 to D29

| D1 | 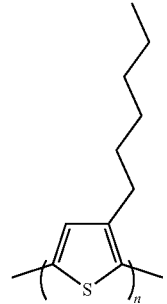 |
| --- | --- |
| D2 | 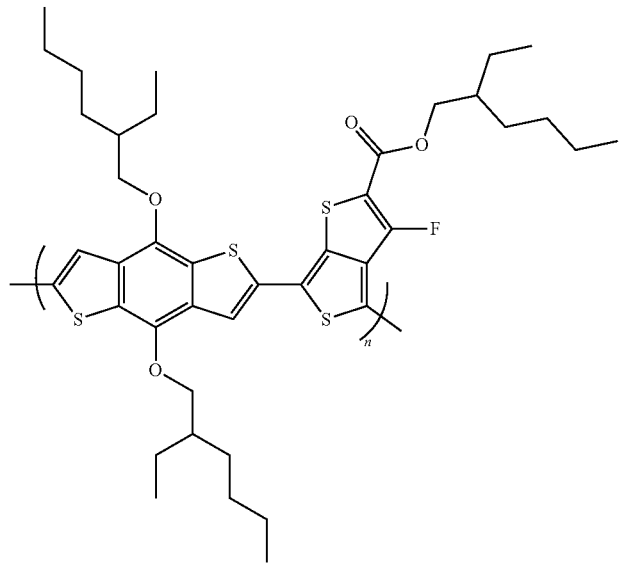 |

TABLE 1-continued
The structures of D1 to D29
D3
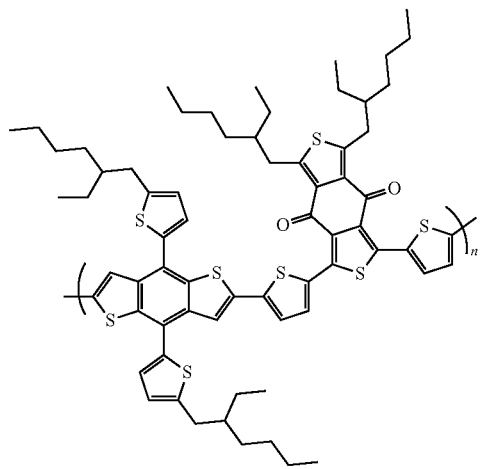
D4
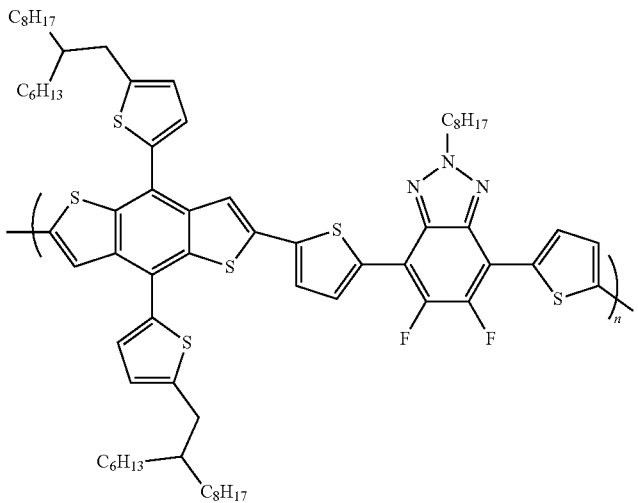
D5
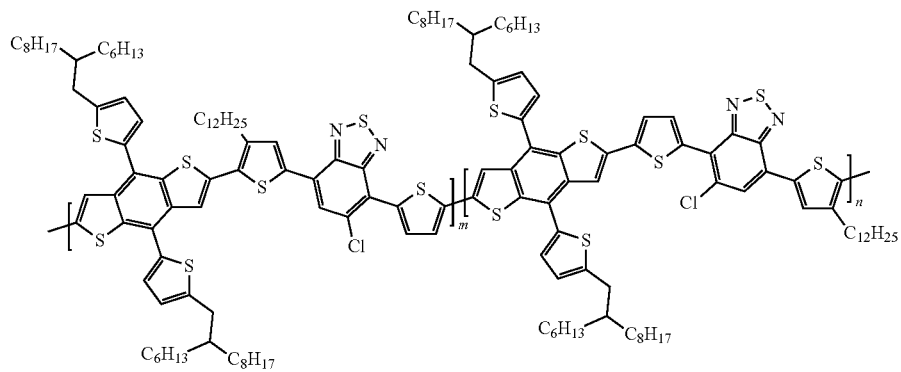

TABLE 1-continued
The structures of D1 to D29
D6
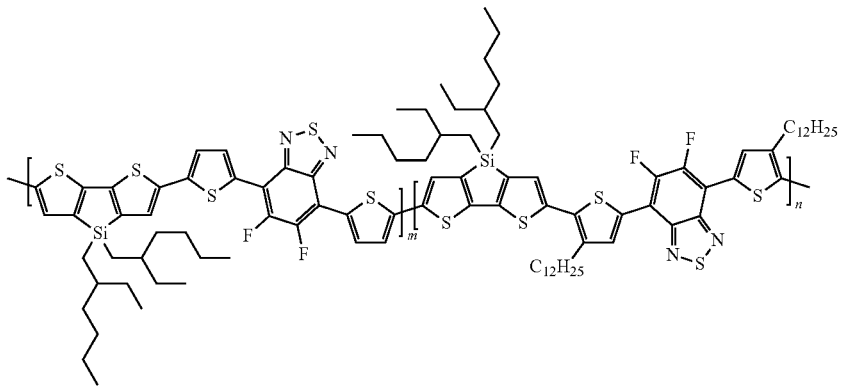
D7
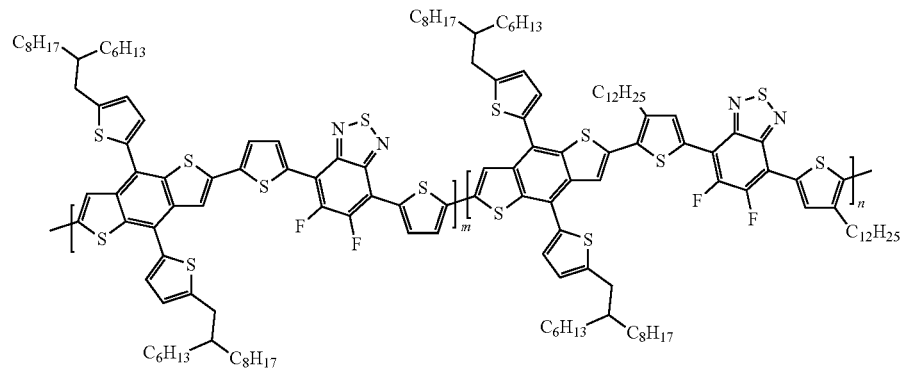
D8
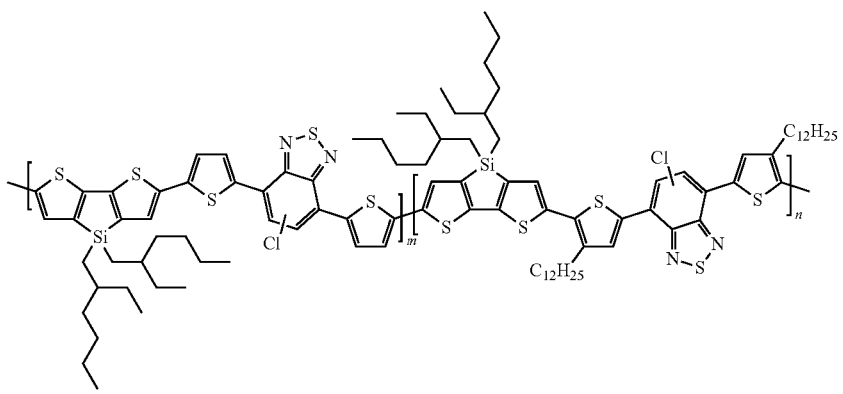
D9
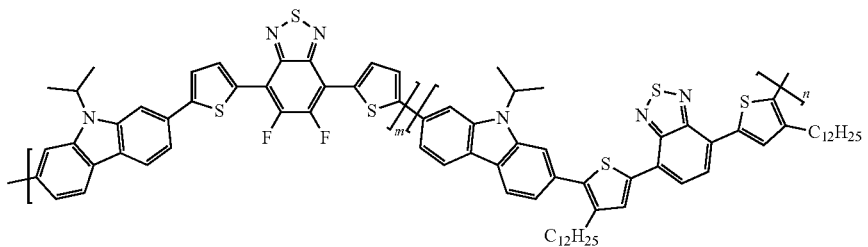

TABLE 1-continued
The structures of D1 to D29
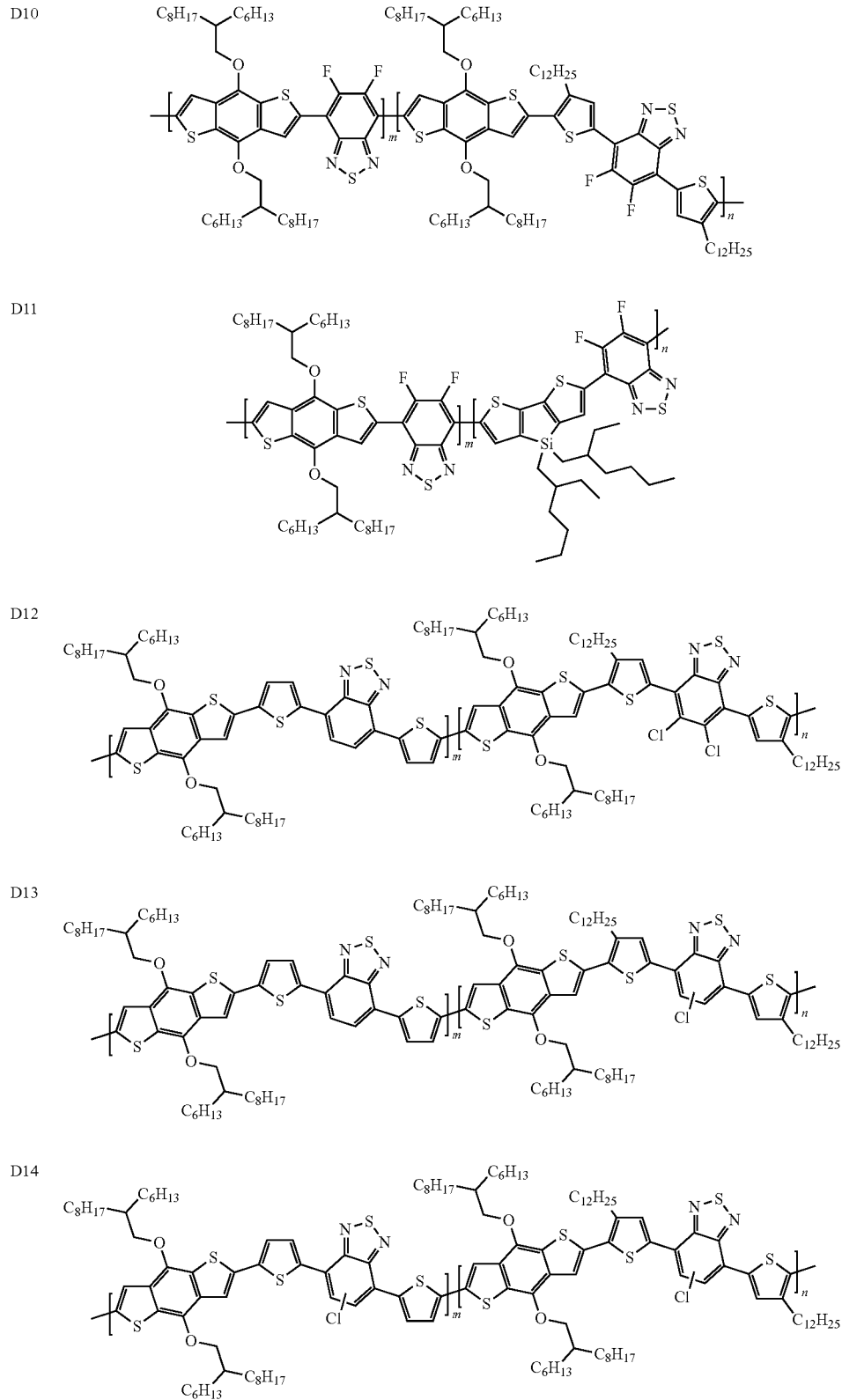

TABLE 1-continued
The structures of D1 to D29
D15 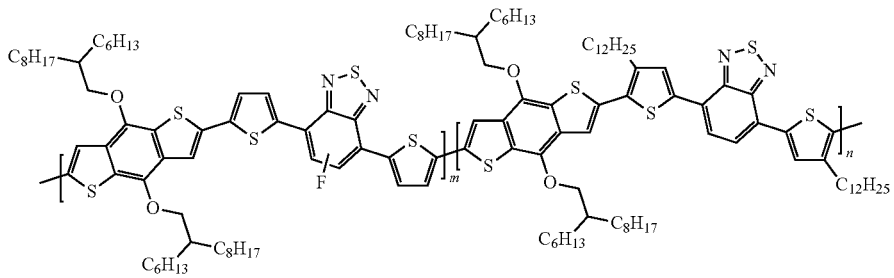
D16 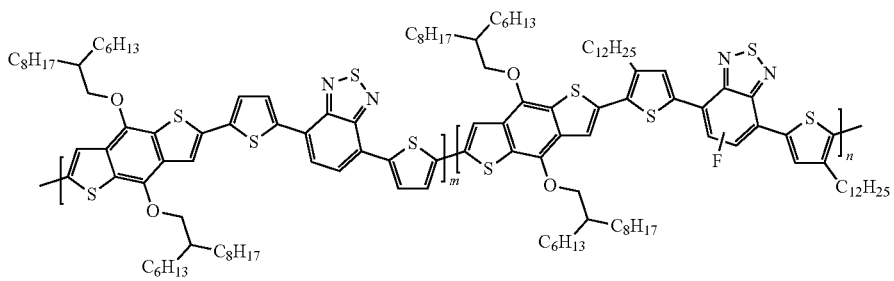
D17 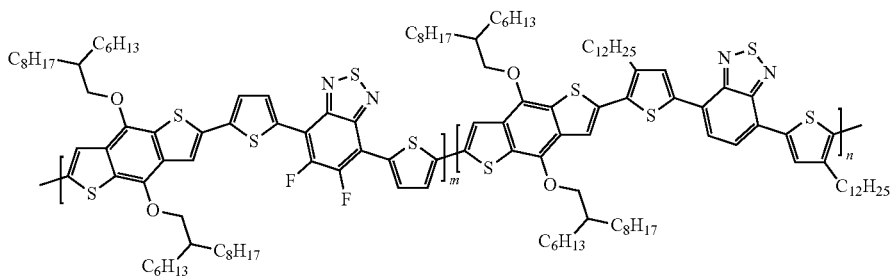
D18 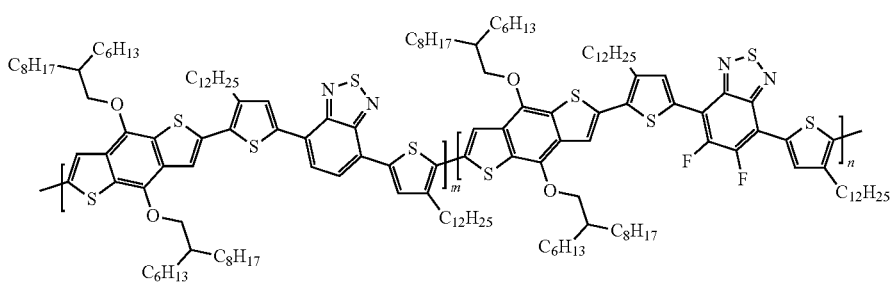
D19 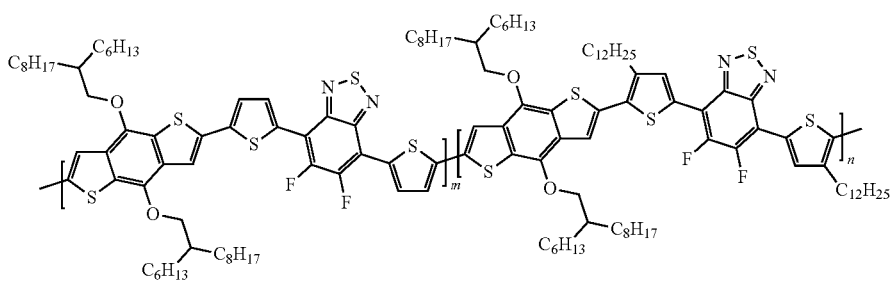

TABLE 1-continued
The structures of D1 to D29
D20 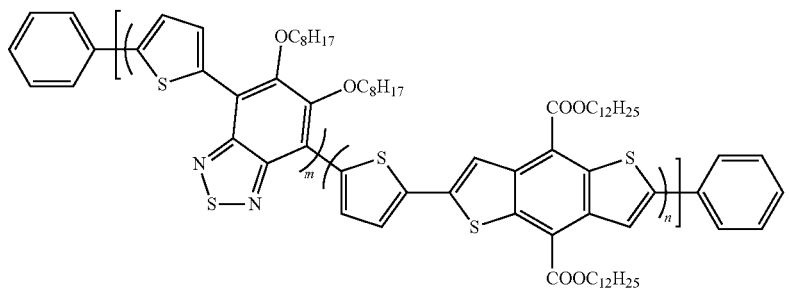
D21 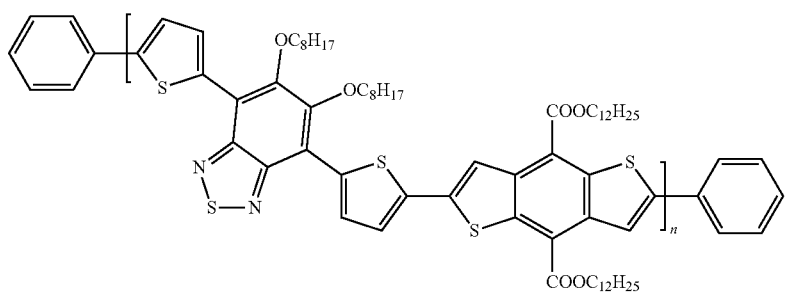
D22 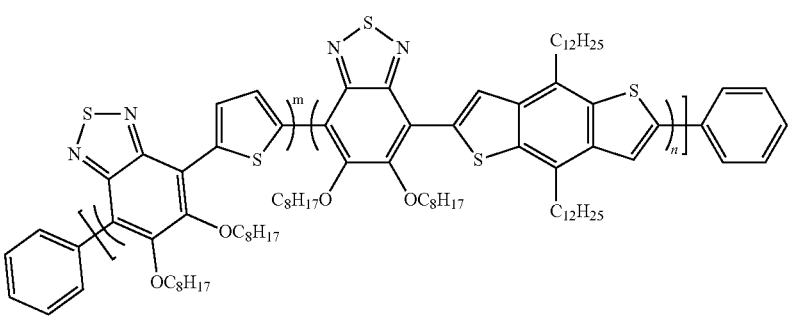
D23 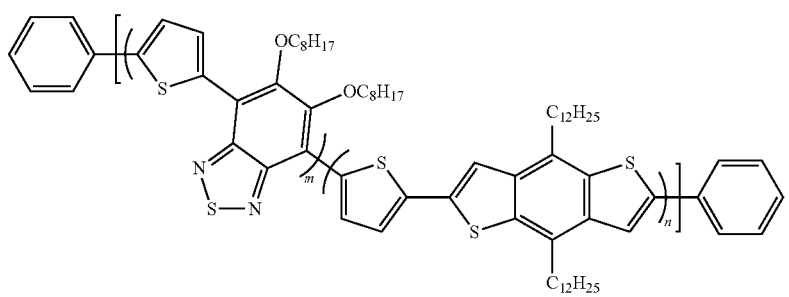
D24 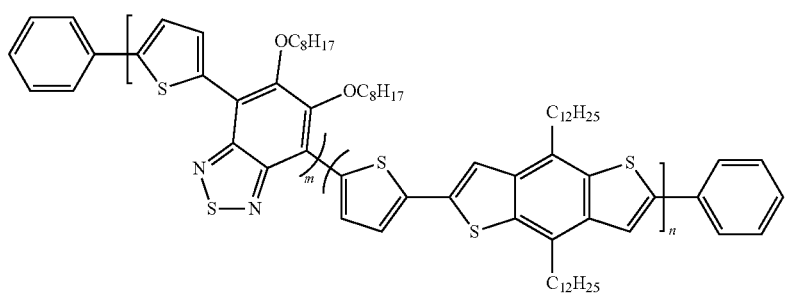

TABLE 1-continued
The structures of D1 to D29
D25
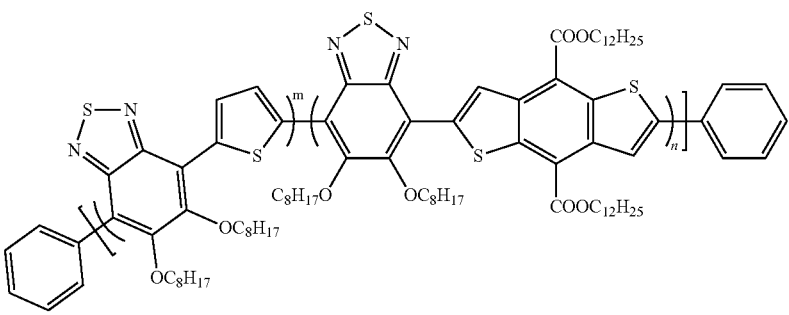
D26
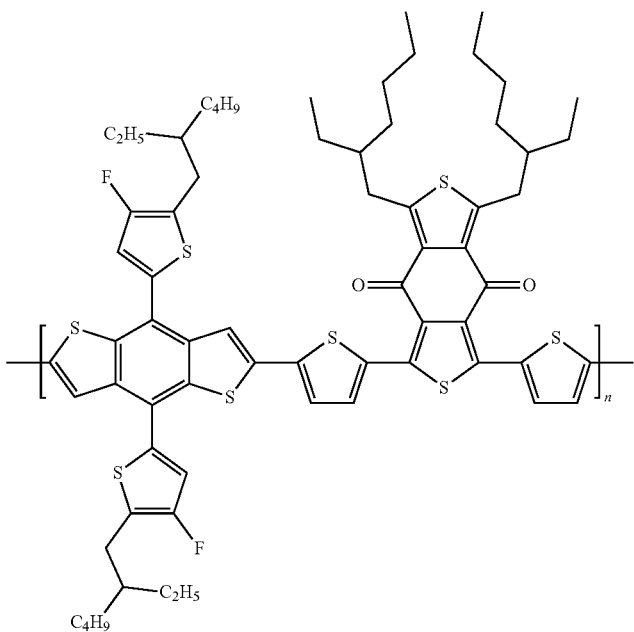
D27
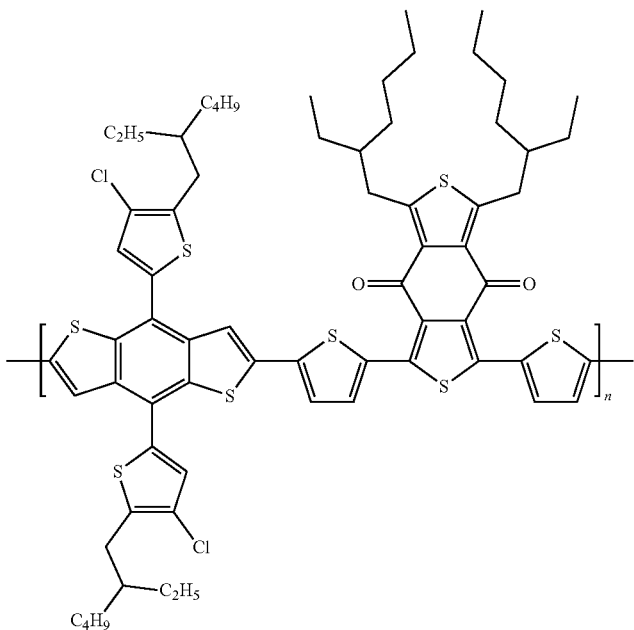

TABLE 1-continued
The structures of D1 to D29
D28
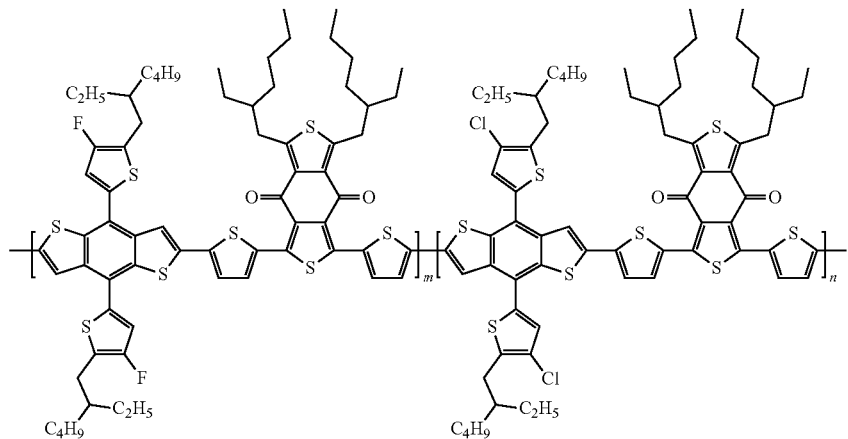
D29
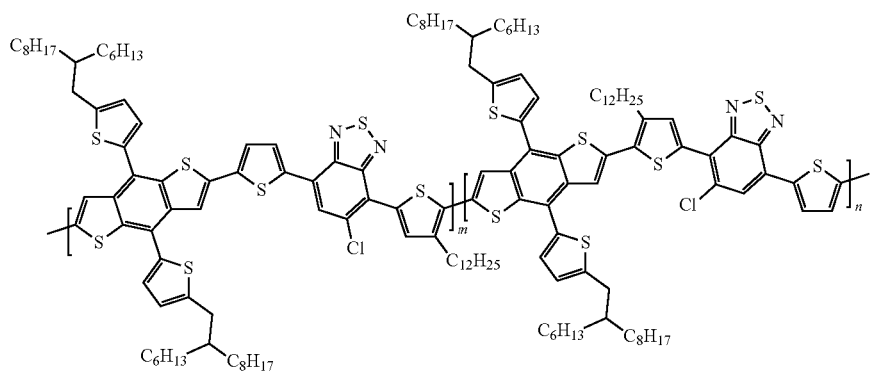
Wherein, the structure of the N-type semiconductor layer 43 of the photoactive layer 40 is selected from a group composed of A1-A39. The structures of A1-A39 are shown in Table 2.
TABLE 2
The structures of A1-A39
A1
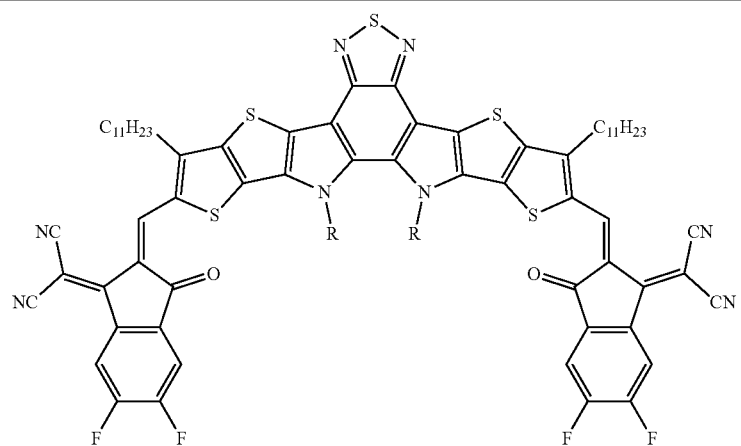

TABLE 2-continued
The structures of A1-A39
R = 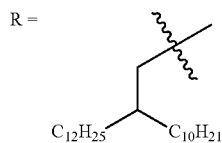
A2
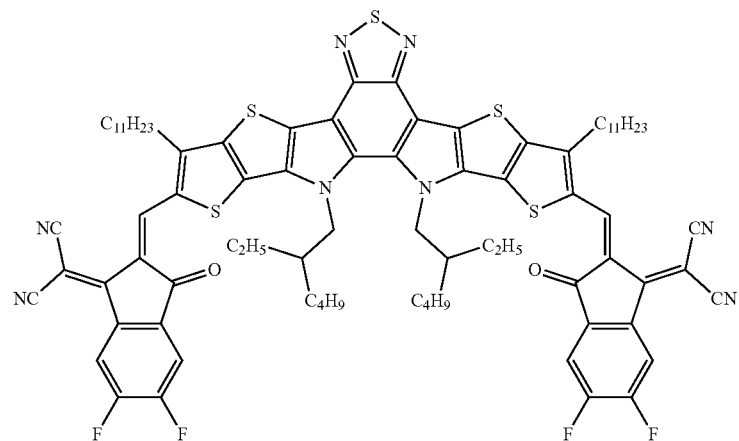
A3
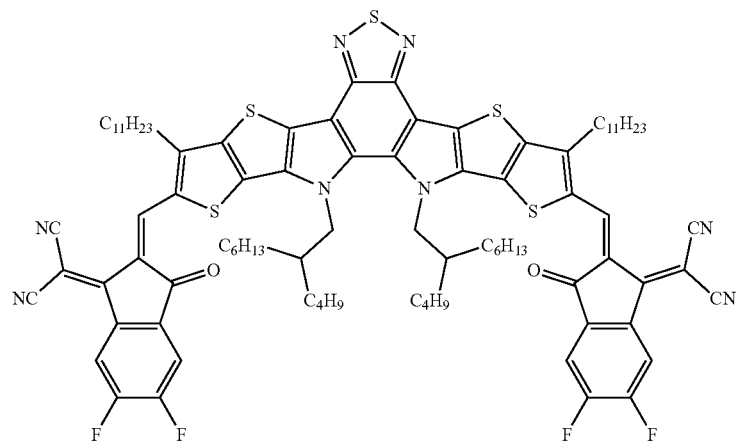
A4
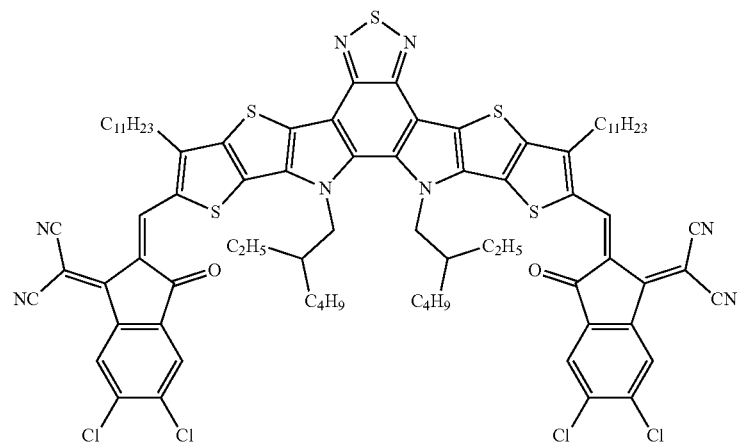

TABLE 2-continued
The structures of A1-A39
A5
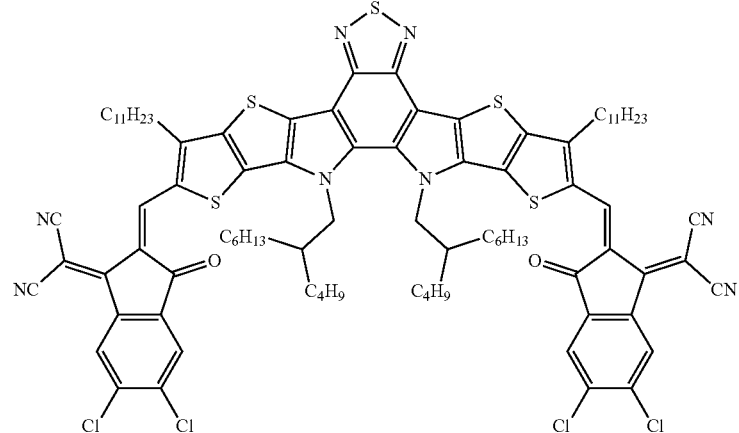
A6
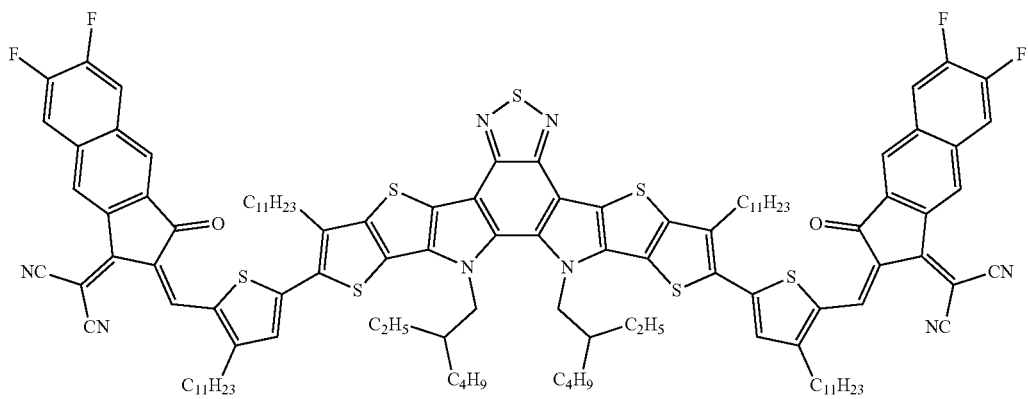
A7
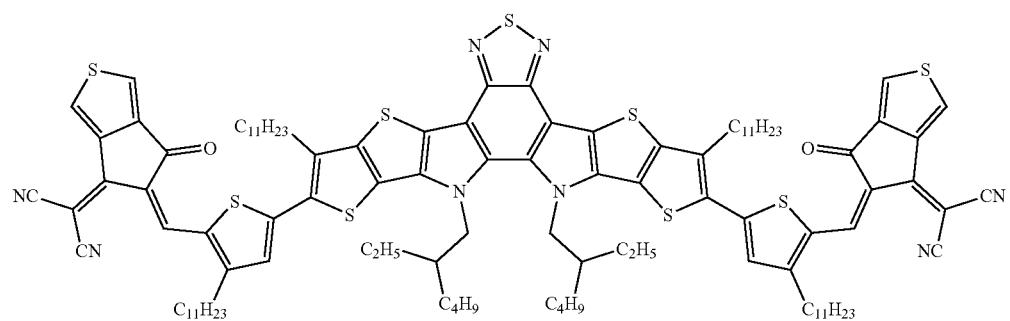
A8
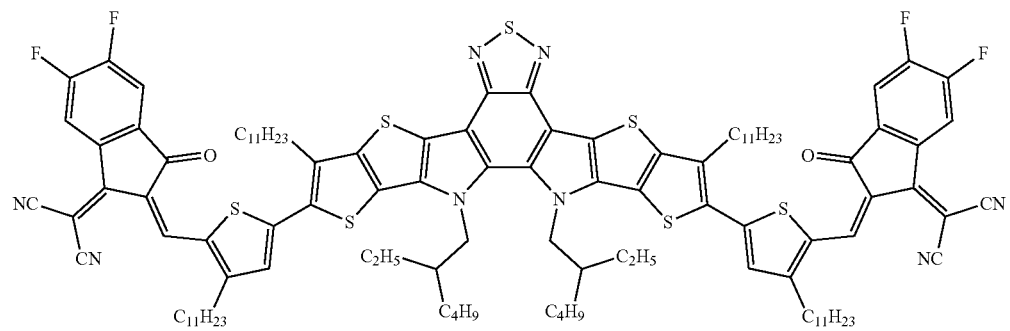

TABLE 2-continued
The structures of A1-A39
A9
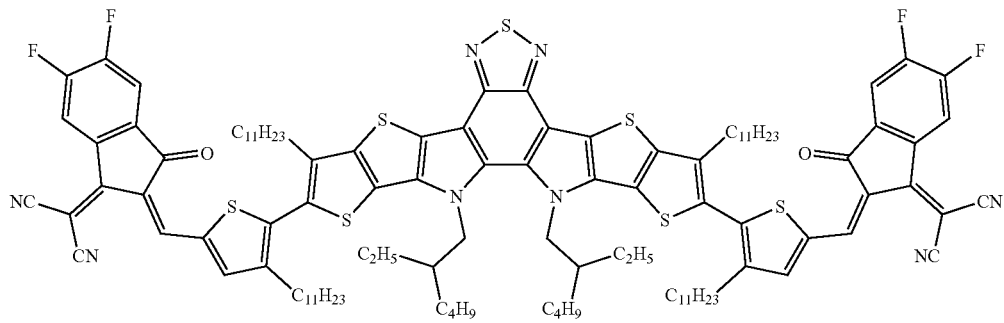
A10
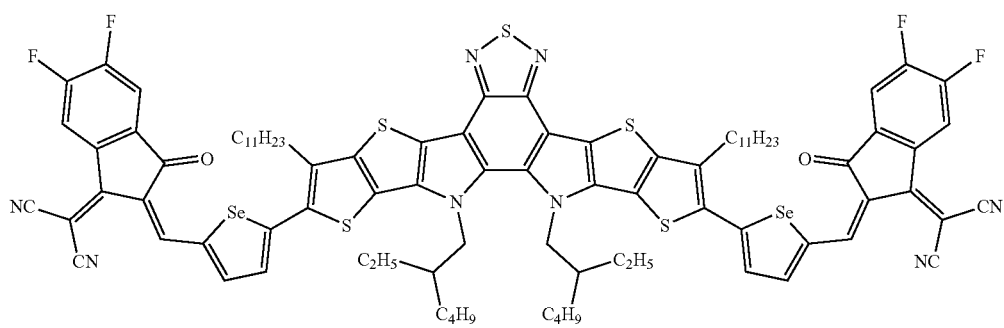
A11
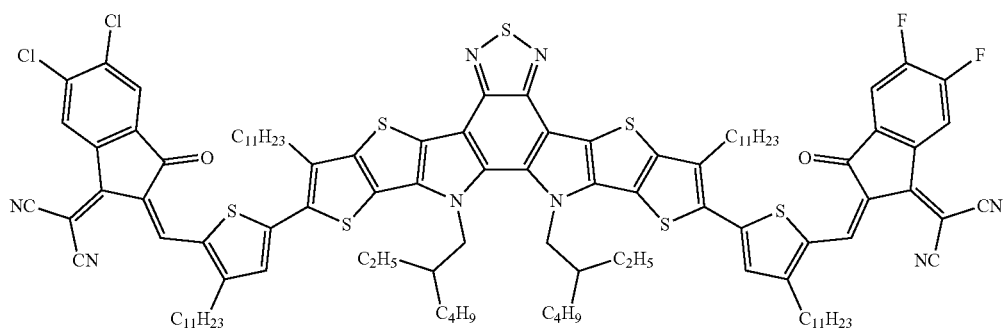
A12
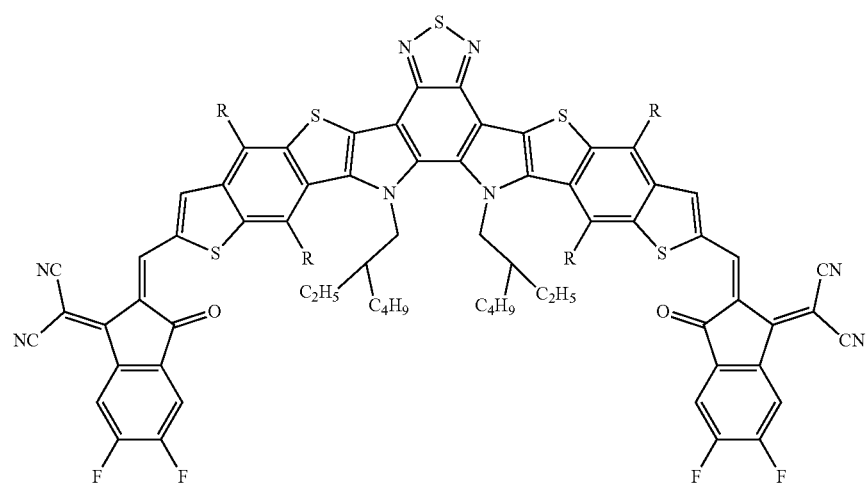

TABLE 2-continued
The structures of A1-A39
A13
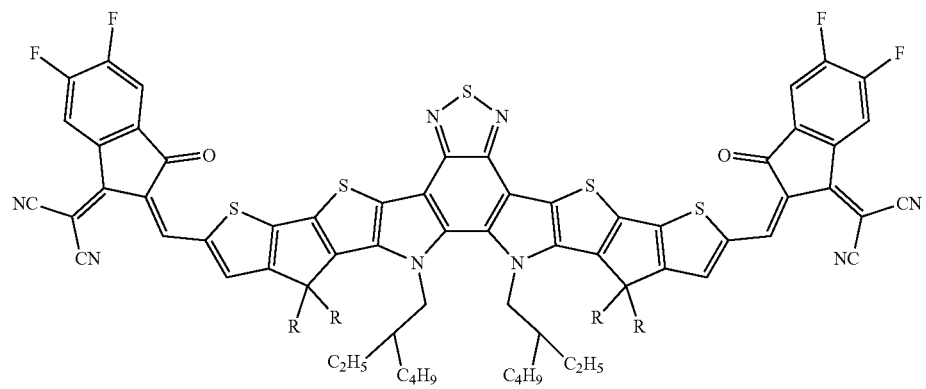
R = ethylhexyl
A14
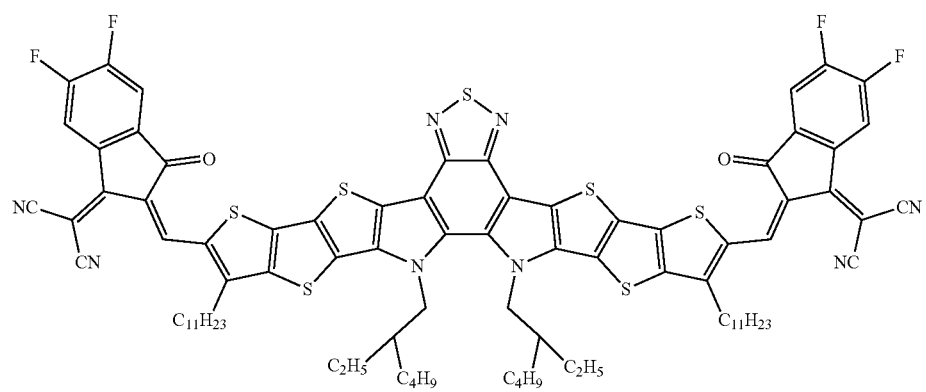
A15
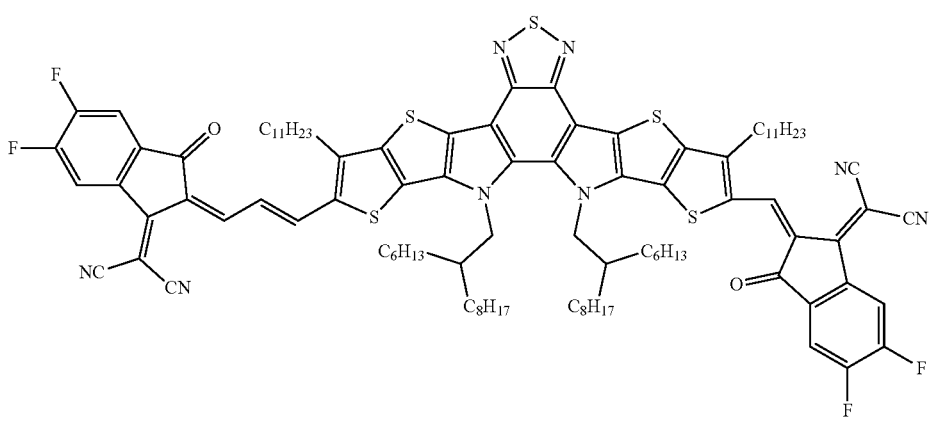
A16
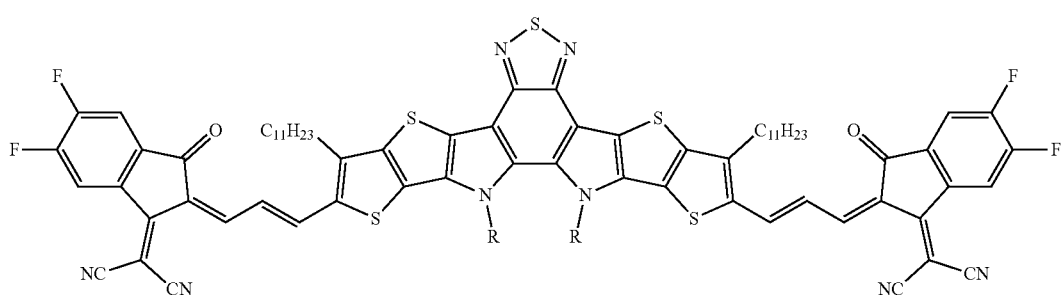
R = hexyldecyl TABLE 2-continued
The structures of A1-A39
A17
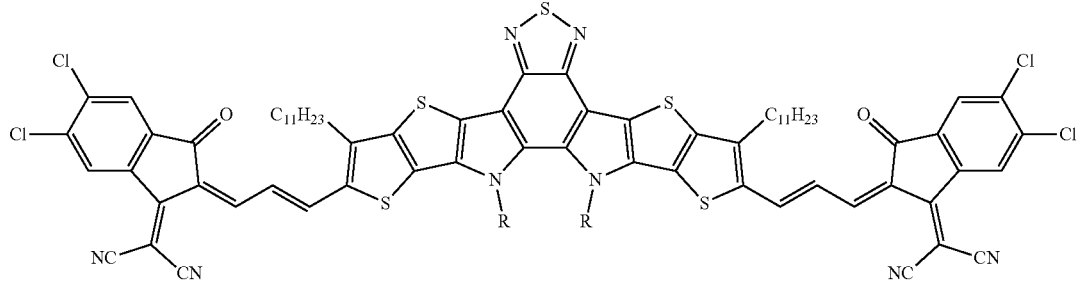
R = hexyldecyl
A18
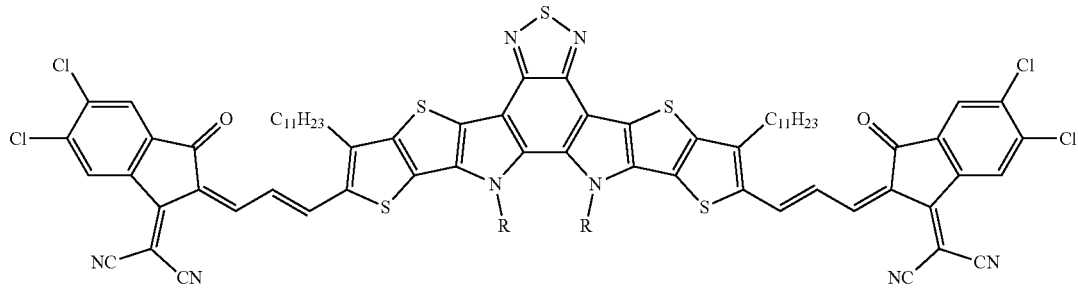
R = decyltetradecyl
A19
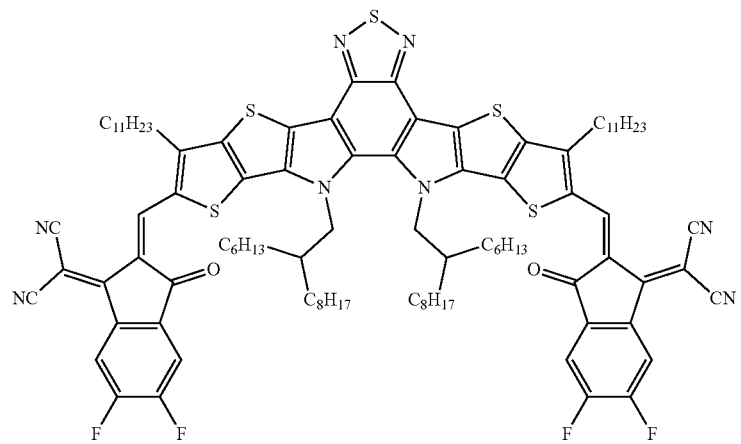
A20
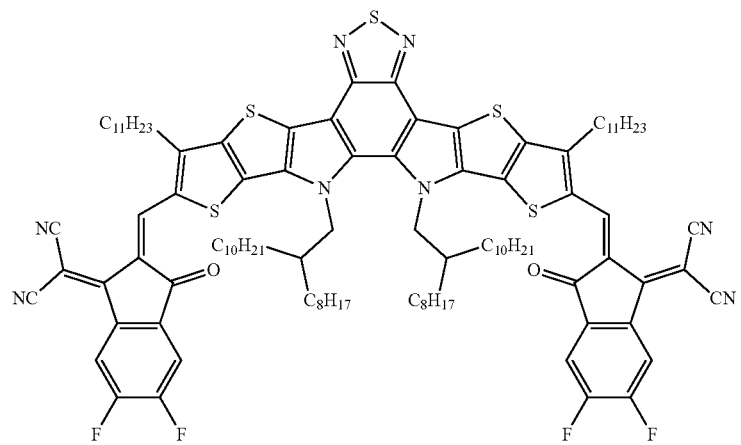

TABLE 2-continued
The structures of A1-A39
A21
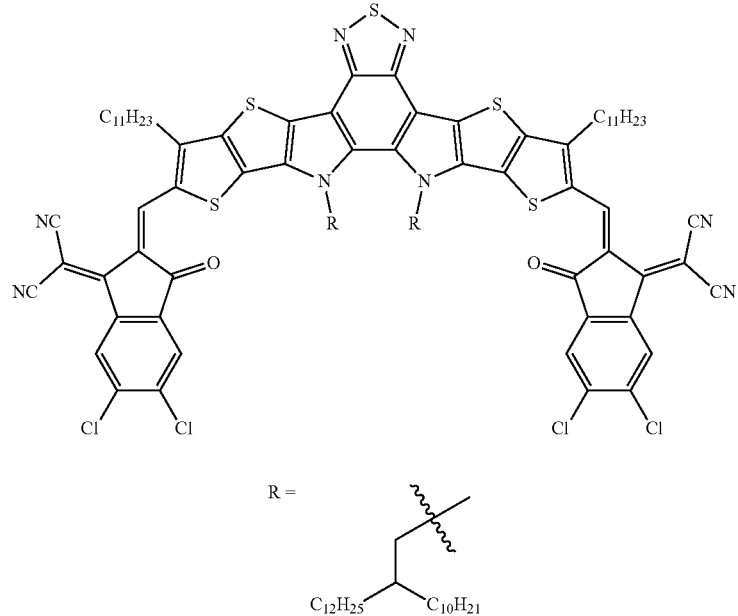
A22
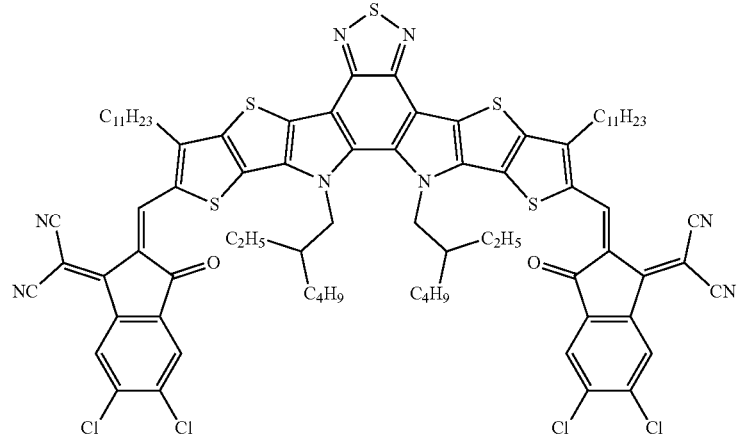
A23
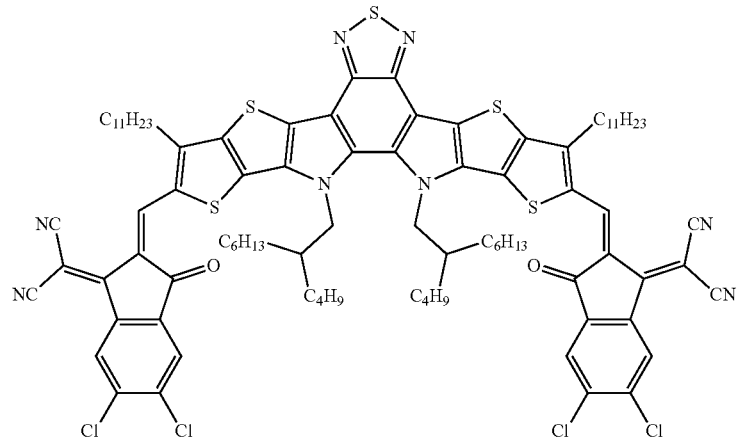

TABLE 2-continued
The structures of A1-A39
A24
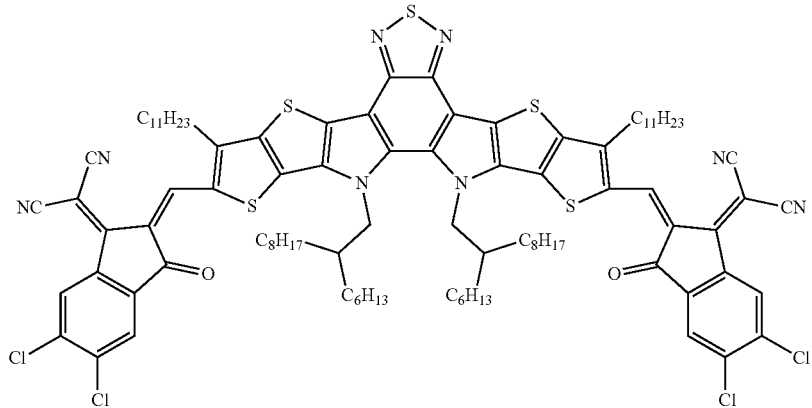
A25
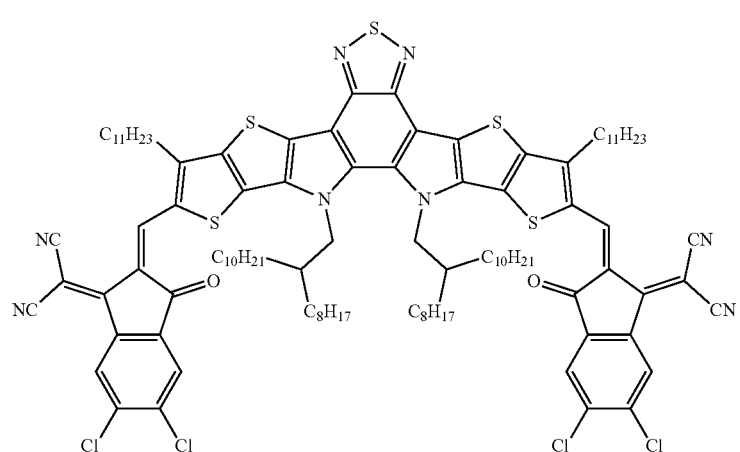
A26
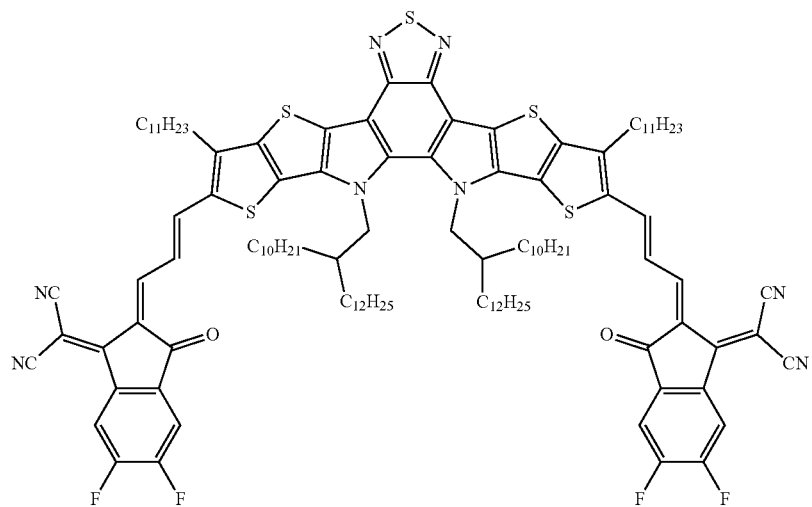

TABLE 2-continued
The structures of A1-A39
A27
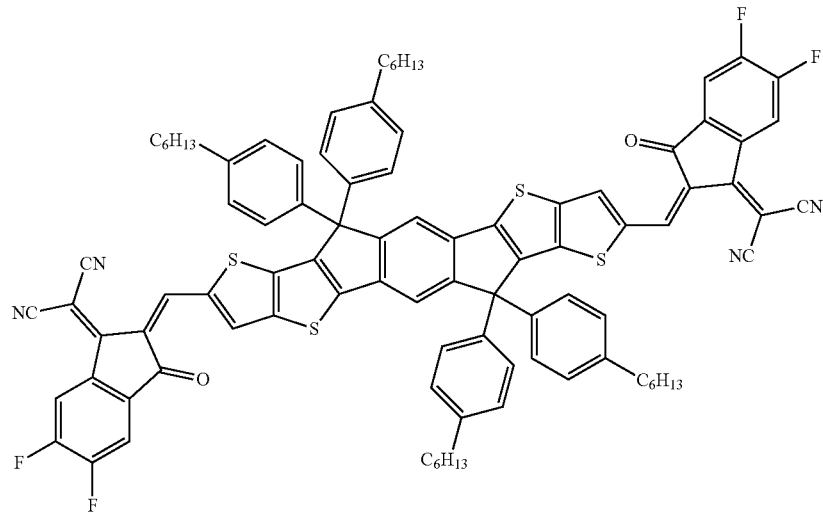
A28
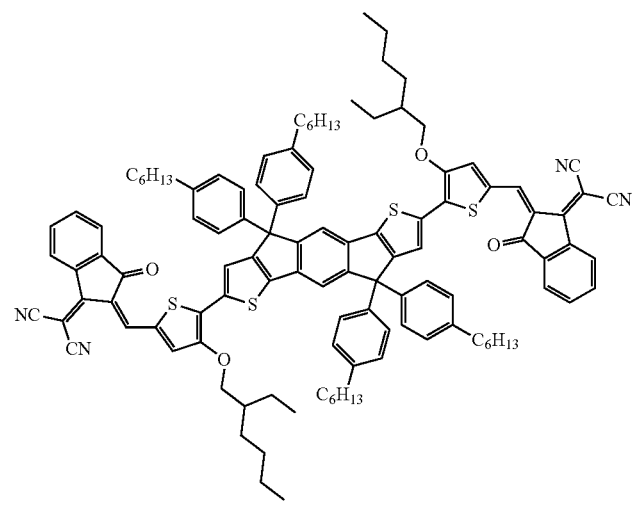
A29
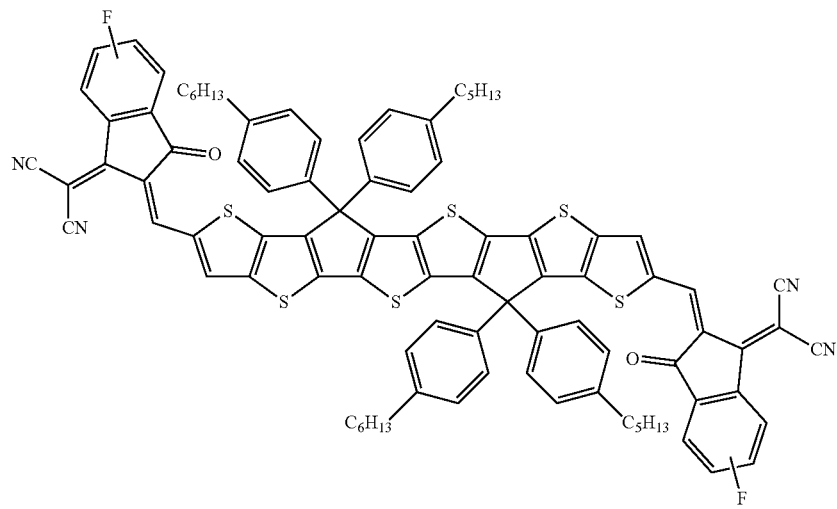

TABLE 2-continued
The structures of A1-A39
A30
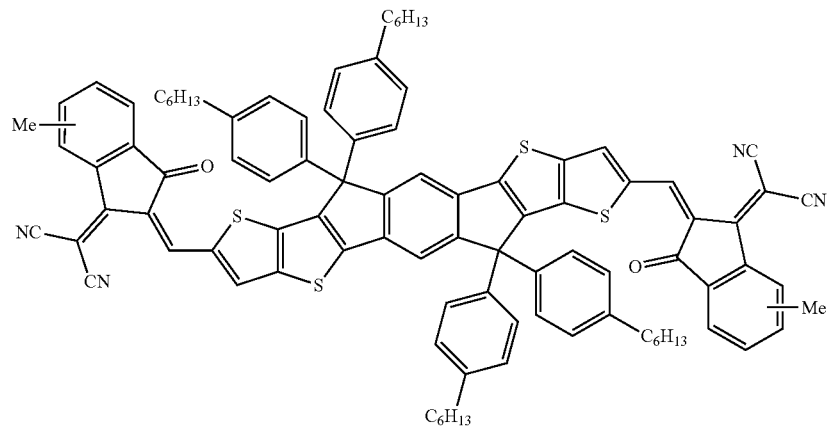
A31
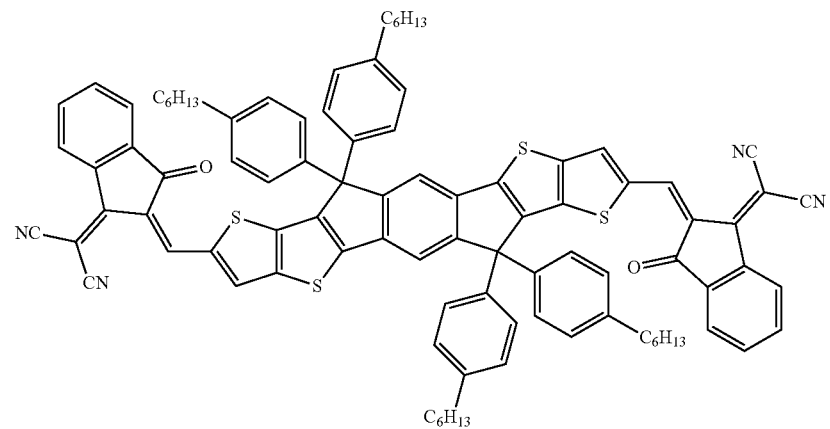
A32
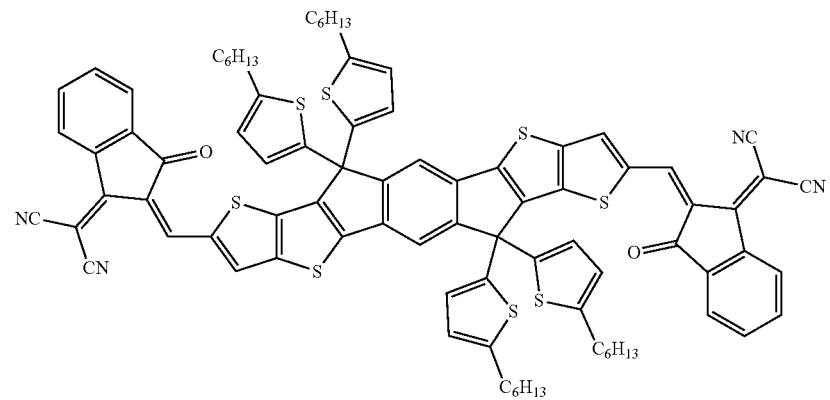

TABLE 2-continued
The structures of A1-A39
A33
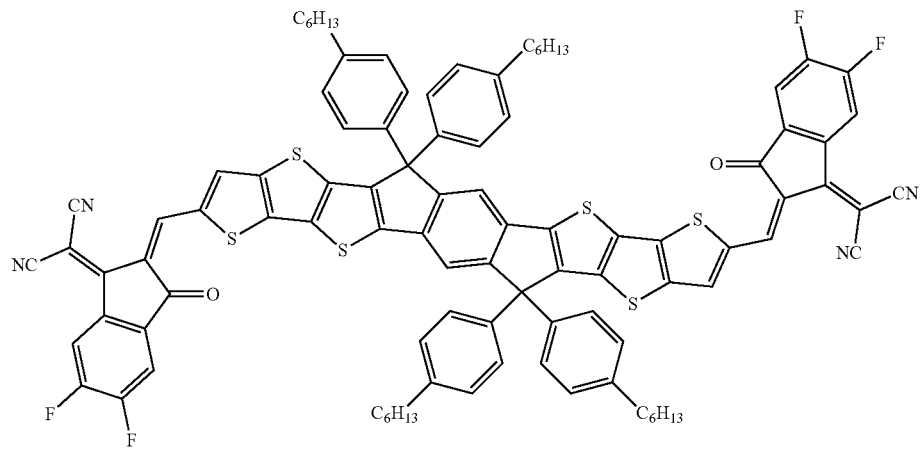
A34
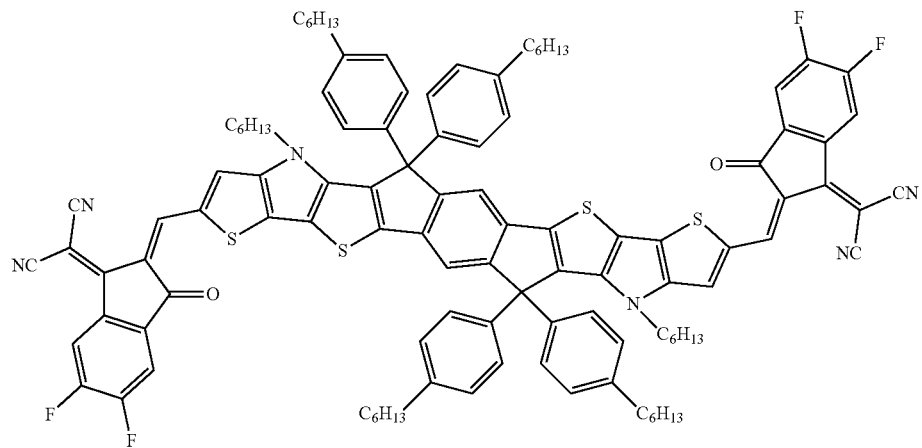
A35
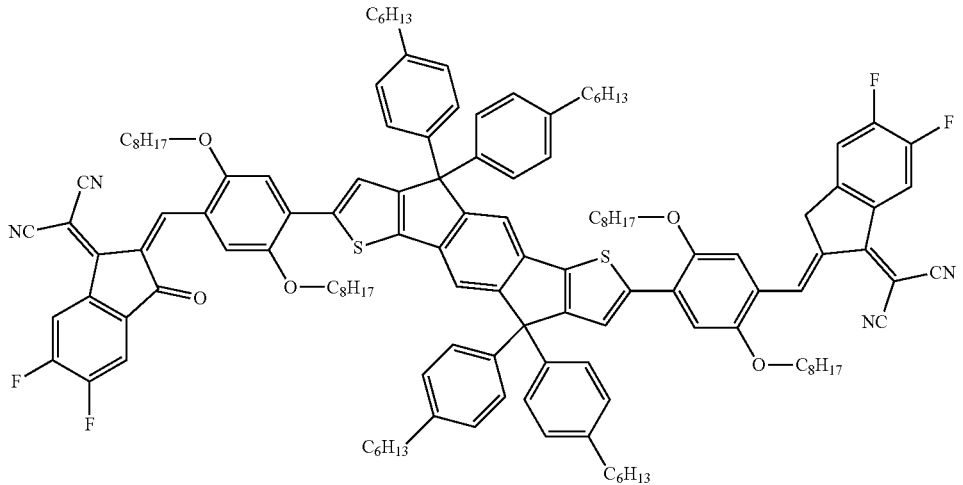

TABLE 2-continued
The structures of A1-A39
A36
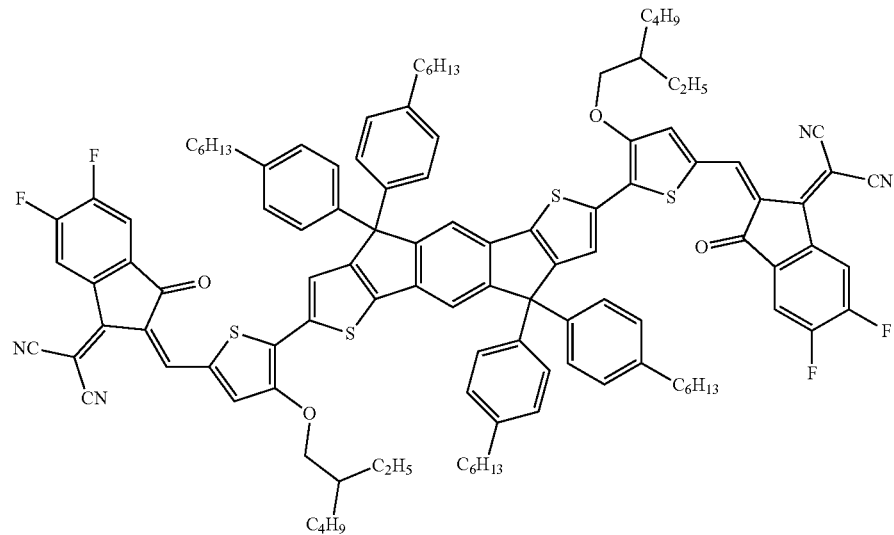
A37
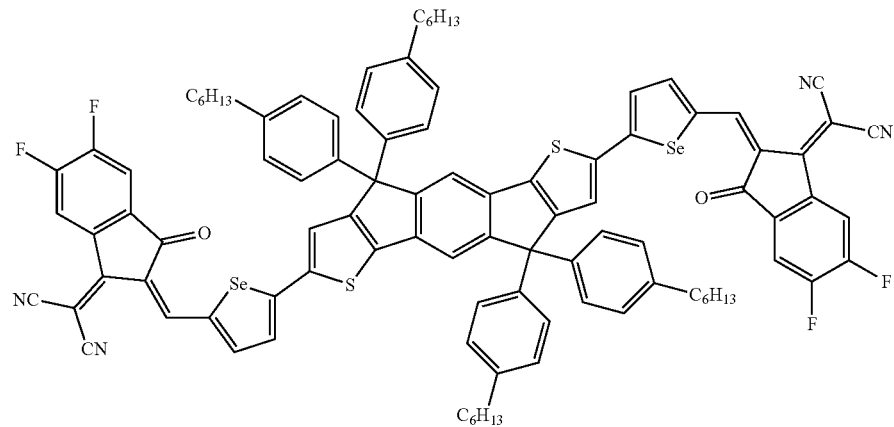
A38
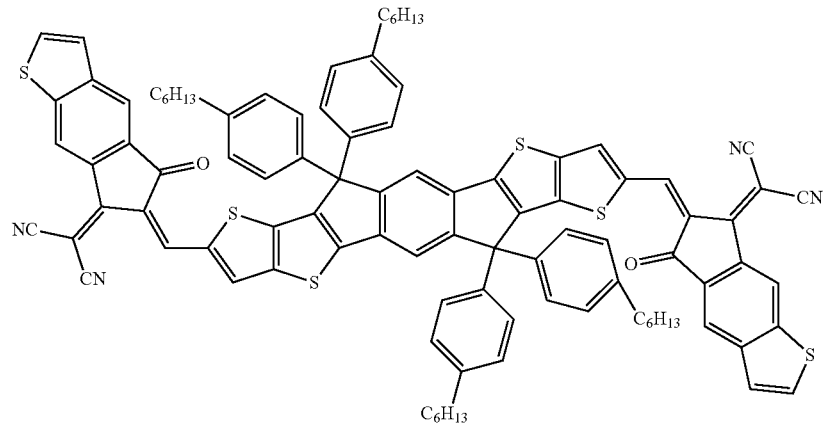

TABLE 2-continued

The structures of A1-A39

A39
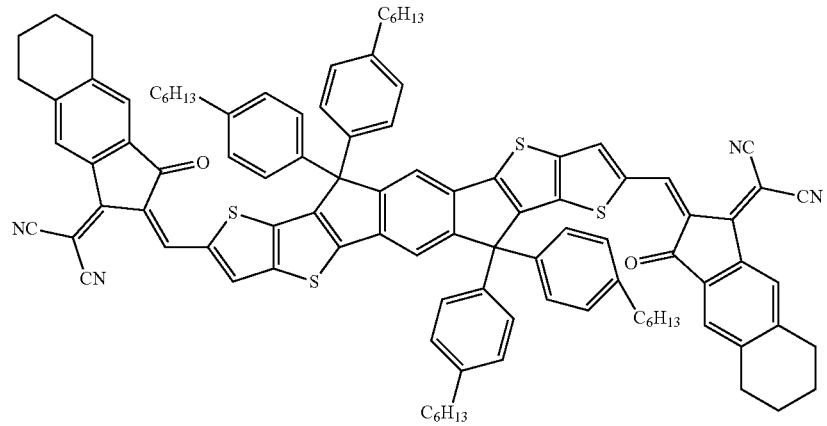

Wherein, as stated above, the photoactive layer 40 comprises the P-type semiconductor layer 41 (mainly P-type light-absorbing materials) and the N-type semiconductor layer 43 (mainly N-type light-absorbing materials), which have different energy gaps. One of them is a wide energy gap material used to absorb short-wavelength photons (<800 nm) and the other one is a narrow energy gap material used to absorb long-wavelength photons (>800 nm).

According to the present embodiment, the composition ratio of the P-type semiconductor layer 41 and the N-type semiconductor layer 43 is between 1:0.5 and 1:1.5, and preferably between 1:0.6 and 1:1.2.

According to the present embodiment, the difference in the energy gap between the P-type semiconductor layer 41 and the N-type semiconductor layer 43 is ≤0.50 eV, in which the proportion of the wide energy gap material is greater than that of the narrow energy gap material.

In addition, in the example, because of the nature of its material, the photoactive layer 40 can receive light from external sources (may be specific-wavelength or full-wavelength) and converts it into electric currents by means of charge transport and photo-electronic response.

According to the present embodiment, when the second electrode 50 is a transparent electrode or a metal electrode. Preferably, the second electrode 50 is, but not limited to, a transparent electrode. When the second electrode 50 as described above adopts the transparent electrode, the transparent electrode is selected from the group consisting of metal oxide, conductive polymer, graphene, carbon nanotube, metal nanowire, and metal mesh.

When the second electrode 50 adopts the metal electrode, the metal electrode is selected from the group consisting of aluminum, silver, gold, copper, tungsten, molybdenum, and titanium or a composite metal electrode using the above metals with different elements such as TiN or similar concept.

According to the present embodiment, either or both the first electrode 20 or/and the second electrode 50 is/are a transparent electrode, in which the response region of the transparent electrode is complementary to that of the narrow energy gap material (of the P-type semiconductor layer 41 or the N-type semiconductor layer 43) of the photoactive layer 40. Therefore, the first electrode 20 or the second electrode 50 will have a better penetration ability in the response region and thus can acquire a better photo-electronic spectral response in the long-wave region.

Figure 2:
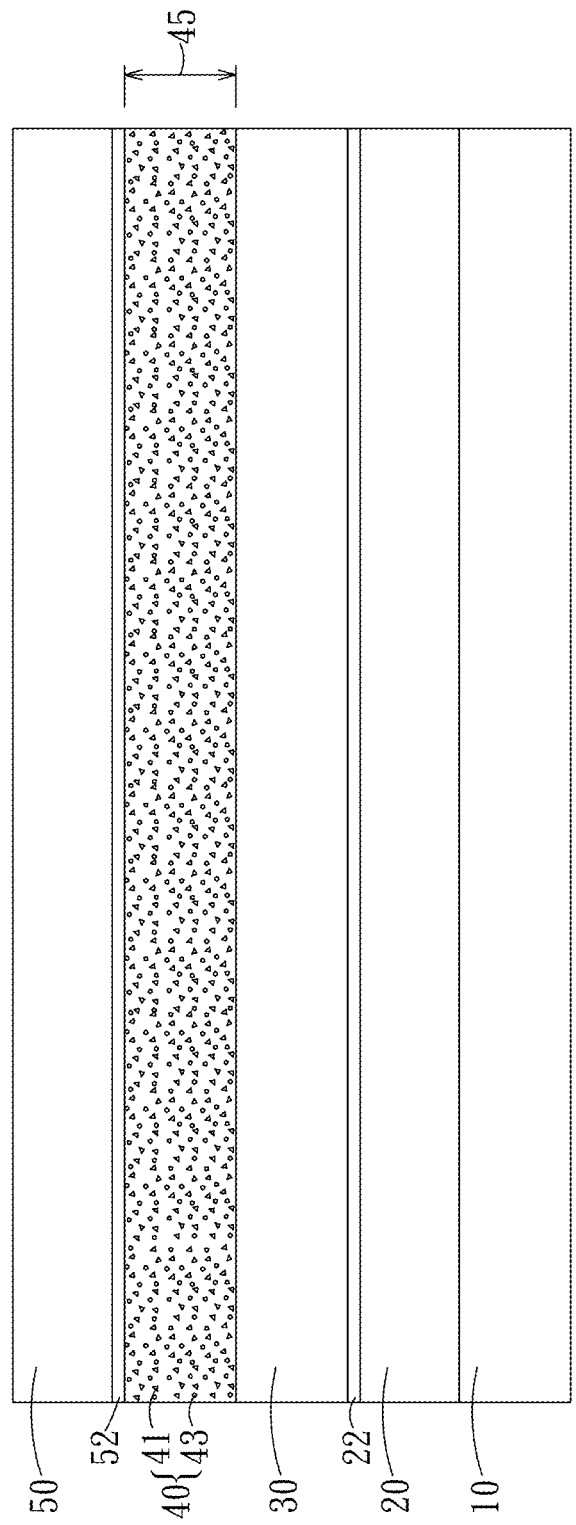
FIG. 2 shows the schematic diagram of the first active metal layer and the second active metal layer in an example of the invention.

Further, please refer to the schematic diagram of the structure of the first active metal layer and the second active metal layer set out in the example as shown in FIG. 2, the first electrode 20 and the second electrode 50 further comprises a first active metal layer 22 and a second active metal layer 52 respectively. The material of the first active metal layer 22 and the second active metal layer 52 arranged in the first electrode 20 and the second electrode 50 respectively are selected from a group composed of magnesium, calcium, lithium, caesium, and their constituents, in which, the first active metal layer 22 and the second active metal layer 52 are used to transport the internal carriers to the first electrode 20 and the second electrode 50 in a more effective manner.

To fabricate the structure of photodiode according to the present embodiment, an ITO transparent electrode can be manufactured on the substrate 10 using by sputtering or a metal electrode can be manufactured on the substrate 10 by thermal evaporation for disposing the first electrode 20 on the substrate 10. Next, after to dissolve polymeric transport material or metal oxide soluble in polar solvent, and then form the first transport layer 30 on the first electrode 20 by spin coating. The above polar solvent includes alcohols, water-soluble solvent, dimethyl sulfoxide (DMSO), or dimethylformamide (DMF). In the above description, the alcohol solvent is used as an example. The present invention is not limited to the embodiment.

Then, organic photoactive material is dissolved in a common organic solvent, such as xylene, toluene, tetrahydrofuran, chloroform, chlorobenzene, dichlorobenzene, and coating the solution on the first transport layer 30 to form the photoactive layer 40. The photoactive layer 40 is located on the first transport layer 30. Afterwards, use the coating process of sputtering to fabricate the second electrode 50. The above coating process includes sputtering, evaporation, or physical vapor deposition. In the above example, sputtering is adopted for illustration.

Figure 3:
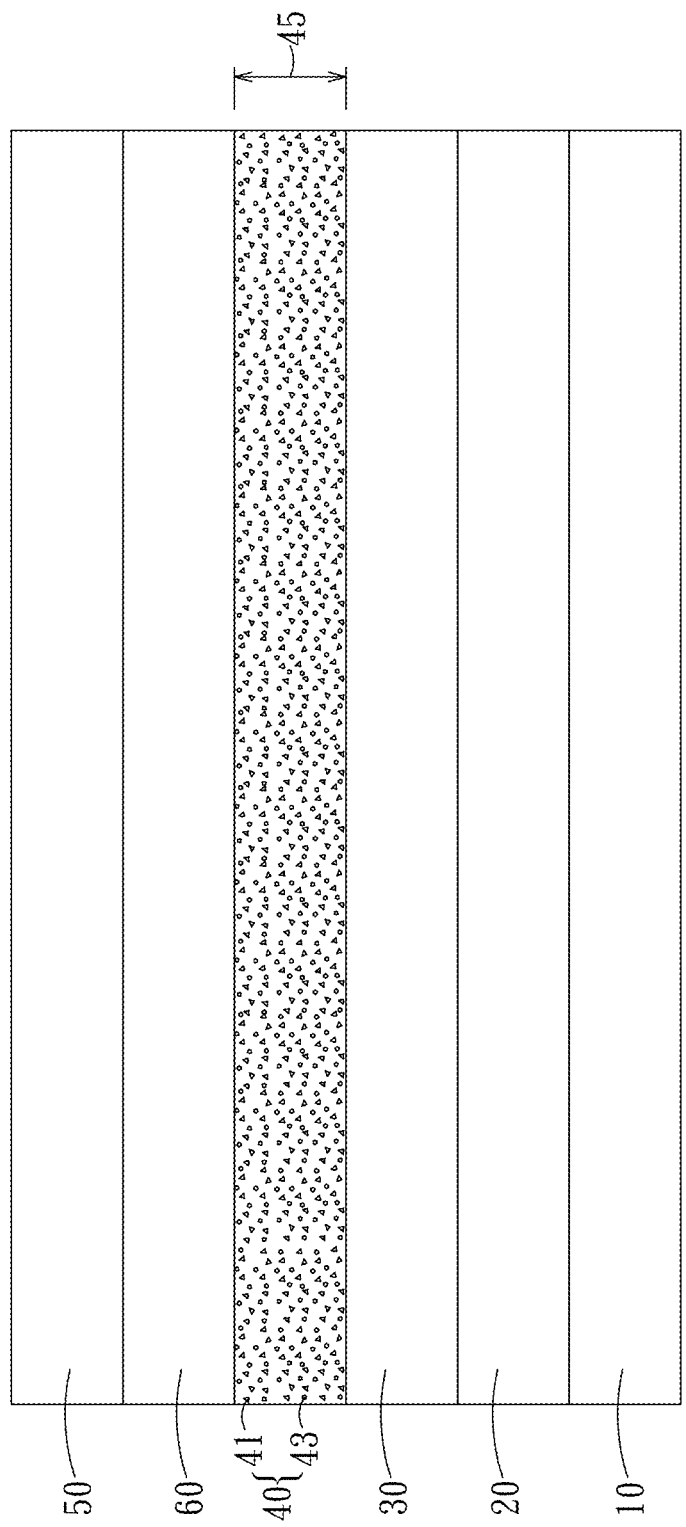
FIG. 3 shows the schematic diagram of the photodiode in another example of the invention.

Please refer to FIG. 3, which shows a schematic diagram of the structure of photodiode according to another embodiment of the present invention. As shown in the FIG. 3, the structure of photodiode according to the present embodiment further comprises a second transport layer 60 disposed between the photoactive layer 40 and the second electrode 50. The device structure according to the present embodiment is identical to the one according to the previous embodiment. Hence, the details will not be described again.

Wherein, the material of the second transport layer 60 is selected from a group composed of one or more of the following materials: organic polymer, organic small molecule, and metal oxide.

The organic polymer is selected from PEDOT:PSS or

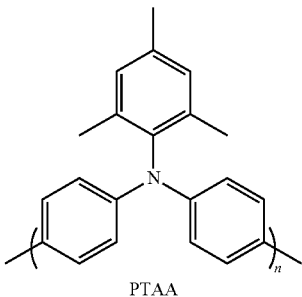

PTAA

The organic small molecule is selected from

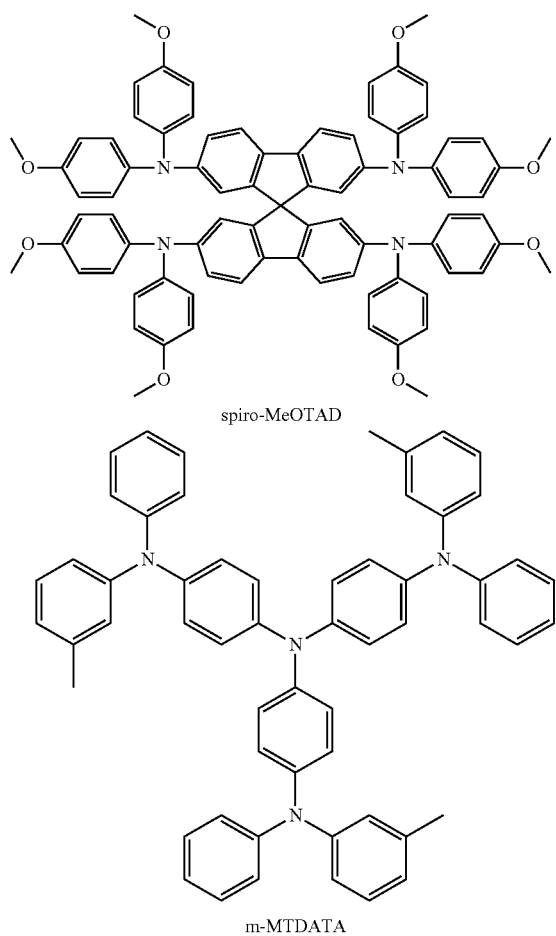

spiro-MeOTAD m-MTDATA

The metal oxide or the metal compound is selected from $MoO_3$, NiO, $V_2O_5$, $WO_3$, or CuSCN.

Then, the following example is provided based on the structure of the photodiode revealed in FIG. 3. The purpose of the embodiment of the structure of the photodiode set out in Example 1 to Example 5 is to expound upon how to adjust the composition ratio of the P-type semiconductor layer 41 and the N-type semiconductor layer 43 in the photoactive layer 40 of the photodiode and the thickness 45 of the photoactive layer 40 and to form the self-filtration photodiode structure that can achieve FWHM response. The following examples are given to demonstrate the effect of self-filtration by changing the composition ratio and the thickness.

EXPERIMENTAL CONDITIONS OF THE EXAMPLES

1. Structure and composition: Refer to the structure of the photodiode in FIG. 3.
2. Light casting method: From the substrate 10 in the direction of the second electrode 50.
3. The composition of the photoactive layer 40: Take D5 (the P-type semiconductor layer 41) and A26 (the N-type semiconductor layer 43), the composition ratio is between 1:0.6 to 1:1.5, in which the energy gaps of the P-type semiconductor layer 41 and the N-type semiconductor layer 43 are different; furthermore, the P-type semiconductor layer 41 is a wide energy gap material, absorbing short wavelengths (<800 nm), and the N-type semiconductor layer 43 is a narrow energy gap material, absorbing long wavelengths (>800 nm).
4. The thickness 45: ≤1000 nm.

Figure 4A:
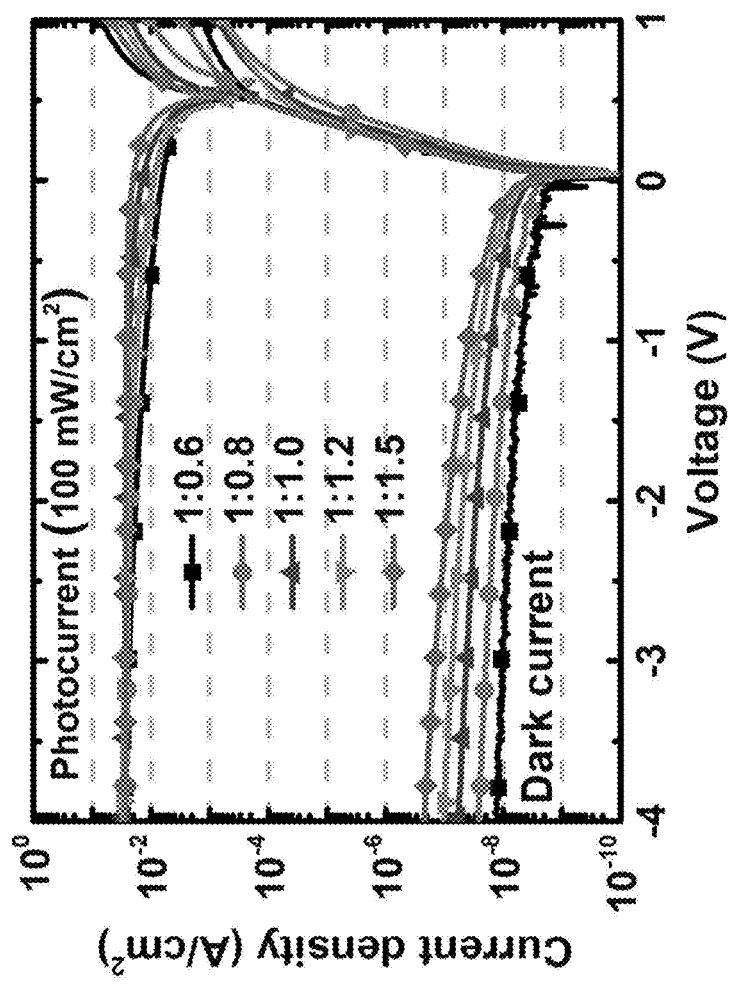
FIG. 4A shows the schematic diagram of the electric flux of the photodiode in another example of the invention.
Figure 4B:
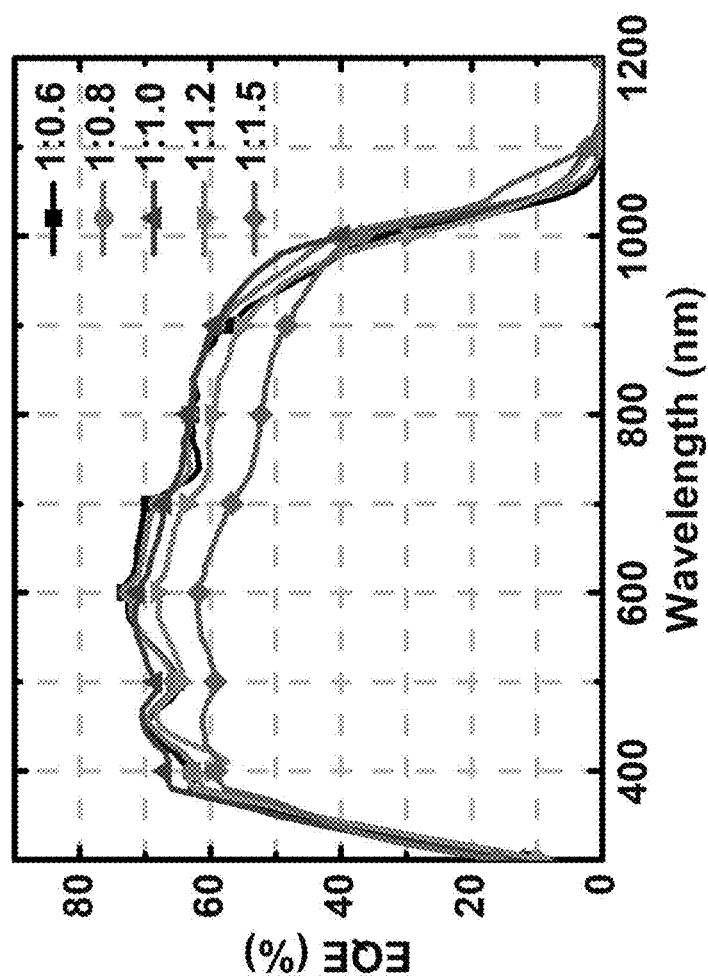
FIG. 4B shows the schematic diagram of the external quantum efficiency of the photodiode in another example of the invention.

The experimental results of Example 1 are shown in Table 3, that illustrated the experimental results of Example 1, also refer to FIG. 4A for a schematic diagram of the electric flux of the photodiode in another example of the invention, FIG. 4B for a schematic diagram of the external quantum efficiency of the photodiode in another example of the invention.

TABLE 3

| | Results of Example 1 | | | | |
|---|---|---|---|---|---|
| The composition ratio of D5 and A26 | Dark current flow (A/cm²) at −4 V | Photocurrent flow (mA/cm²) at −4 V | External quantum efficiency at 940 nm (%) | | |
| | | | 0 V | −2 V | −4 V |
| 1:0.6 | $1.2 \times 10^{-8}$ | 27.7 | 32.4 | 46.9 | 49.1 |
| 1:0.8 | $2.6 \times 10^{-8}$ | 28.5 | 46.1 | 51.5 | 52.9 |
| 1:1.0 | $5.7 \times 10^{-8}$ | 30.0 | 38.6 | 54.9 | 55.5 |
| 1:1.2 | $1.0 \times 10^{-7}$ | 28.4 | 47.3 | 49.1 | 50.0 |
| 1:1.5 | $2.2 \times 10^{-7}$ | 25.6 | 39.5 | 44.8 | 45.1 |

As shown in Table 3, FIG. 4A, and FIG. 4B, the external quantum efficiency (EQE) at a composition ratio of D5≤A26 or D5≥A26 exhibits a significantly broadband spectrum with a better photoresponse between 400 nm and 1000 nm.

At a composition ratio between 1:0.6 and 1:1.5 (D5≤A26 or D5≥A26), the photoactive layer 40 has excellent external quantum efficiency and photocurrent density performance and shows good dark current density characteristics.

The most remarkable composition ratio is between 1:0.6 and 1:1.2 and the most outstanding external quantum efficiency is observed at 940 nm when the composition ratio is 1:1.0, and the dark current density can be maintained at a level between $10^{-8}$ mA/cm². The experimental results in Table 3 show that, in the example, for the dark current density, photocurrent density, and external quantum efficiency, any change to the composition ratio of D5 and A26 would not result in a significant change in the light characteristics.

Experimental Conditions of Example 2

1. Structure and composition: Refer to the structure of the photodiode in FIG. 3.
2. Light casting method: From the substrate 10 in the direction of the second electrode 50.
3. The composition of the photoactive layer 40: As shown in Table 4 below, including the material ratio of D5 and A26.

TABLE 4

| The composition ratio of D5 and A26 | External quantum efficiency (%) | | | |
|---|---|---|---|---|
| | 600 nm | 800 nm | 1000 nm | 1070 nm |
| 1:1.2 | 19.5 | 24.0 | 28.2 | 4.3 |
| 1:1.0 | 3.7 | 10.7 | 13.9 | 3.6 |
| 1:0.8 | 2.6 | 3.4 | 8.9 | 9.5 |
| 1:0.6 | 0.03 | 0.03 | 0.04 | 14.1 |

According to the table, the composition ratio of D5 (the P-type semiconductor layer 41) and A26 (the N-type semiconductor layer 43) is between 1:0.6~1:1.2, in which the energy gaps of the P-type semiconductor layer 41 and the N-type semiconductor layer 43 are different; furthermore, the P-type semiconductor layer 41 is a wide energy gap material, absorbing short wavelengths (<800 nm), and the N-type semiconductor layer 43 is a narrow energy gap material, absorbing long wavelengths (>800 nm).

4. The thickness 45: 8 μm.

Figure 5:
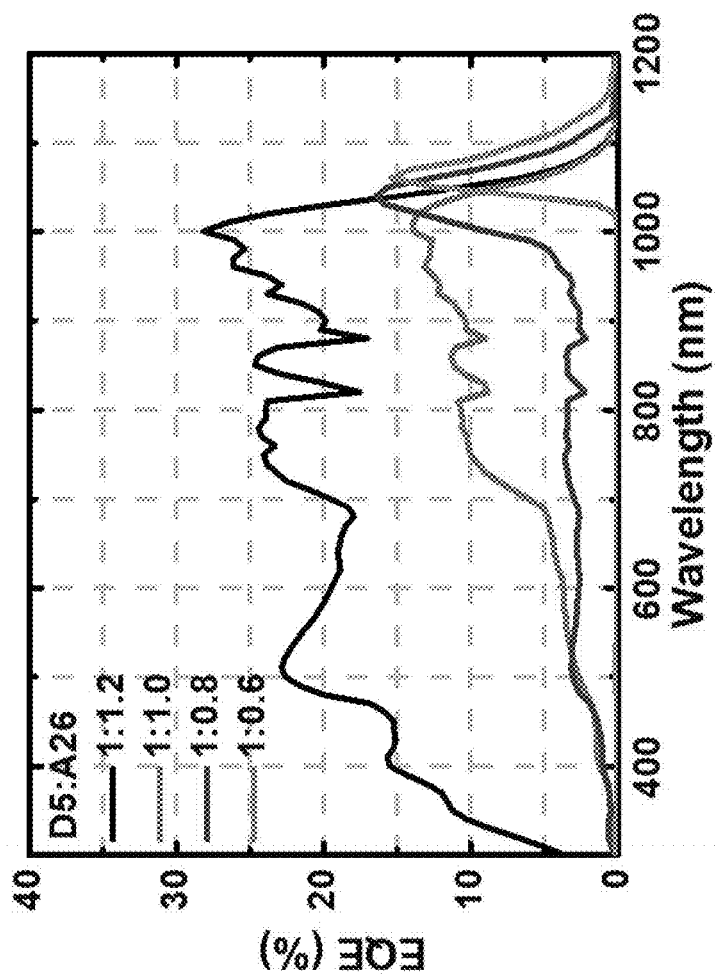
FIG. 5 shows the schematic diagram of the external quantum efficiency of the photodiode in another example of the invention.

The experimental results of Example 2 are shown in FIG. 5, which is a schematic diagram of the external quantum efficiency of the photodiode in another example of the invention.

Wherein, according to the experimental results in FIG. 5 and the experimental values in Table 4, when the thickness 45 of the photoactive layer 40 is increased to 8 μm, the lower the proportion of A26 (the N-type semiconductor layer 43) takes up, the weaker the photoelectron response in the visible to near-infrared region (400-1000 nm), which means a more obvious self-filtration effect.

Meanwhile, the increase in the thickness 45 of the photoactive layer 40 leads to an increase in the carrier transport distance and in turn wanes the overall external quantum efficiency of the photoactive layer 40; however, the sensitivity in the long wavelength region is accordingly improved.

Experimental Conditions of Example 3

1. Structure and composition: Refer to the structure of the photodiode in FIG. 3.
2. Light casting method: From the substrate 10 in the direction of the second electrode 50.
3. The composition of the photoactive layer 40: The composition ratio of D5 (the P-type semiconductor layer 41) and A26 (the N-type semiconductor layer 43) is 1:0.6, in which the energy gaps of the P-type semiconductor layer 41 and the N-type semiconductor layer 43 are different; furthermore, the P-type semiconductor layer 41 is a wide energy gap material, absorbing short wavelengths (<800 nm), and the N-type semiconductor layer 43 is a narrow energy gap material, absorbing long wavelengths (>800 nm).
4. The thicknesses 45: 0.7 μm, 5 μm, and 10 μm.

Figure 6A:
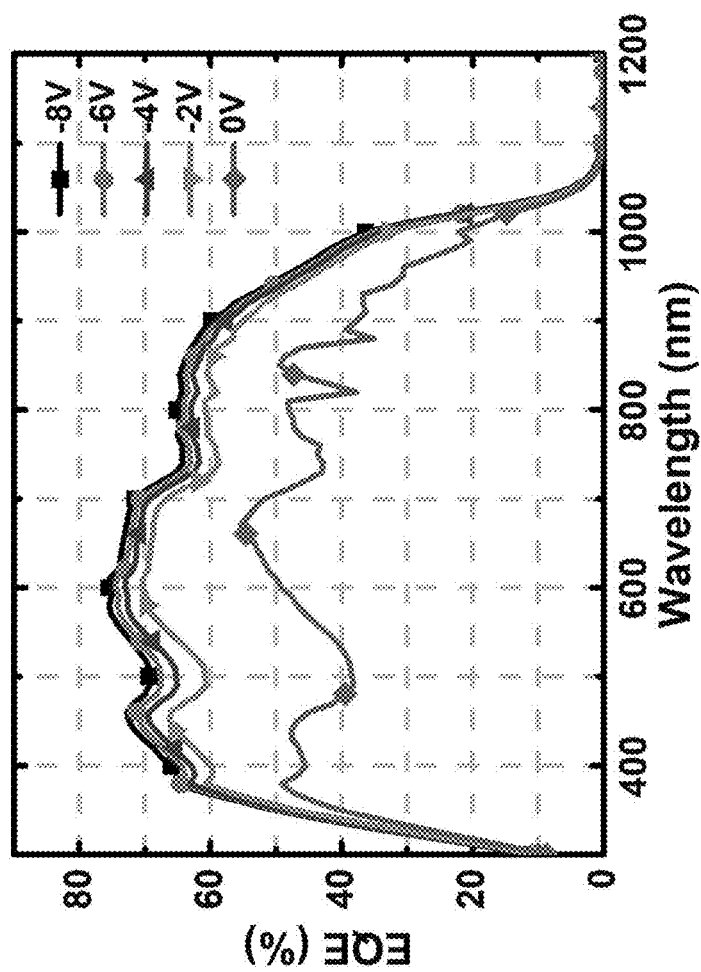
FIG. 6A shows the schematic diagram of the external quantum efficiency of the photodiode in another example of the invention.
Figure 6B:
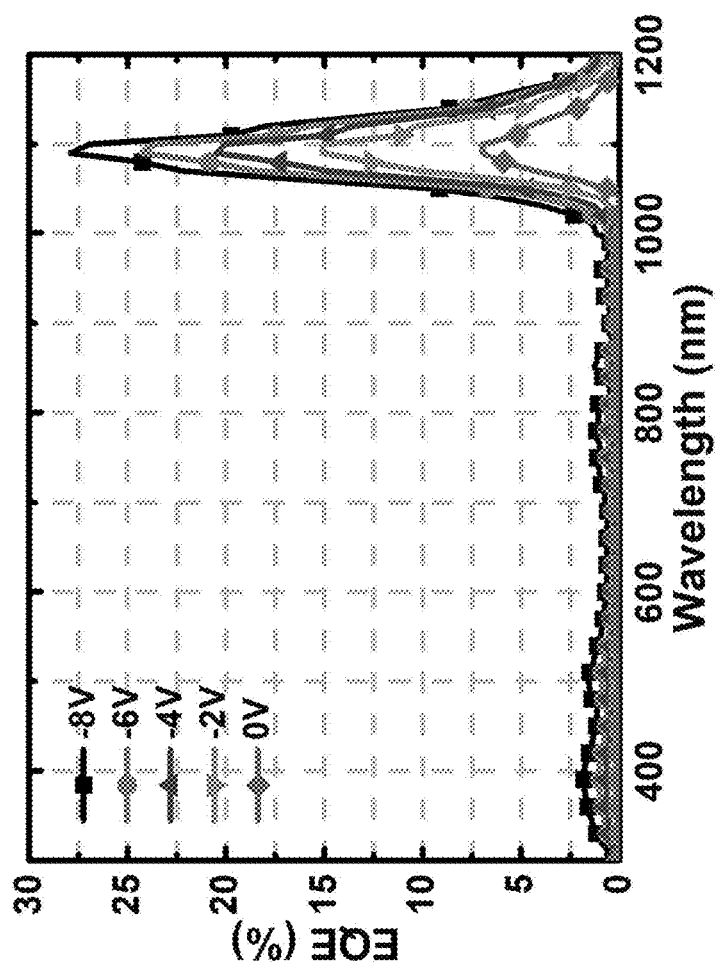
FIG. 6B shows the schematic diagram of the external quantum efficiency of the photodiode in another example of the invention.
Figure 6C:
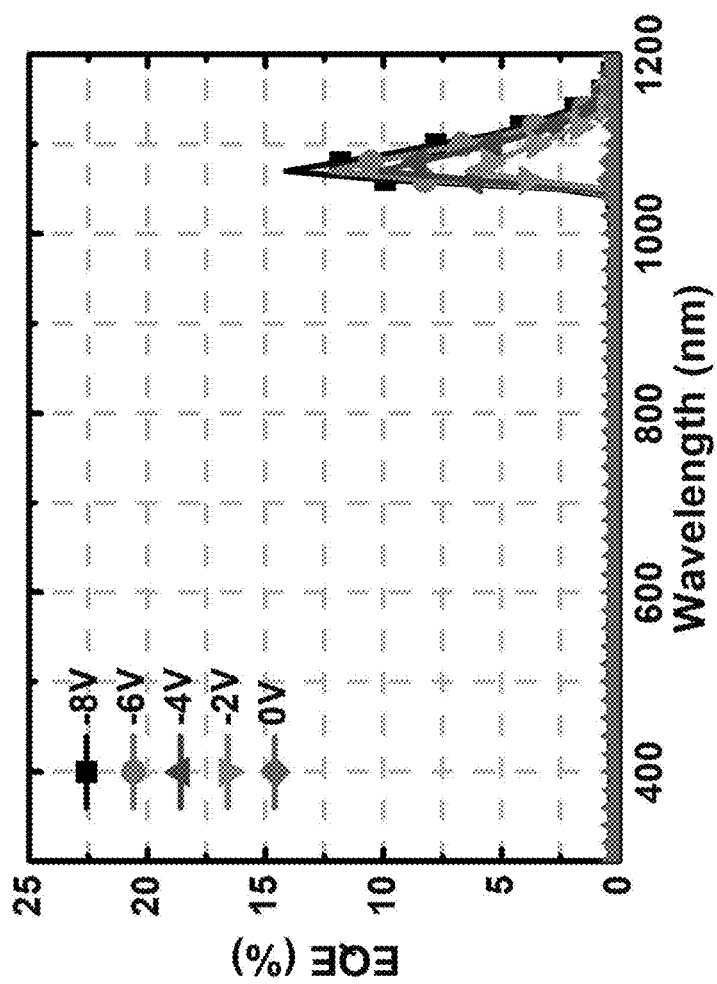
FIG. 6C shows the schematic diagram of the external quantum efficiency of the photodiode in another example of the invention.

The experimental results of Example 3 are shown in FIG. 6A, FIG. 6B, and FIG. 6C, which are the schematic diagrams of the external quantum efficiency of the photodiode in another example of the invention.

Wherein, according to the experimental results in FIG. 6A to FIG. 6C, when the thickness 45 is increased from 0.7 μm to 5 μm, the photoactive layer 40 in the structure of the photodiode of the example exhibits a significant self-filtration effect, and the photoresponse response in the short wavelength region can be significantly diluted.

When the thickness 45 of the photoactive layer 40 in the structure of the photodiode of the example is increased to 10 μm, the self-filtration can be further improved.

As shown in FIG. 6B and FIG. 6C, according to the spectra of the external quantum efficiency obtained when the photoactive layer 40 is 5 μm and 10 μm thick, the FWHM at the characteristic peak is below 200 nm; however, the increase in the thickness 45 will also lead to an increase in the carrier transport distance and wane the overall external quantum efficiency of the photoactive layer 40; however, the sensitivity in the long wavelength region is accordingly improved.

Experimental Conditions of Example 4

1. Structure and composition: Refer to the structure of the photodiode in FIG. 3.
2. Light casting method: From the substrate 10 in the direction of the second electrode 50.
3. The composition of the photoactive layer 40: Take D5 (the P-type semiconductor layer 41), A24 and A26 (the N-type semiconductor layer 43), the composition ratio is 1:0.6, in which the energy gaps of the P-type semiconductor layer 41 and the N-type semiconductor layer 43 are different; furthermore, the P-type semiconductor layer 41 is a wide energy gap material, absorbing short wavelengths (<800 nm), and the N-type semiconductor layer 43 is a narrow energy gap material, absorbing long wavelengths (>800 nm).
4. The thickness 45: 10 μm.

Figure 7A:
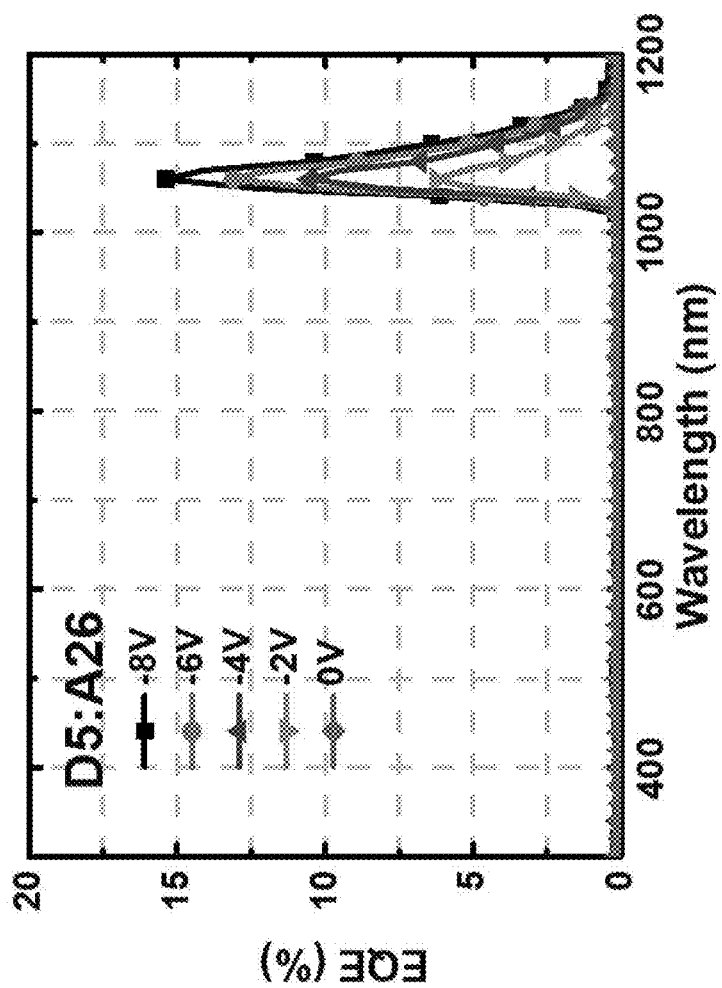
FIG. 7A shows the schematic diagram of the external quantum efficiency of the photodiode in another example of the invention.
Figure 7B:
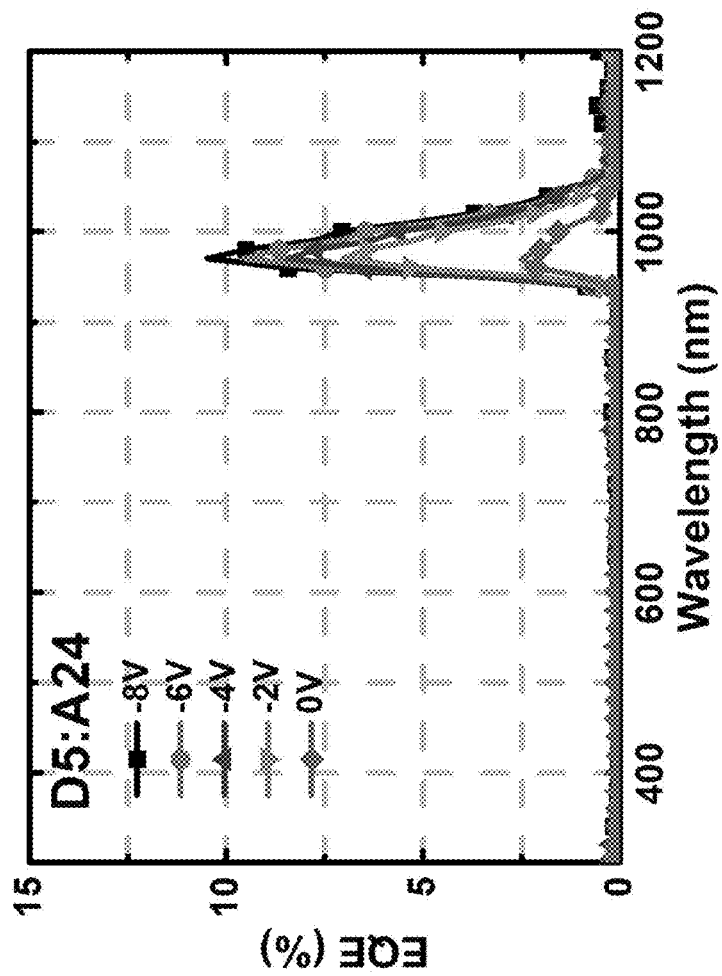
FIG. 7B shows the schematic diagram of the external quantum efficiency of the photodiode in another example of the invention.

The experimental results of Example 4 are shown in FIG. 7A and FIG. 7B, which is a schematic diagram of the external quantum efficiency of the photodiode in another example of the invention.

As shown in FIG. 7A and FIG. 7B, when D5 is used with different N-type semiconductor layers 43 (A26 and A24, EgA24>EgA26), a significant self-filtration effect can be attained when the thickness 45 is 10 μm; for both A26 and A24 photodiode structure, the FWHM at the characteristic peak is below 200 nm.

Experimental Conditions of Example 5

1. Structure and composition: Refer to the structure of the photodiode in FIG. 3. The first electrode 20 is an ITO (TCF1 in the prior art) and the second electrode 50 is a transparent electrode (TCF2, Indium doped ZnO).
2. Light casting method: From the second electrode 50 in the direction of the substrate 10.
3. The composition of the photoactive layer 40: Take D5 (the P-type semiconductor layer 41) and A26 (the N-type semiconductor layer 43), the composition ratio is 1:0.6, in which the energy gaps of the P-type semiconductor layer 41 and the N-type semiconductor layer 43 are different; furthermore, the P-type semiconductor layer 41 is a wide energy gap material, absorbing short wavelengths (<800 nm), and the N-type semiconductor layer 43 is a narrow energy gap material, absorbing long wavelengths (>800 nm).

4. The thickness 45: 10 μm.

Figure 8A:
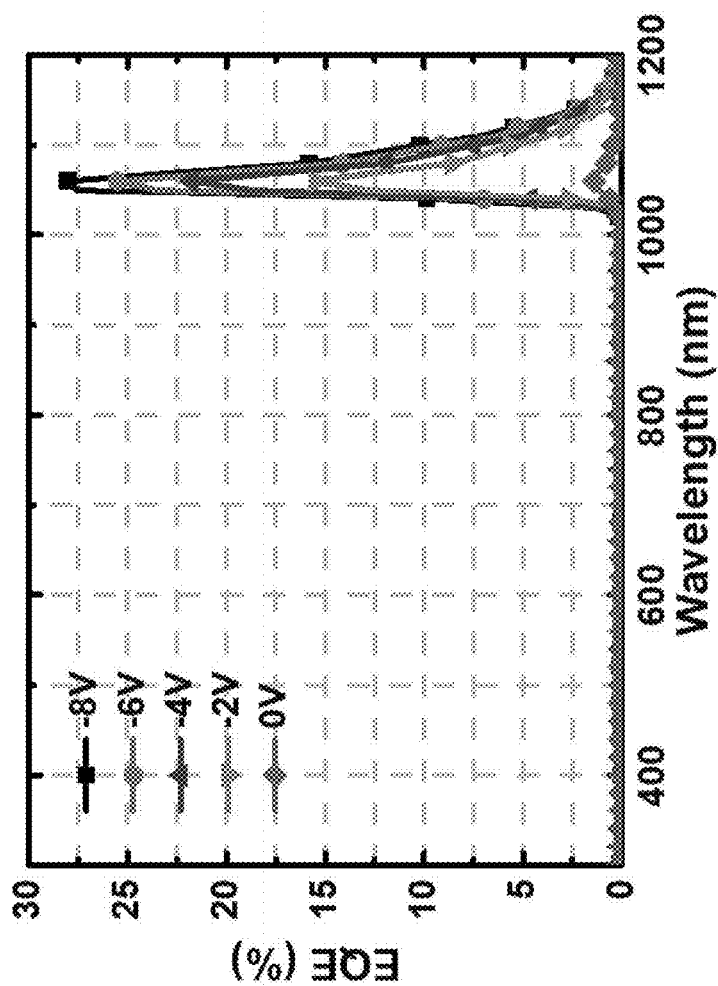
FIG. 8A shows the schematic diagram of the external quantum efficiency of the photodiode in another example of the invention.

The experimental results of Example 5 are shown in FIG. 6C as well as in FIG. 8A, which are the schematic diagrams of the external quantum efficiency of the photodiode in another example of the invention.

Wherein, the transparent conductive film (TCF), as its name implies, must be transparent and conductive and usually made of metal oxides. It is thus called transparent conducting oxides (TCO), the mainstream material is indium tin oxide (usually abbreviated to ITO).

Wherein, when the thickness 45 of the photoactive layer 40 is 10 μm, for the external quantum efficiency of the structure of the photodiode (please refer to FIG. 6C), in addition to the increase of the carrier transport distance due to the thickness of the film, the use of ITO (TCF1) for the first electrode 20 is not in favor of the penetration of red light and infrared light region.

Figure 8B:
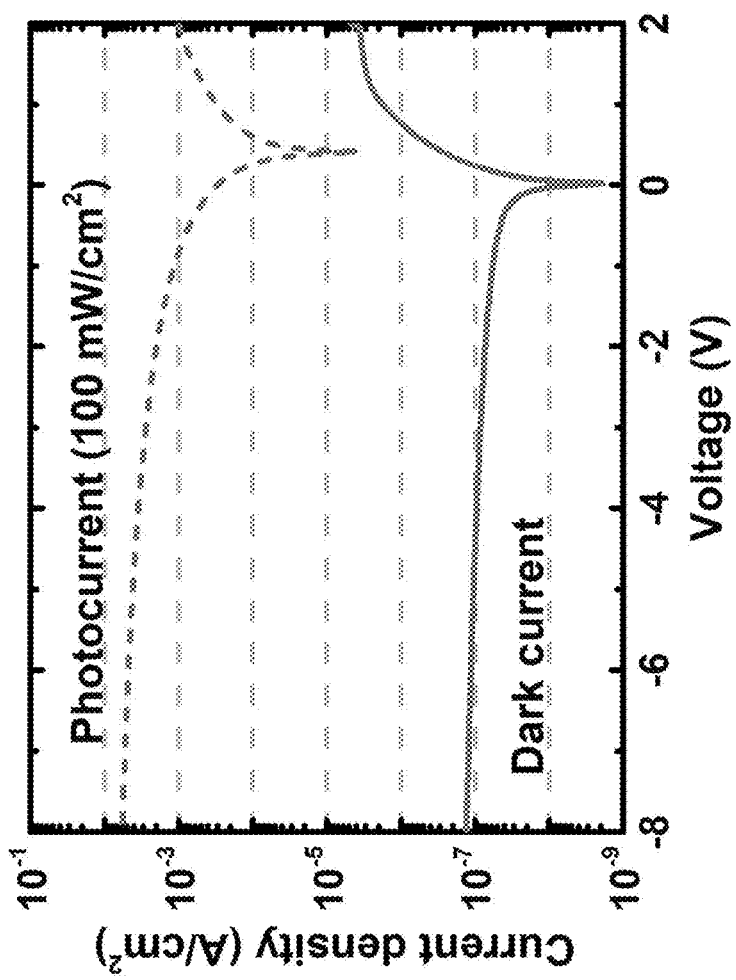
FIG. 8B shows the current-voltage curve of the photodiode in another example of the invention.

Therefore, in the example, another material (e.g., Indium doped ZnO) into which red light and infrared light region has a better penetration is used for the transparent electrode structure, the results are shown in FIG. 8A. The external quantum efficiency can be increased from 14% (FIG. 6C, −8V, at 1070 nm) in Example 3 to 28% (FIG. 8A, −8V, at 1060 nm), the effect that is so obvious is gained without impairing the excellent self-filtration. In the structure, as shown in the current-voltage curve chart (refer to FIG. 8B) of the photodiode in another example of the invention, the photodiode characteristic of the structure is excellent with or without light source.

As stated in the aforesaid examples, the invention aims to establish a photodiode structure that can achieve self-filtration and FWHM response by modifying the thickness of the P-type semiconductor layer and the N-type semiconductor in the photoactive layer and the photoactive layer itself, coupled with the transparent electrode to form a self-filtration photodiode structure that can achieve FWHM response and in turn to downsize light sensors.

What is claimed is:

1. A structure of photodiode, converting an external light source to a current value, comprising:
   a substrate;
   a first electrode, disposed on said substrate;
   a first transport layer, disposed on said first electrode;
   a photoactive layer, disposed on said first transport layer, and comprises a P-type semiconductor layer and an N-type semiconductor layer, the composition ratio of the P-type semiconductor layer and the N-type semiconductor layer is between 1:0.5 and 1:1.5, the thickness of the photoactive layer is between 1 μm and 15 μm;
   a second electrode, disposed on said photoactive layer;
   wherein the structure of photodiode is formed by adjusting the composition ratio of the P-type semiconductor layer and the N-type semiconductor layer and the thickness of the photoactive layer to attain a structure for light absorption changed from a full-wavelength absorption to a partial-wavelength absorption without using filter.

2. The structure of photodiode of claim 1, wherein said substrate is selected from silicon substrate, polyimide substrate, glass substrate, polyethylene naphthalate substrate, polyethylene terephthalate substrate, sapphire substrate, quartz substrate, or ceramic substrate.

3. The structure of photodiode of claim 1, wherein said first electrode is a transparent electrode or a metal electrode, wherein said transparent electrode is selected from the group consisting of metal oxide, conductive polymer, graphene, carbon nanotube, metal nanowire and metal mesh and the mixture thereof; and said metal electrode is selected from the group consisting of aluminum, silver, gold, copper, tungsten, molybdenum, titanium and the mixture thereof.

4. The structure of photodiode of claim 1, wherein the first electrode further comprises a first active metal layer arranged in the first electrode, and the material of the first active metal layer is selected from a group composed of magnesium, calcium, lithium, caesium, and their constituents.

5. The structure of photodiode of claim 1, wherein said first transport layer is selected from the group consisting of one or more of the following materials: organic polymer, organic small molecule, and metal oxide, wherein the organic polymer is selected from PFN-DOF、PFN-Br, or PDMAEMA; the organic small molecule is selected from PDIN、PDINO、PDINN, or NDI-N; the metal oxide is selected from $SnO_2$、ZnO、$TiO_2$、$Cs_2CO_3$, or $Nb_2O_5$.

6. The structure of photodiode of claim 1, further comprising a second transport layer disposed between said photoactive layer and said second electrode.

7. The structure of photodiode of claim 6, wherein the second transport layer is selected from a group composed of one or more of the following materials: organic polymer, organic small molecule, metal oxide, and metal compound; the organic polymer is selected from PEDOT:PSS or PTAA; the organic small molecule is selected from spiro-MeOTAD or m-MTDATA; the metal oxide or the metal compound is selected from $MoO_3$、NiO、$V_2O_5$、$WO_3$, or CuSCN.

8. The structure of photodiode of claim 1, wherein the second electrode is a transparent electrode or a metal electrode, wherein said transparent electrode is selected from the group consisting of metal oxide, conductive polymer, graphene, carbon nanotube, metal nanowire and metal mesh and the mixture thereof; and said metal electrode is selected from the group consisting of aluminum, silver, gold, copper, tungsten, molybdenum, titanium and the mixture thereof.

9. The structure of photodiode of claim 1, wherein the second electrode further comprises a second active metal layer arranged in the second electrode, and the material of the second active metal layer is selected from a group composed of magnesium, calcium, lithium, caesium, and their constituents.

10. The structure of photodiode of claim 1, wherein the structure of the P-type semiconductor layer of the photoactive layer is selected from a group composed of D1-D29

D1
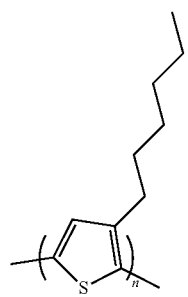
D2
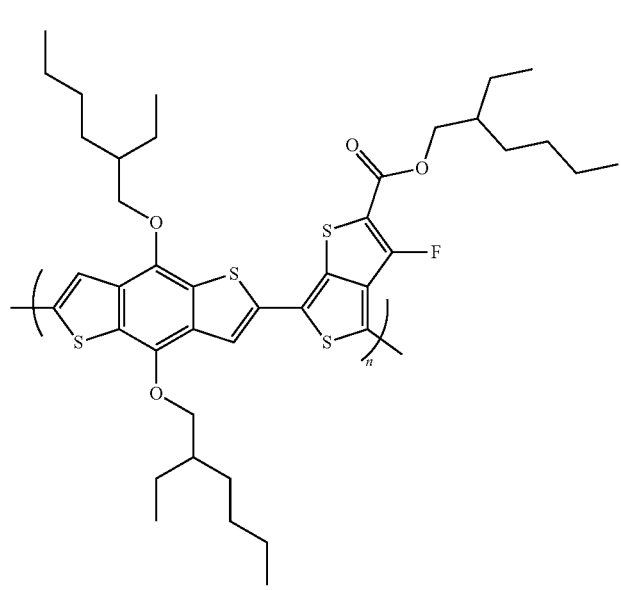
D3
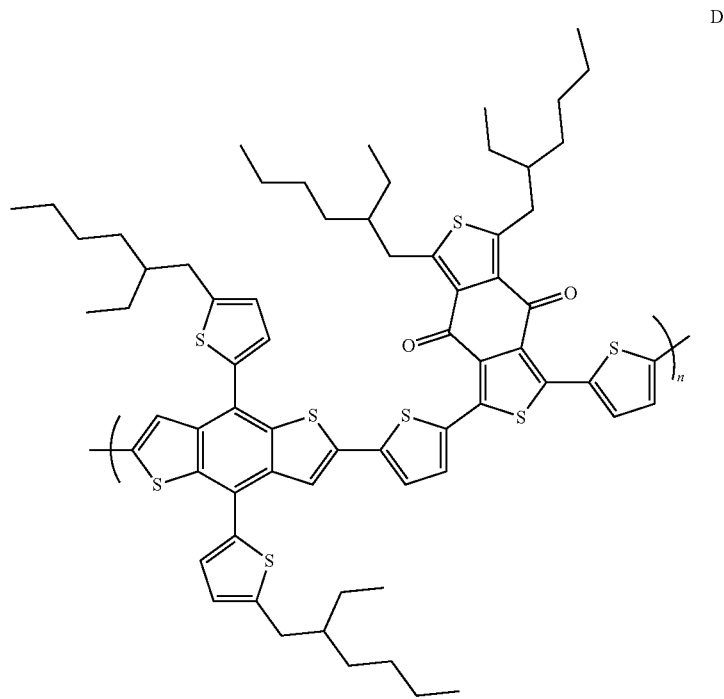

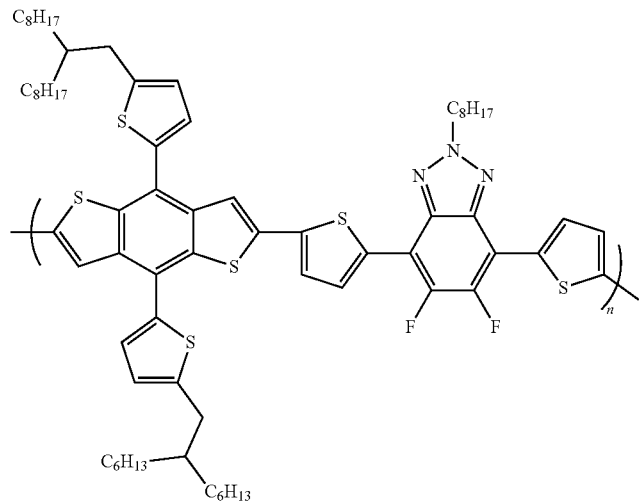
D4
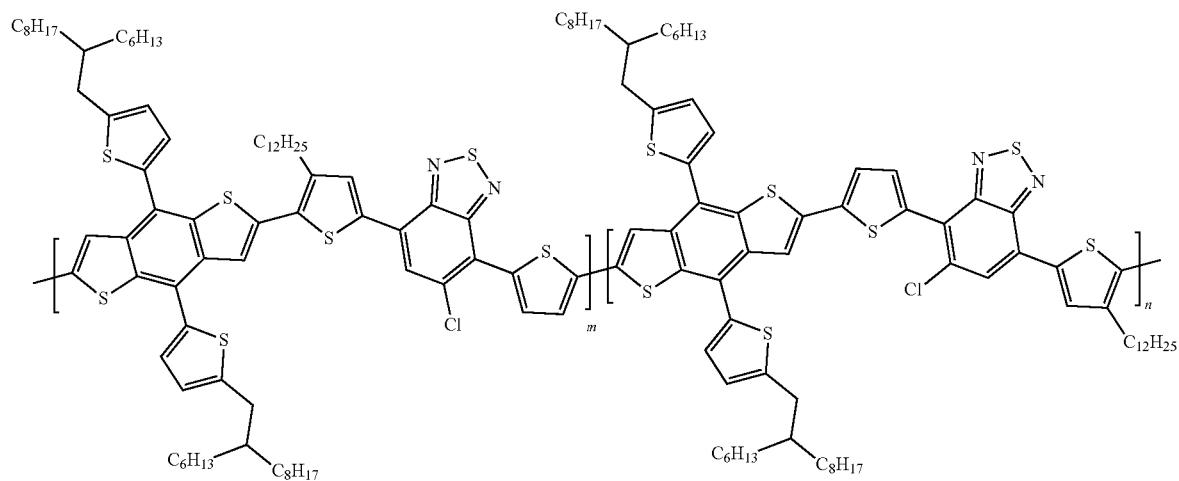
D5
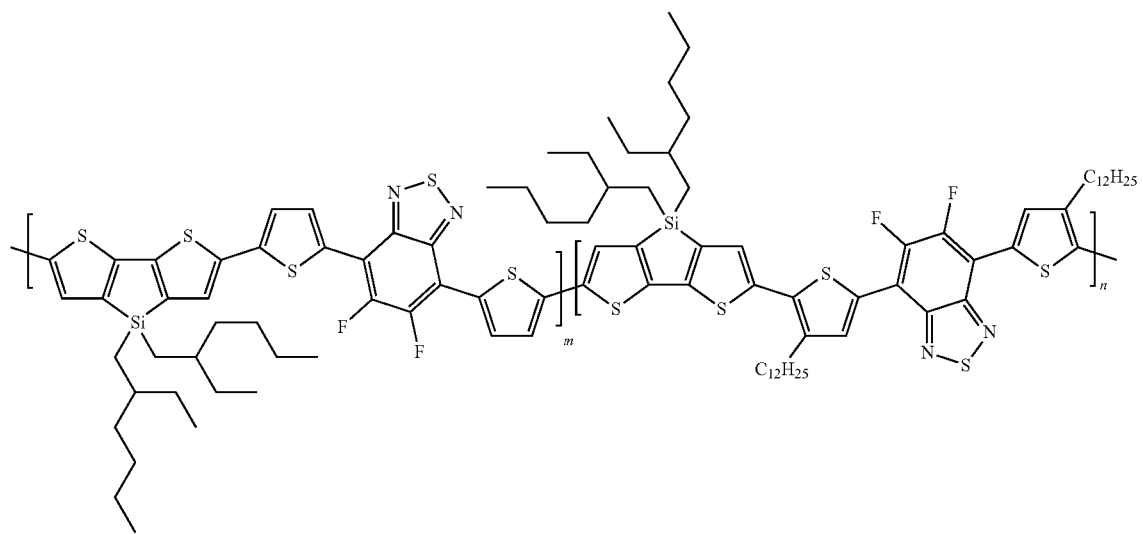
D6

-continued
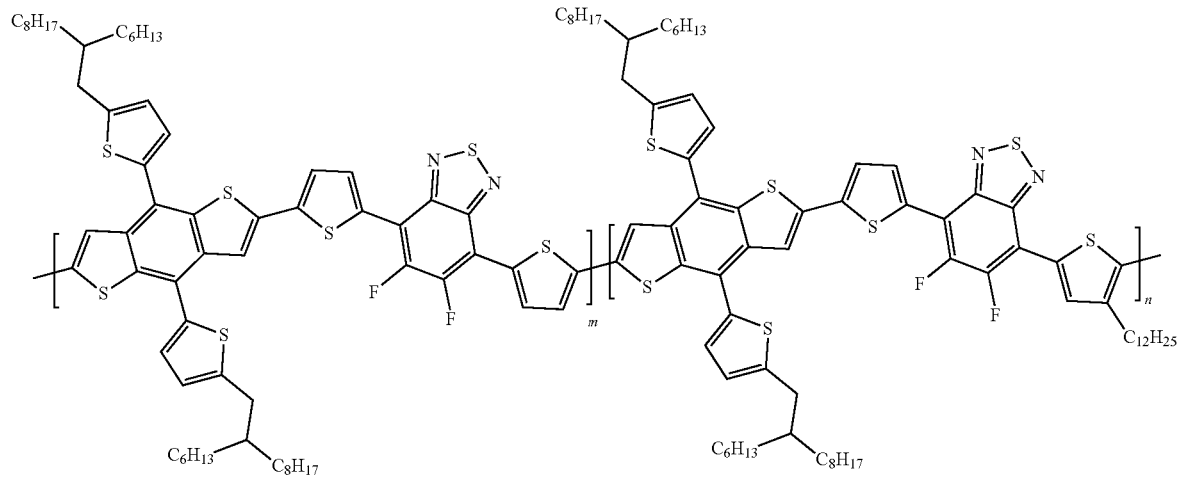
D7
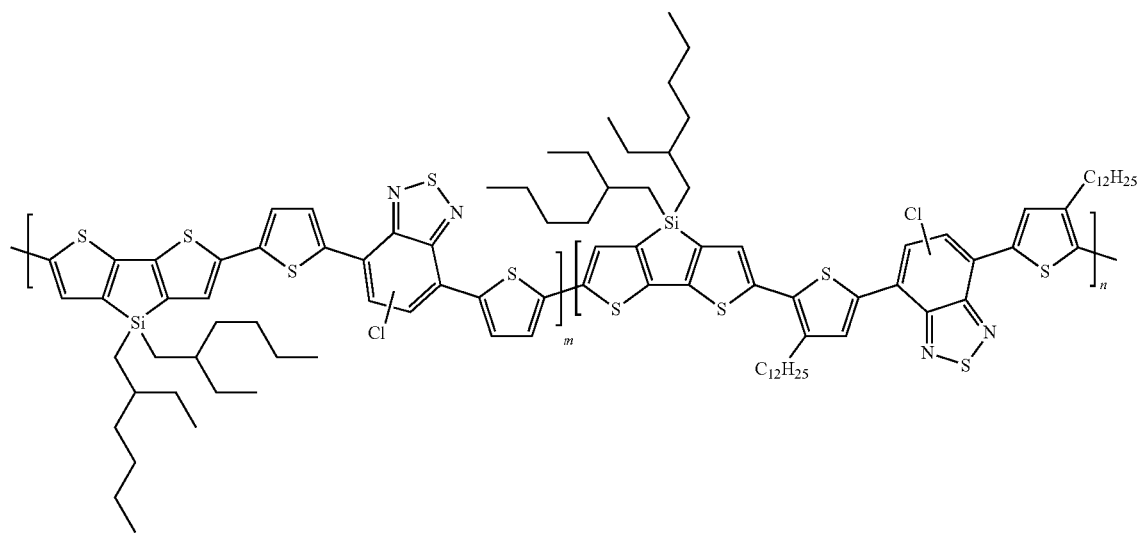
D8
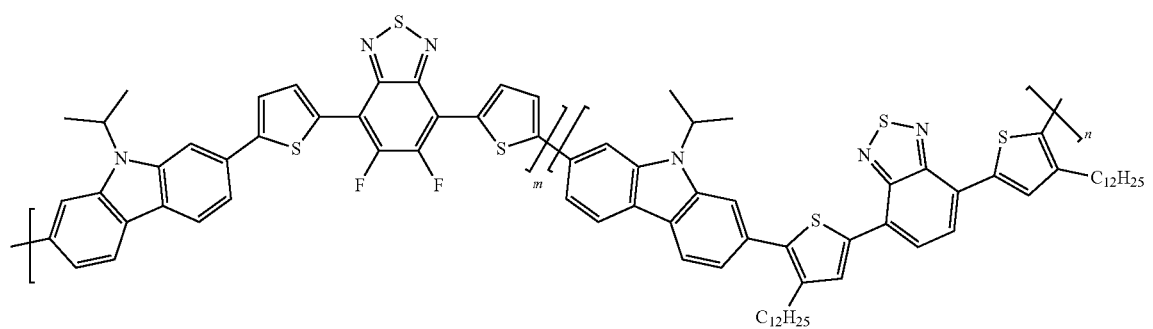
D9

D10
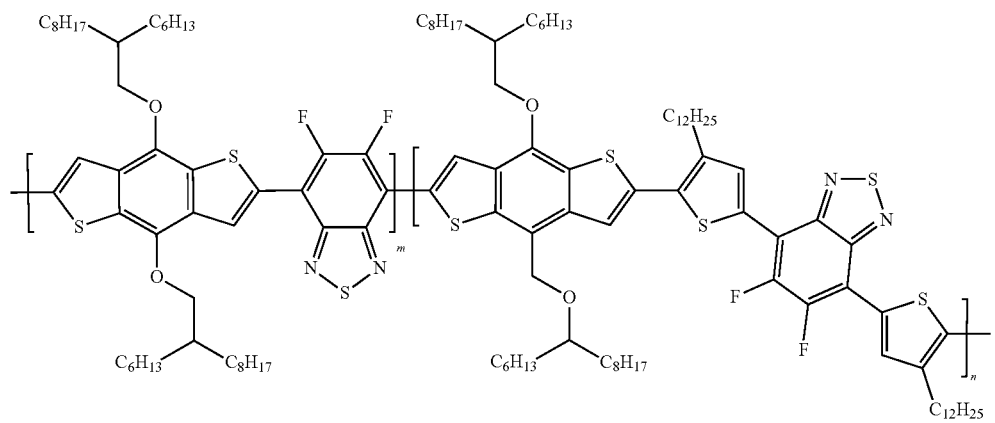
D11
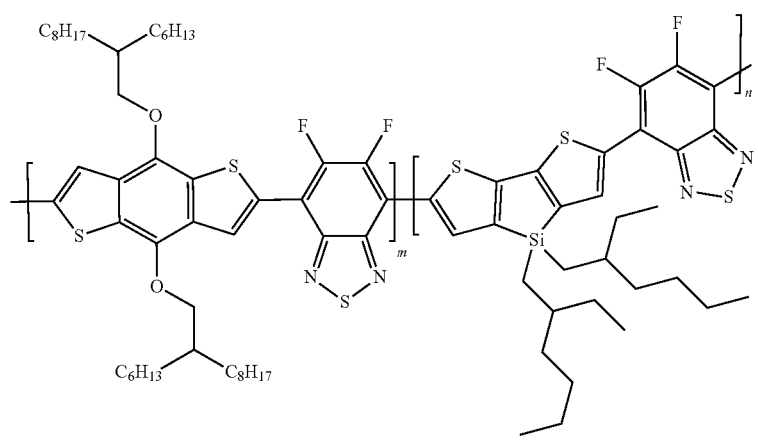
D12
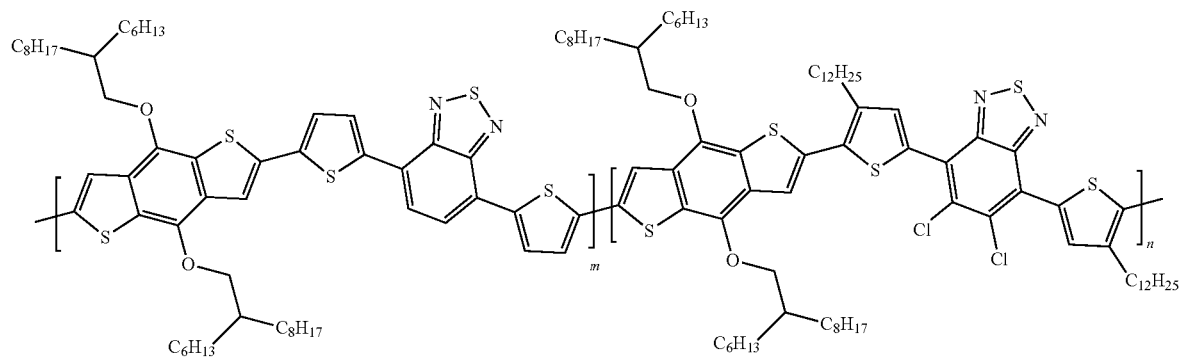
D13
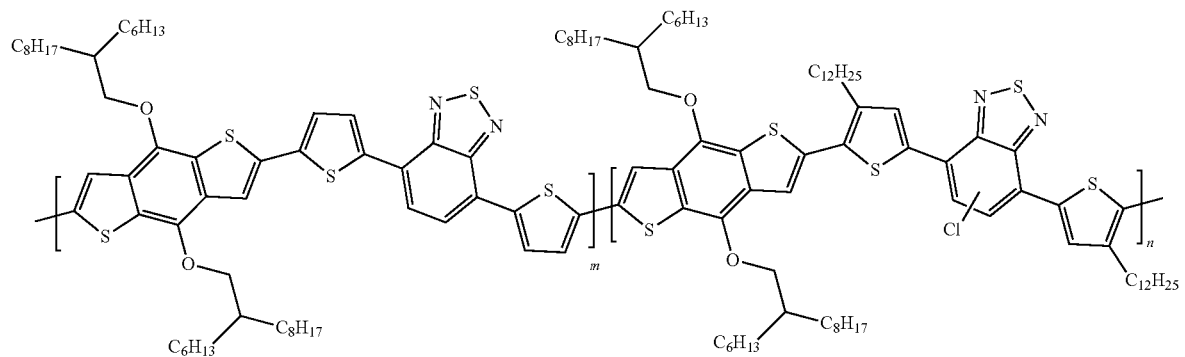

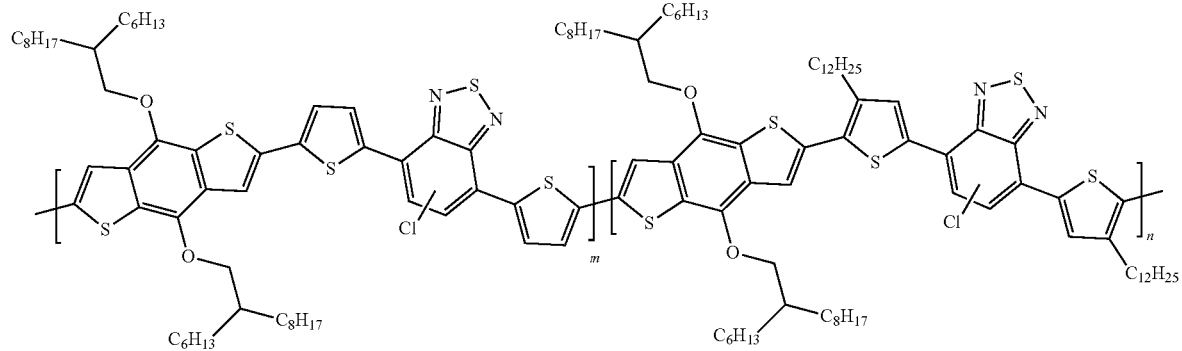
D14
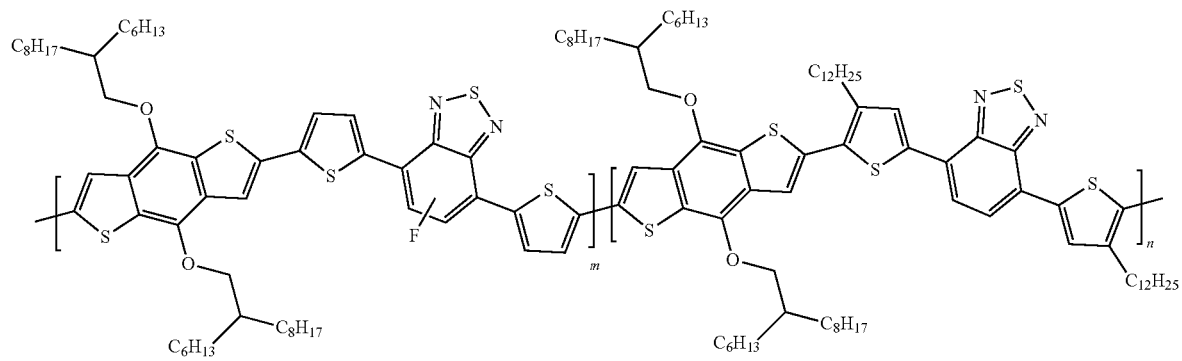
D15
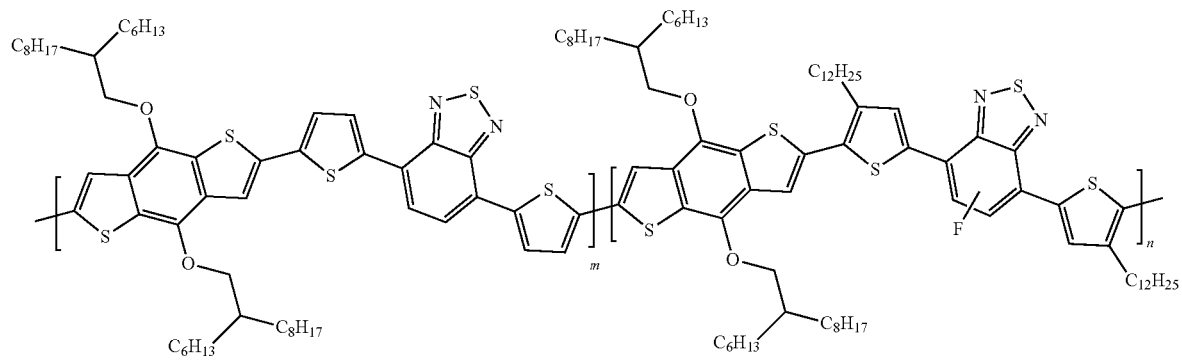
D16
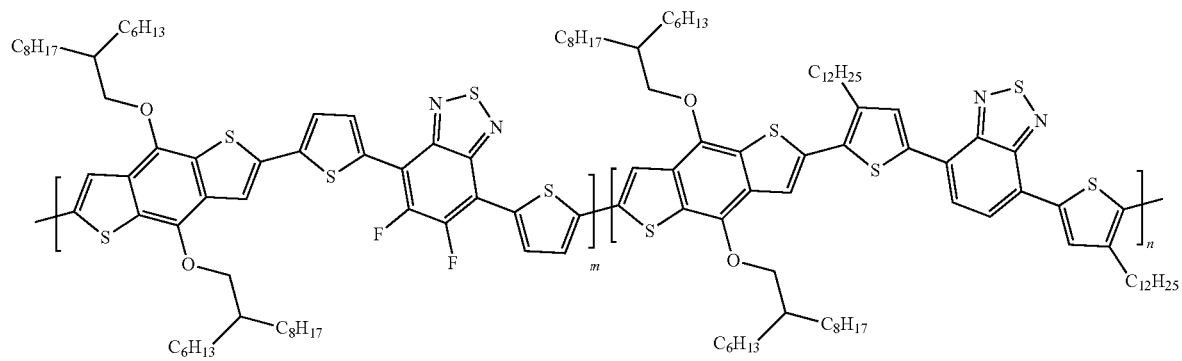
D17

-continued
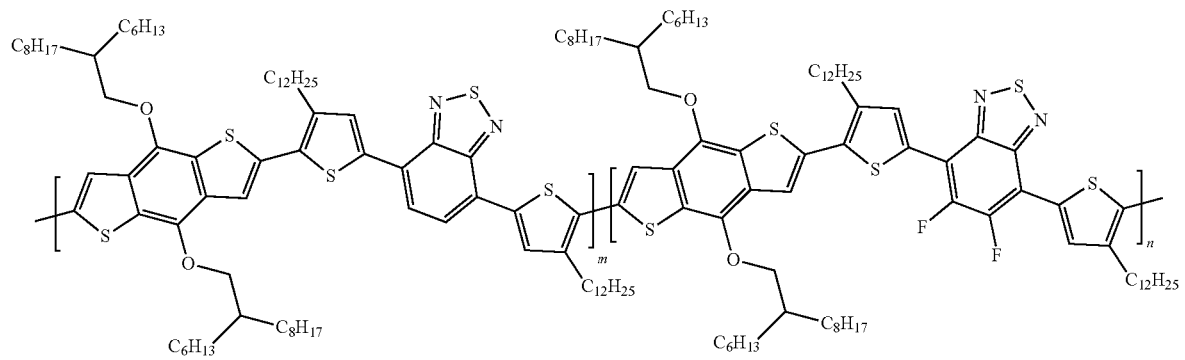
D18
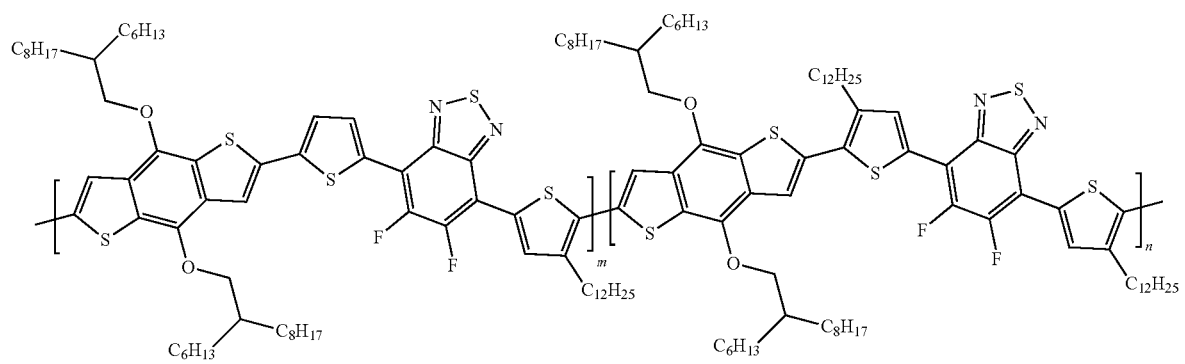
D19
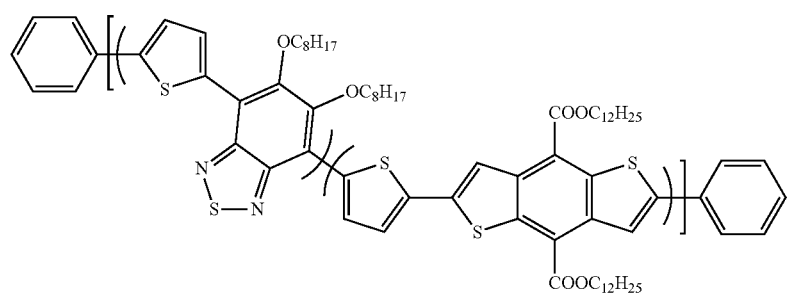
D20
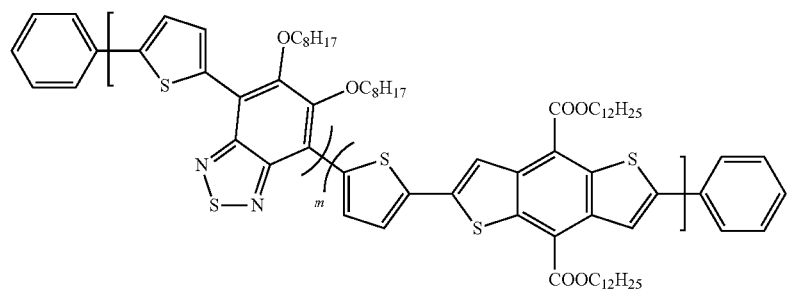
D21

-continued
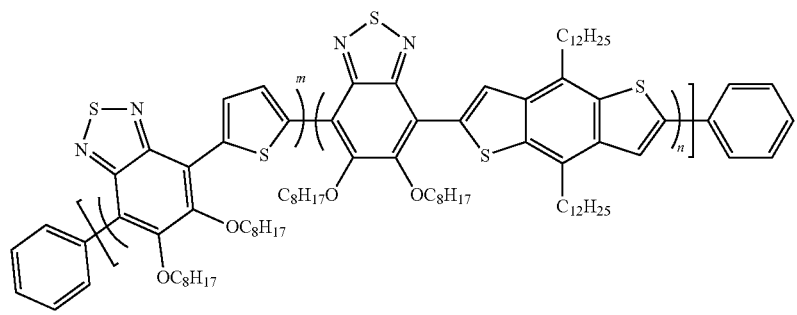
D22
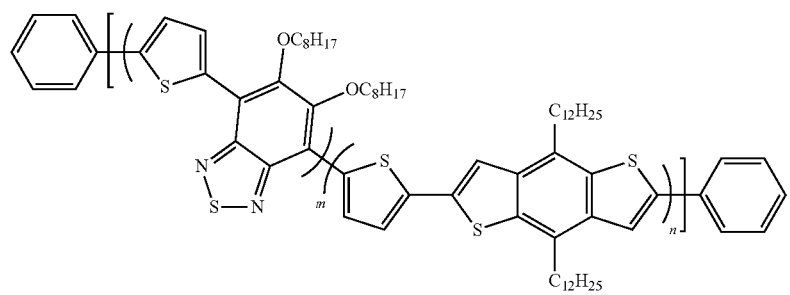
D23
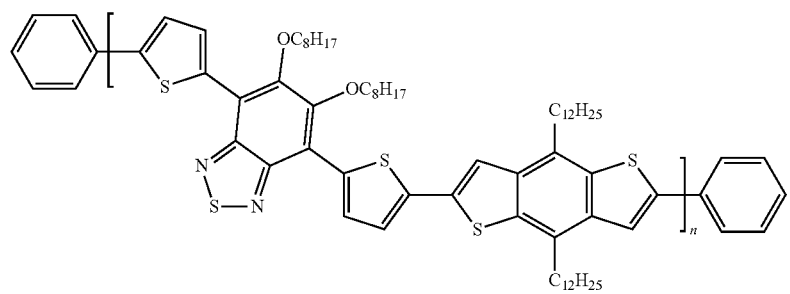
D24
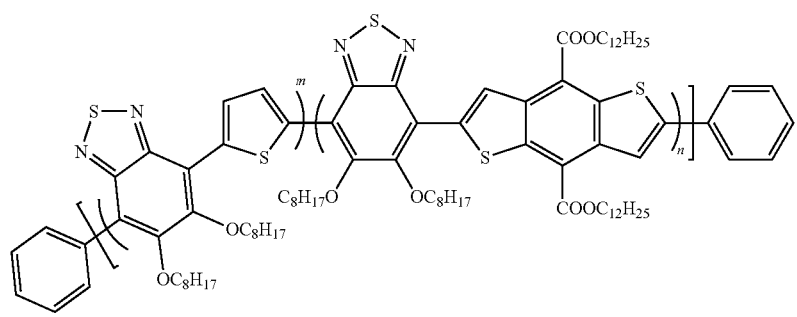
D25

-continued
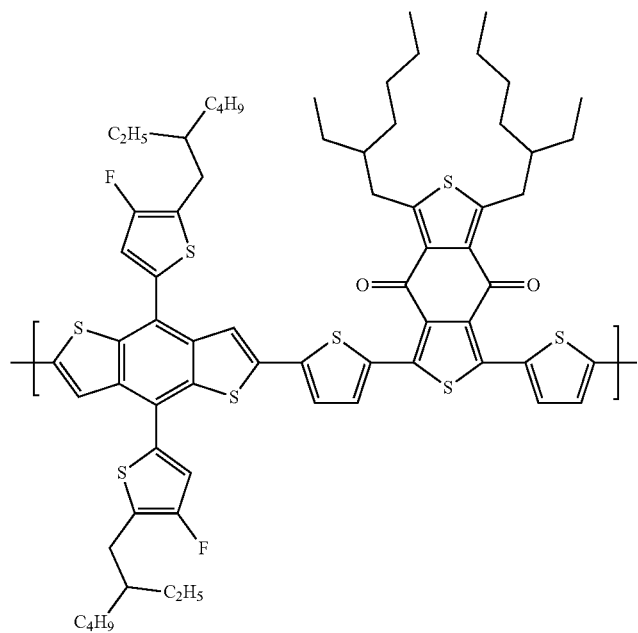
D26
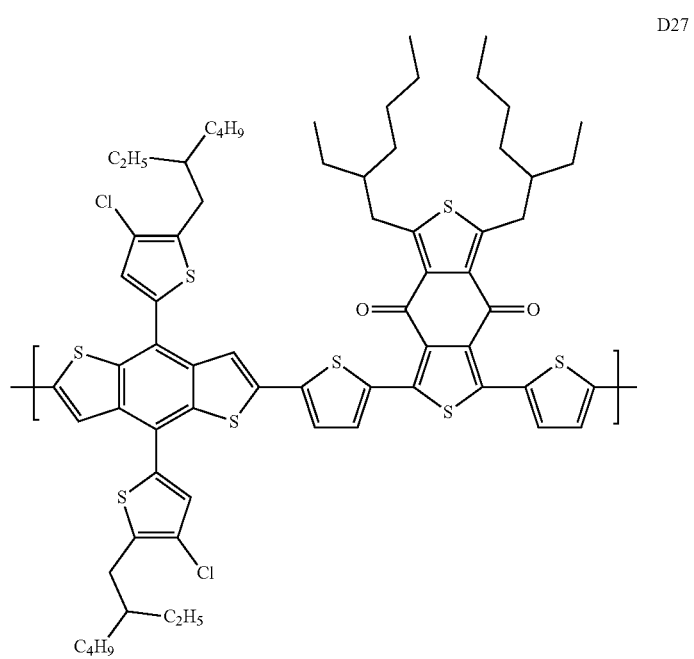
D27

-continued
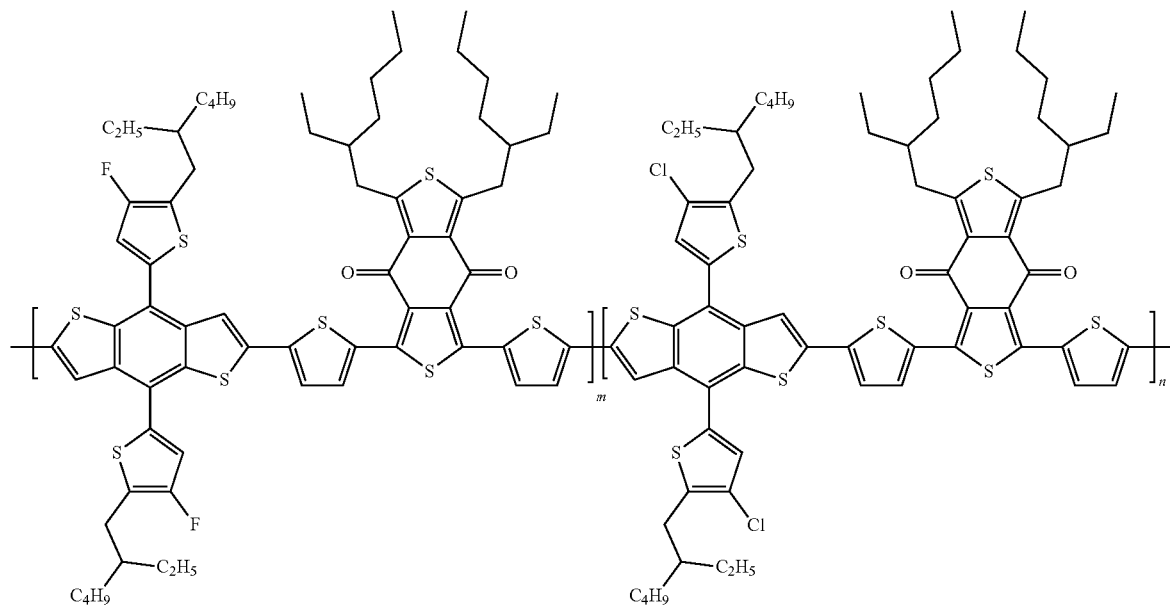
D28
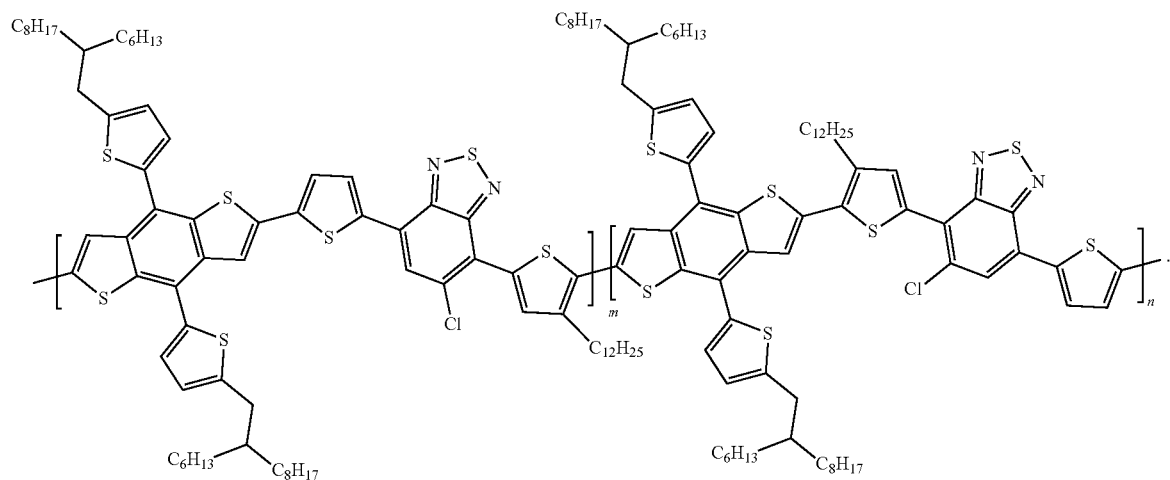
D29

11. The structure of photodiode of claim 1, wherein the structure of the N-type semiconductor layer of the photoactive layer is selected from a group composed of A1-A3
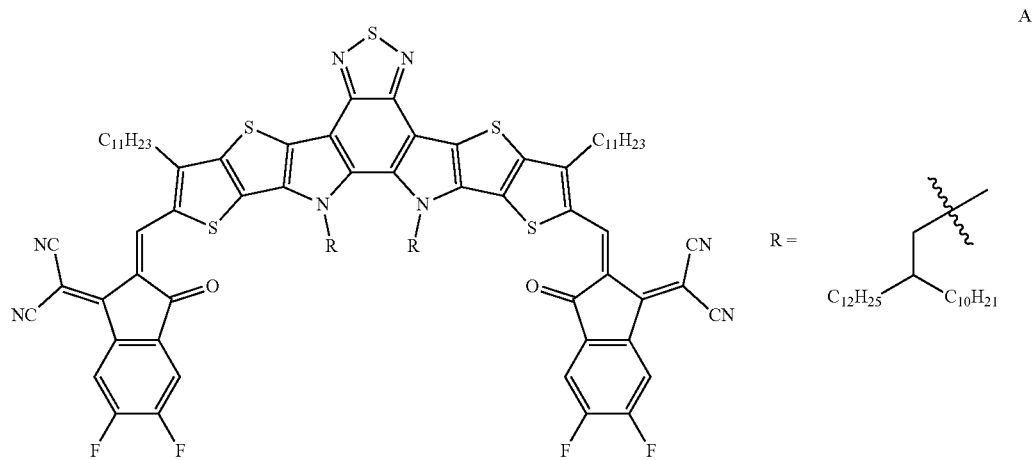
A1
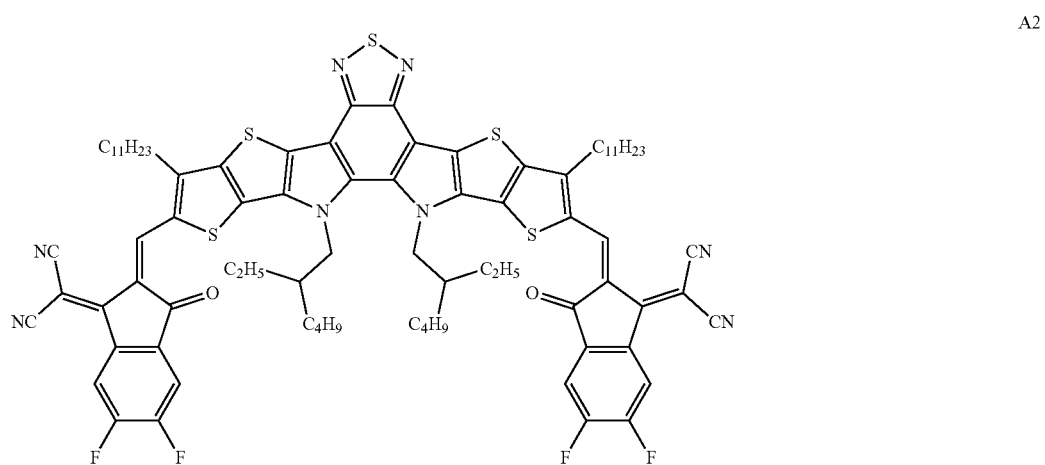
A2
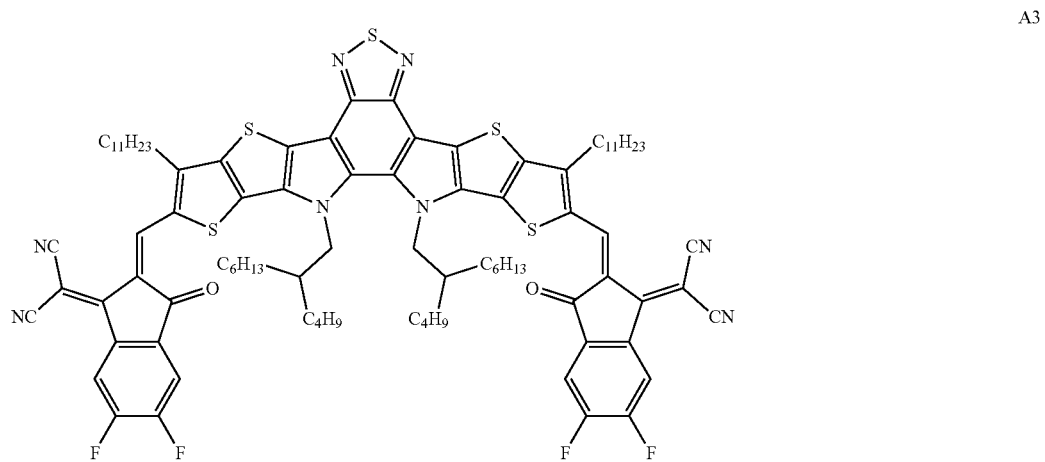
A3

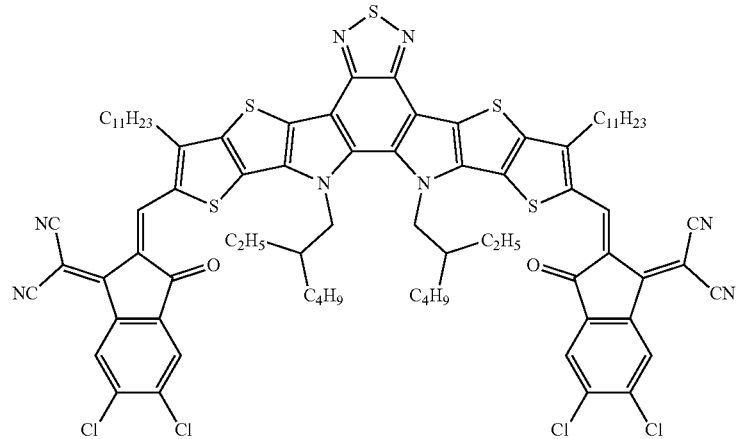
A4
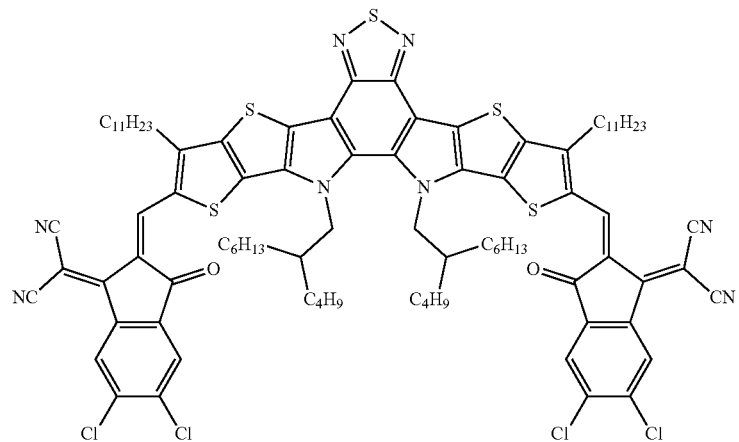
A5
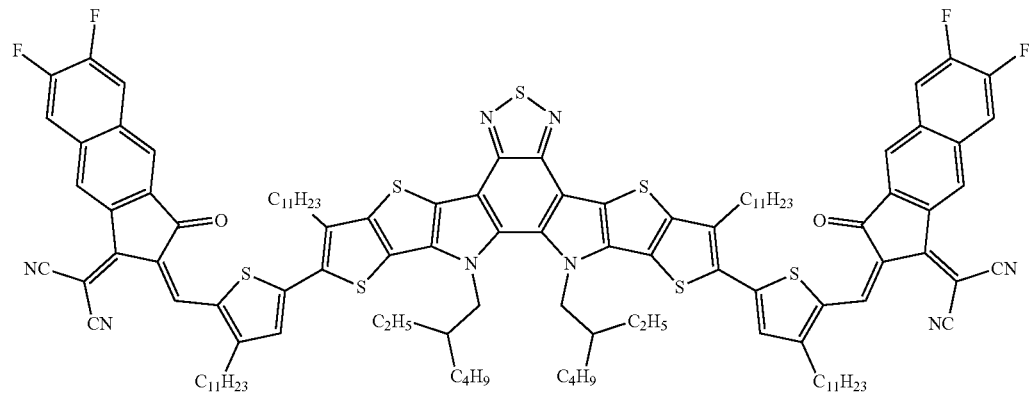
A6
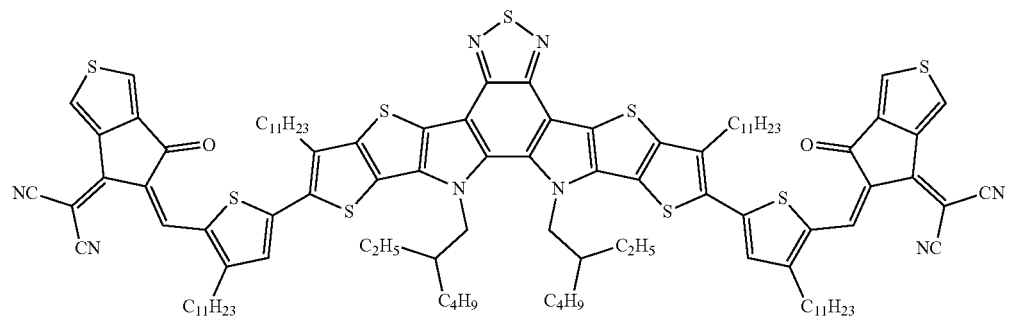
A7

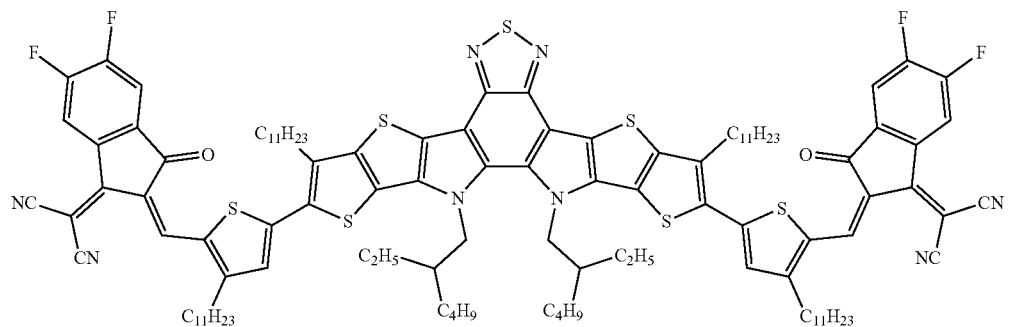
A9
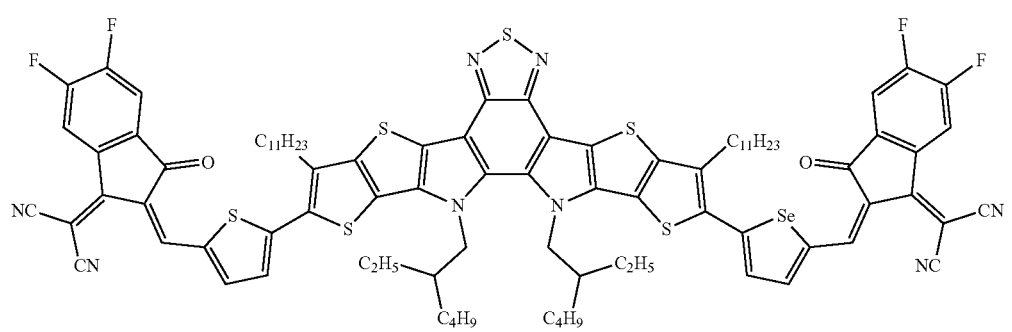
A10
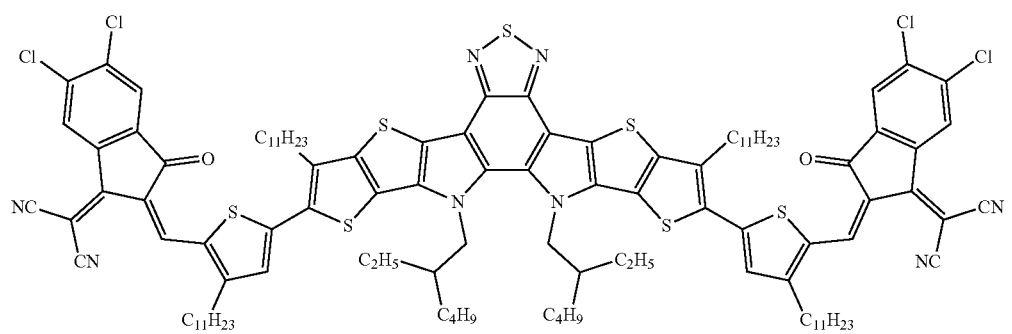
A11
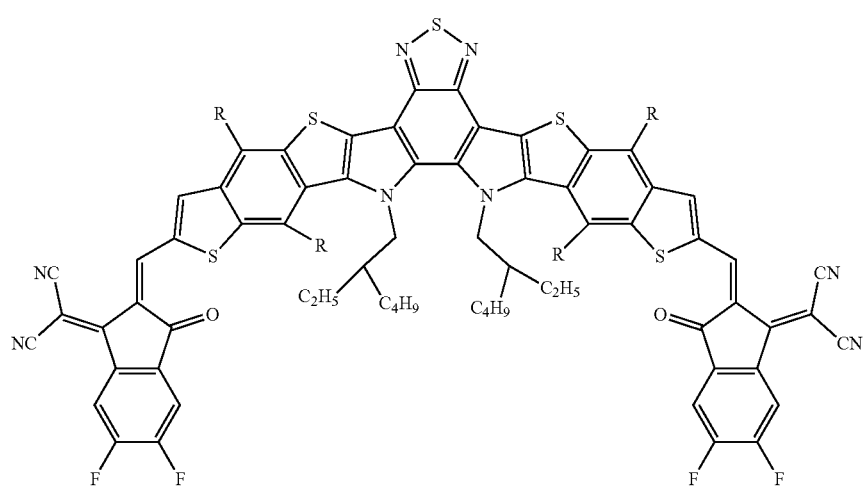
A12

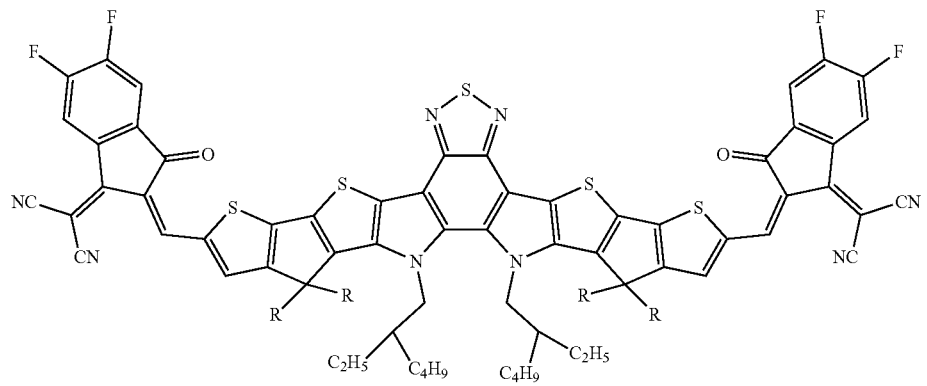
A13
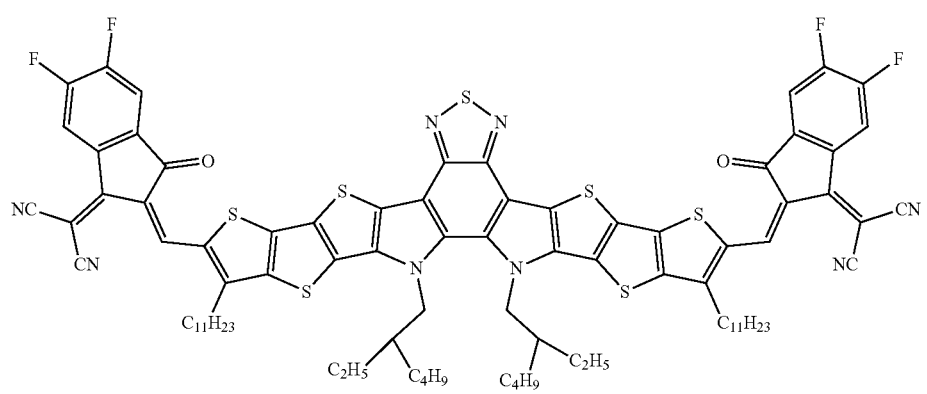
R = ethylhexyl
A14
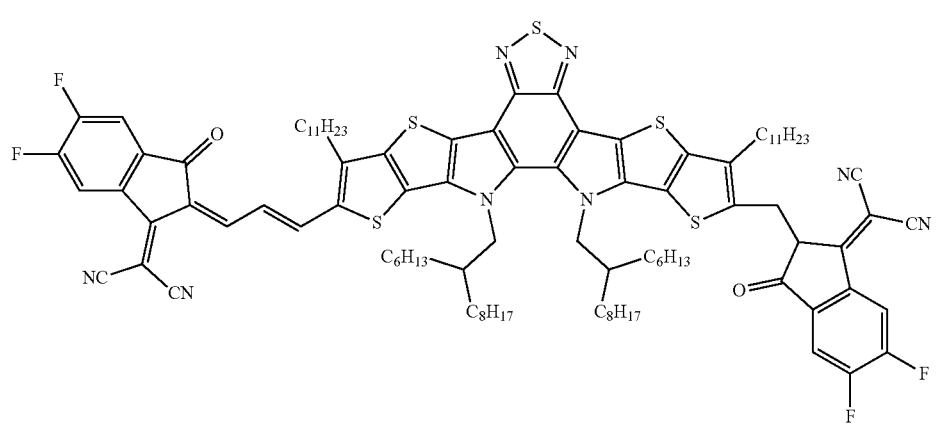
A15
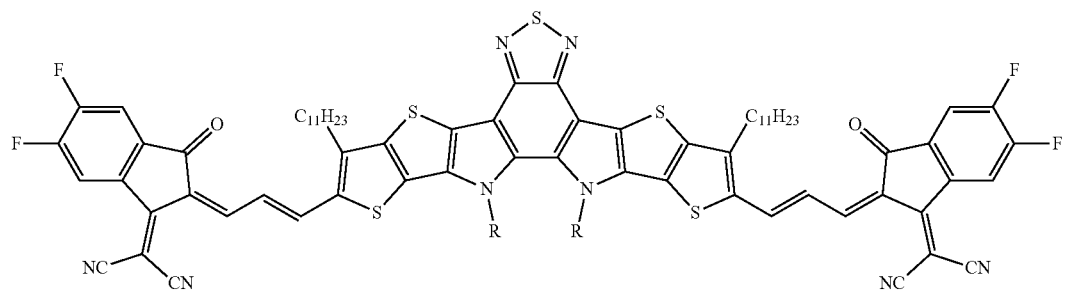
R = hexyldecyl
A16

-continued
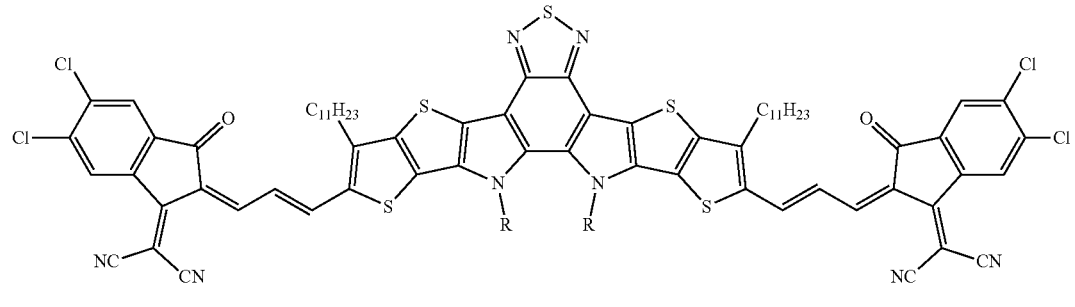
A17
R = hexyldecyl
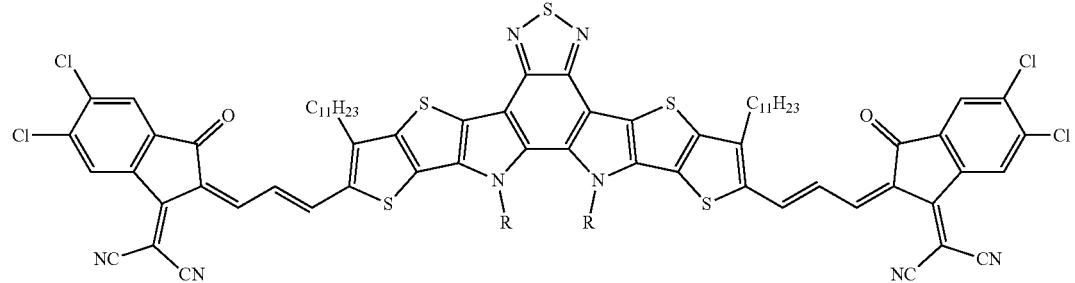
A18
R = decyltetradecyl
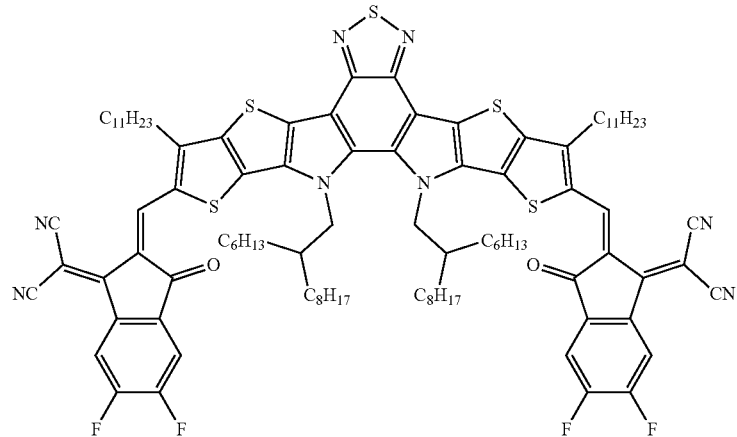
A19
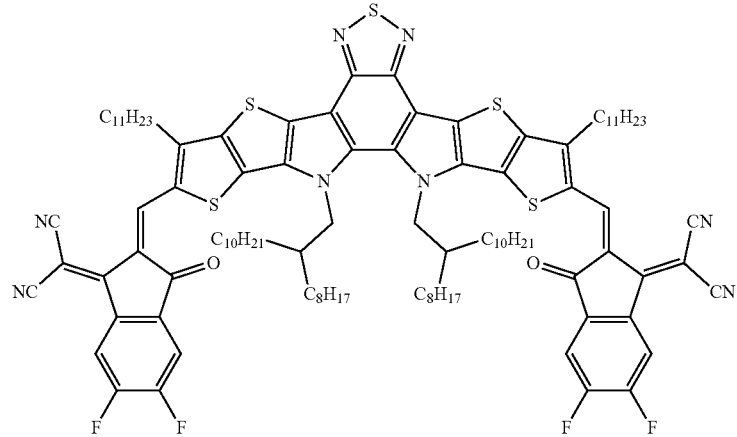
A20

-continued
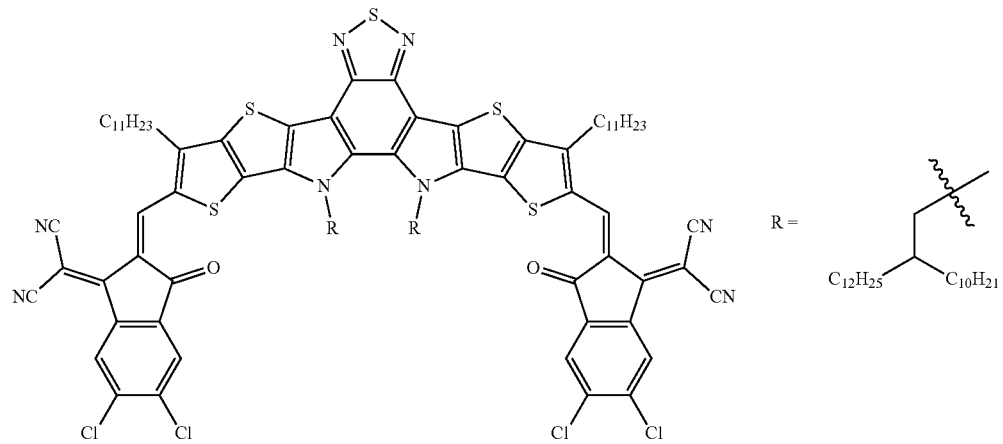
A21
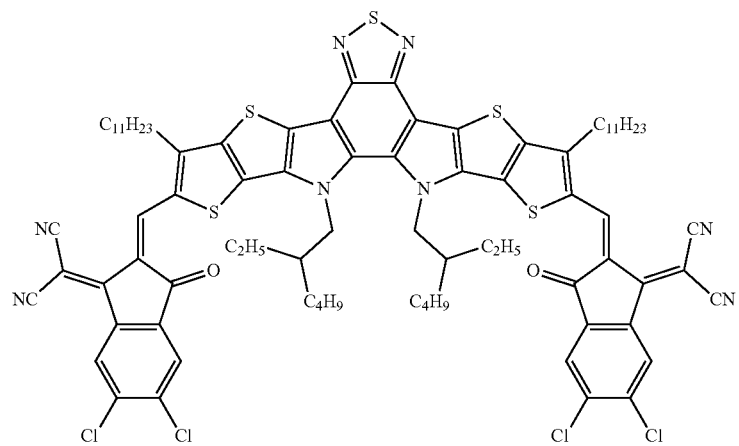
A22
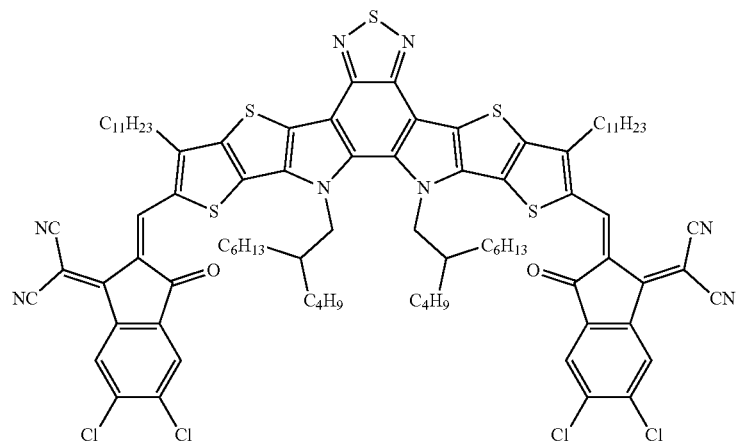
A23

-continued
A24
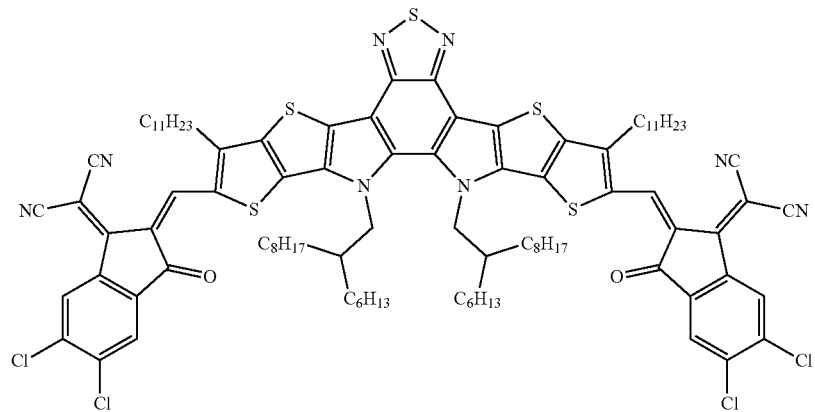
A25
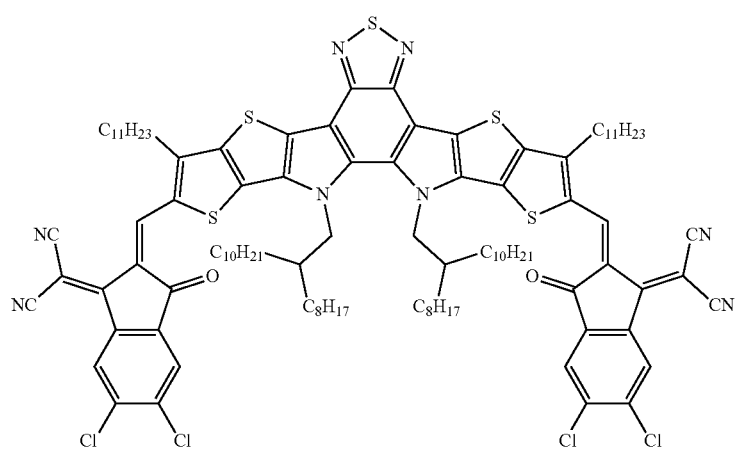
A26
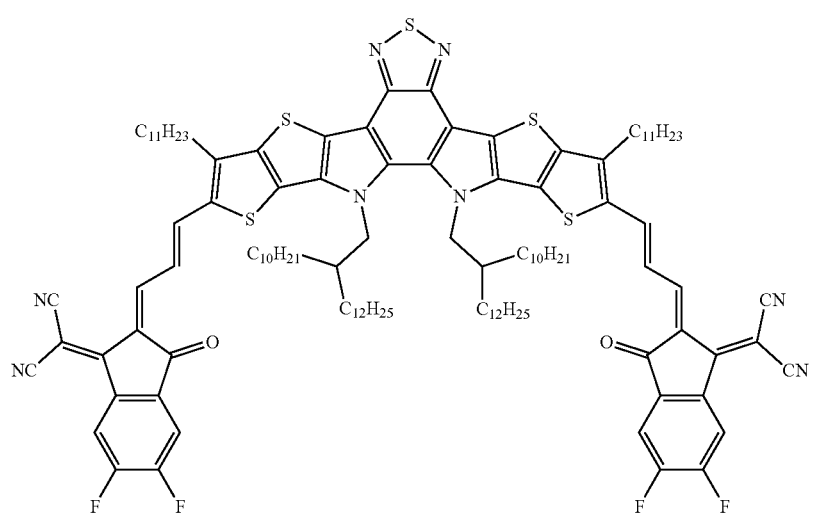

-continued
A27
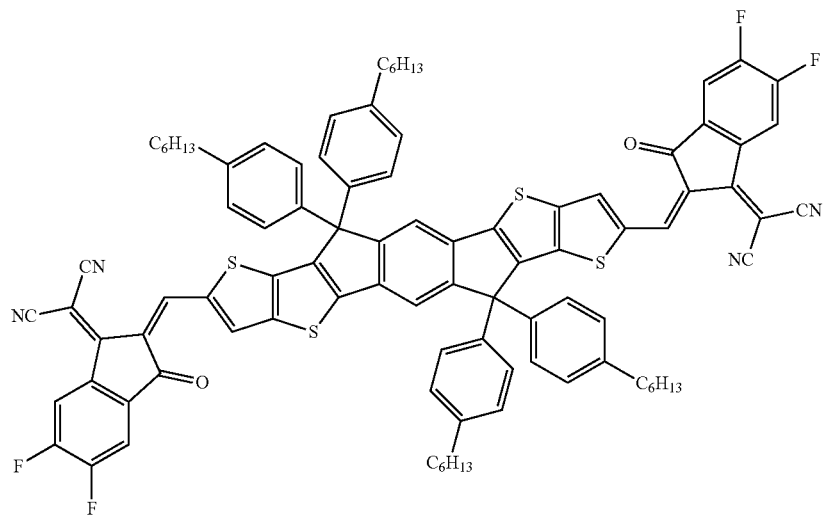
IT-4F
A28
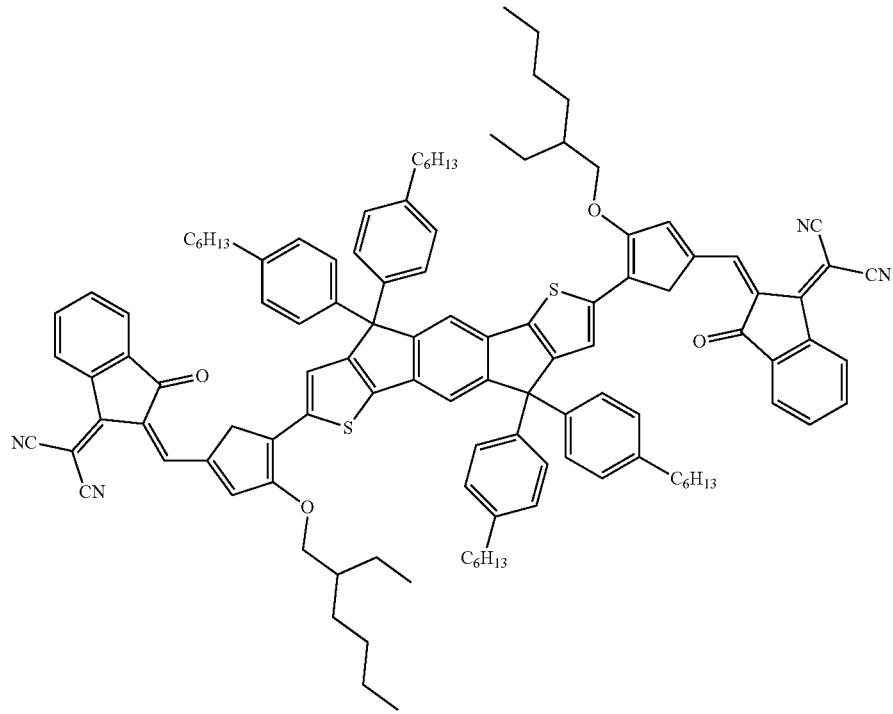

A29
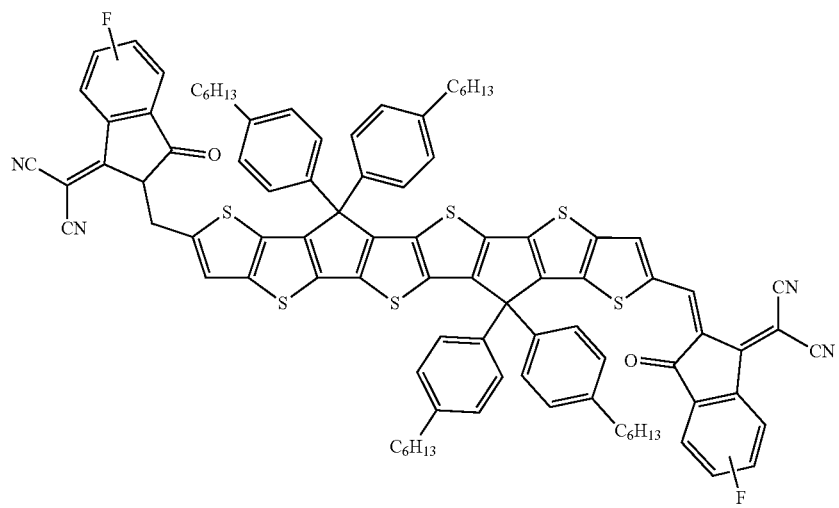
A30
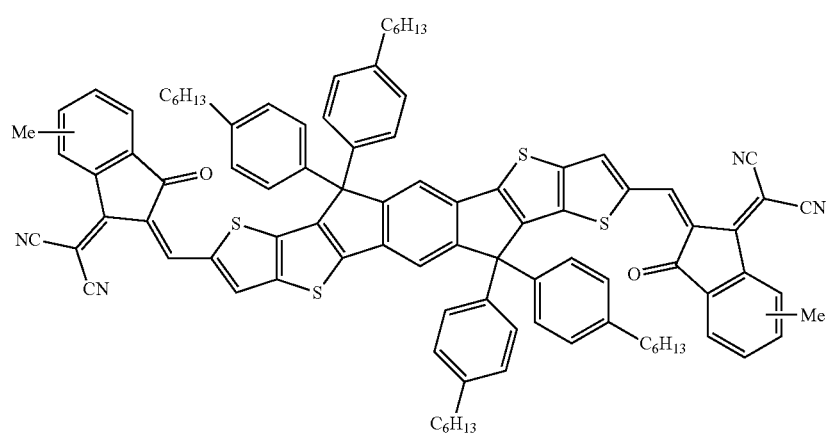
A31
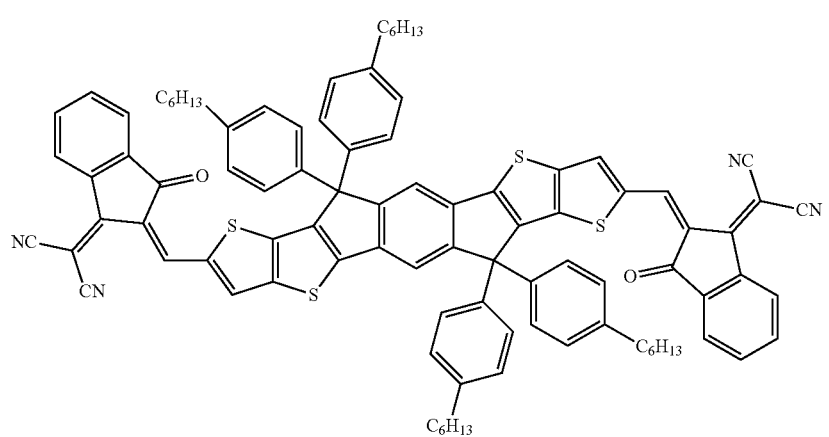

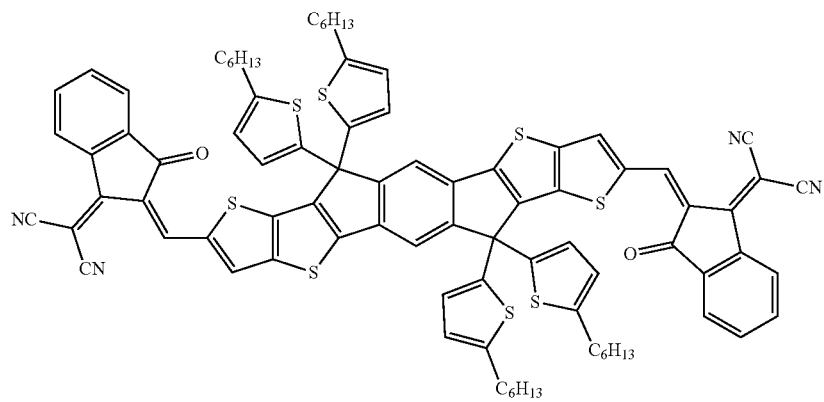
A32
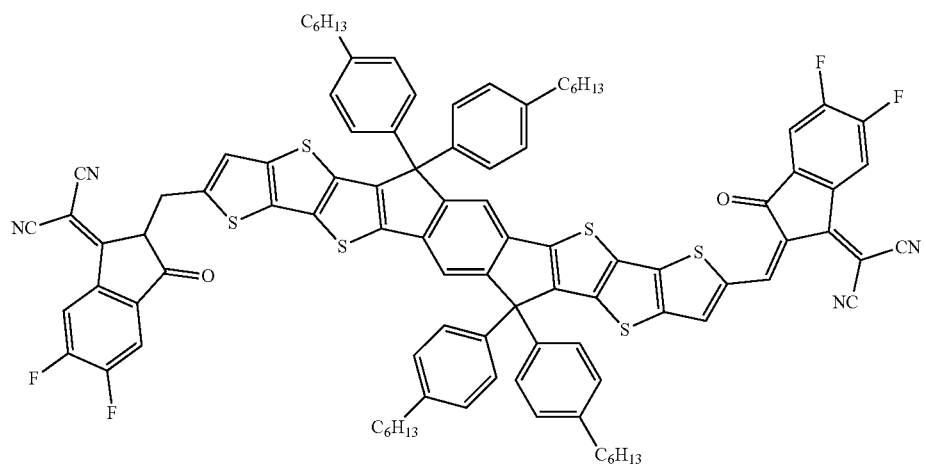
A33
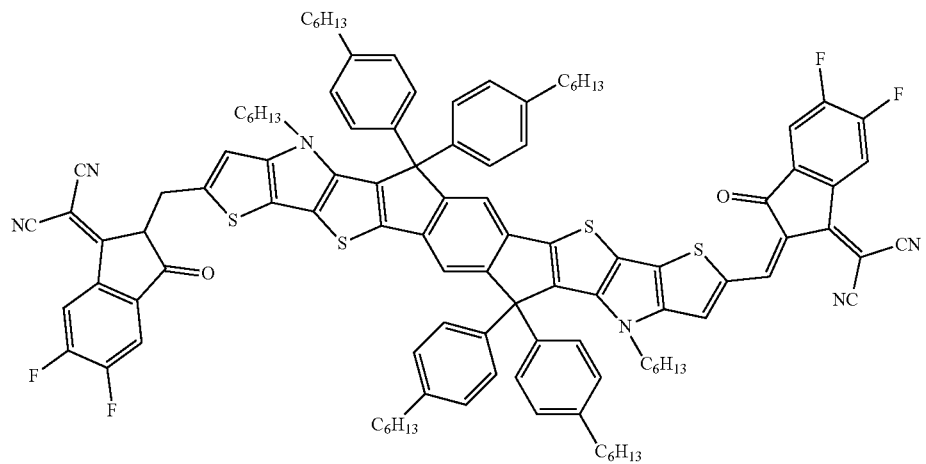
A34

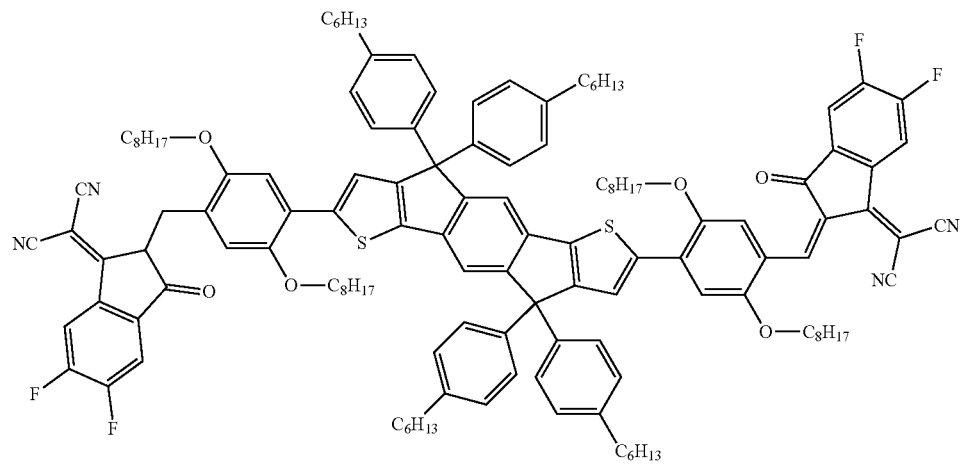
A35
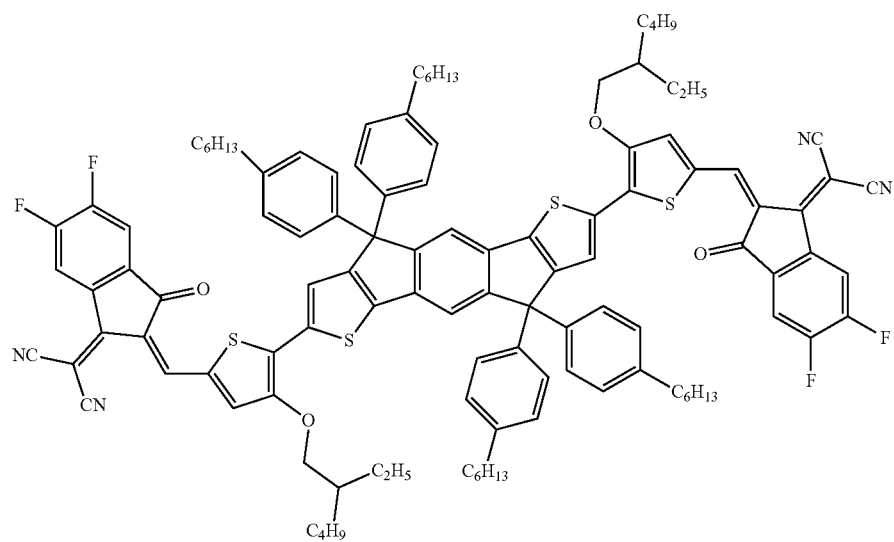
A36
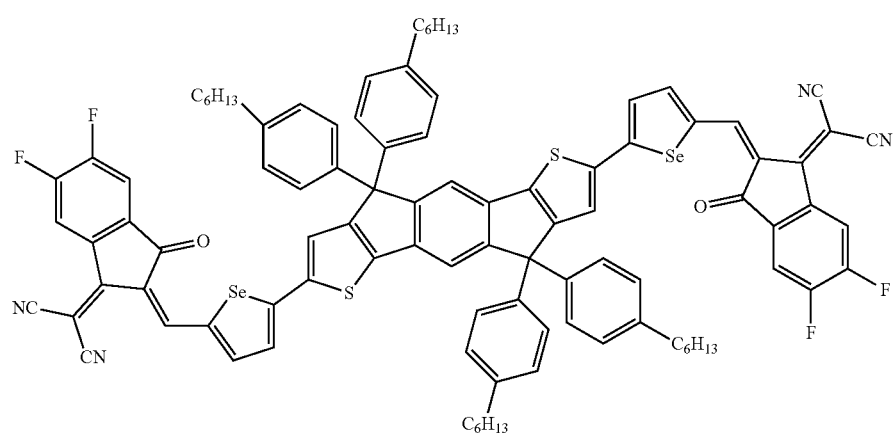
A37

A38
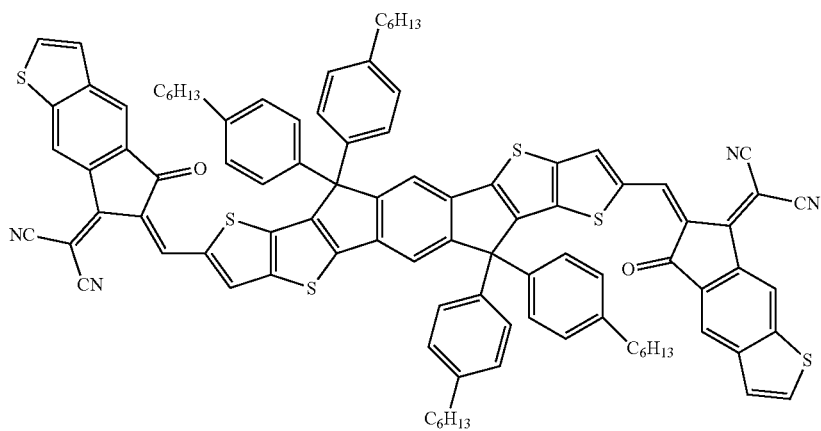
A39
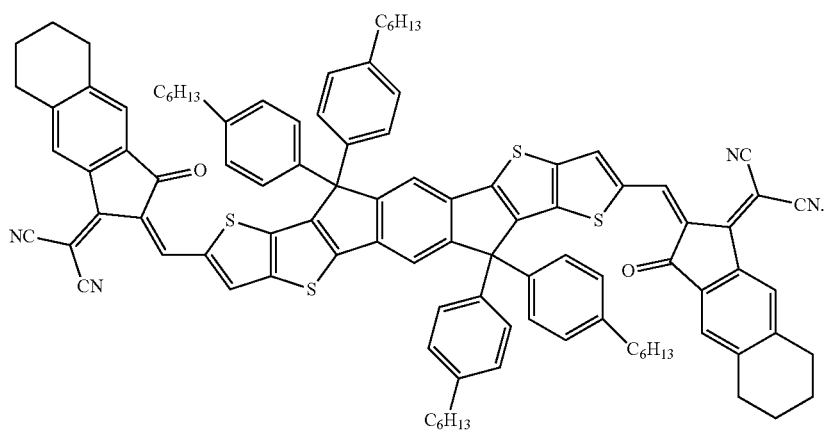
* * * * *